US012696438B2

(12) United States Patent
Lee et al.

(10) Patent No.: US 12,696,438 B2
(45) Date of Patent: Jul. 28, 2026

(54) SUPPORT STRUCTURE FOR MULTIPLE, ALTERNATING EPITAXIAL SILICON

(71) Applicant: Micron Technology, Inc., Boise, ID (US)

(72) Inventors: Si-Woo Lee, Boise, ID (US); Scott E. Sills, Boise, ID (US); David K. Hwang, Boise, ID (US); Yoshitaka Nakamura, Boise, ID (US); Yuanzhi Ma, Boise, ID (US); Glen H. Walters, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 862 days.

(21) Appl. No.: 17/888,467

(22) Filed: Aug. 15, 2022

(65) Prior Publication Data

US 2023/0397391 A1     Dec. 7, 2023

Related U.S. Application Data

(60) Provisional application No. 63/348,470, filed on Jun. 2, 2022.

(51) Int. Cl.
H10B 12/00 (2023.01)

(52) U.S. Cl.
CPC ............. H10B 12/05 (2023.02); H10B 12/03 (2023.02); H10B 12/30 (2023.02); H10B 12/482 (2023.02)

(58) Field of Classification Search
CPC ........ H10B 12/05; H10B 12/03; H10B 12/30; H10B 12/482; H10B 12/488; H10D 30/6735; H10D 30/6757
See application file for complete search history.

(56) References Cited

U.S. PATENT DOCUMENTS

| | | | |
|---|---|---|---|
| 10,607,995 B2 | 3/2020 | Roberts et al. | |
| 2015/0279850 A1* | 10/2015 | Takaki | H10B 41/27 257/369 |
| 2018/0323200 A1 | 11/2018 | Tang et al. | |
| 2019/0103406 A1 | 4/2019 | Tang et al. | |
| 2019/0164985 A1 | 5/2019 | Tang et al. | |
| 2020/0335516 A1* | 10/2020 | Rajashekhar | H10B 43/10 |
| 2021/0013226 A1 | 1/2021 | Tang et al. | |
| 2023/0397390 A1* | 12/2023 | Hwang | G11C 5/063 |

* cited by examiner

*Primary Examiner* — Thanh T Nguyen

(74) *Attorney, Agent, or Firm* — Brooks, Cameron & Huebsch, PLLC

(57) ABSTRACT

Systems, methods and apparatus are provided for an array of vertically stacked memory cells having horizontally oriented access devices and storage nodes. The horizontally oriented access devices having a first source/drain regions and a second source drain regions separated by epitaxially grown, single crystalline silicon (Si) channel regions. A support structure is provided to the epitaxially grown, single crystalline Si. Horizontally oriented access lines connect to gates opposing the channel regions formed fully around every surface of the channel region as gate all around (GAA) structures separated from the channel regions by gate dielectrics. The memory cells have horizontally oriented storage nodes coupled to the second source/drain regions and vertical digit lines coupled to the first source/drain regions.

21 Claims, 34 Drawing Sheets

(ALONG CUT-LINE A-A' IN FIG 4A)

(ALONG CUT-LINE A-A' IN FIG 5A)

(ALONG CUT-LINE B-B' IN FIG 5A)

(ALONG CUT-LINE C-C' IN FIG 5A)

(ALONG CUT-LINE D-D' IN FIG 5A)

(ALONG CUT-LINE A-A' IN FIG 6A)

(ALONG CUT-LINE B-B' IN FIG 6A)

(ALONG CUT-LINE D-D' IN FIG 6A)

(ALONG CUT-LINE B-B' IN FIG 6A)

(ALONG CUT-LINE B-B' IN FIG 6A)

(ALONG CUT-LINE D-D' IN FIG 6A)

(ALONG CUT-LINE A-A' IN FIG 9A)

(ALONG CUT-LINE B-B' IN FIG 9A)

(ALONG CUT-LINE B-B' IN FIG 9A)

(ALONG CUT-LINE A-A' IN FIG 11A)

(ALONG CUT-LINE B-B' IN FIG 11A)

(ALONG CUT-LINE B-B' IN FIG 11A)

(ALONG CUT-LINE B-B' IN FIG 11A)

(ALONG CUT-LINE B-B' IN FIG 11A)

SUPPORT STRUCTURE FOR MULTIPLE, ALTERNATING EPITAXIAL SILICON

PRIORITY INFORMATION

This application claims the benefit of U.S. Provisional Application No. 63/348,470, filed on Jun. 2, 2022, the contents of which are incorporated herein by reference.

TECHNICAL FIELD

The present disclosure relates generally to memory devices, and more particularly, to support structure for multiple, alternating epitaxial silicon, e.g., in horizontal access devices in vertical three dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by epitaxially grown channel regions. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

memory for defect mitigation and selective etch in accordance with a number of embodiments of the present disclosure.

Figure 4A:
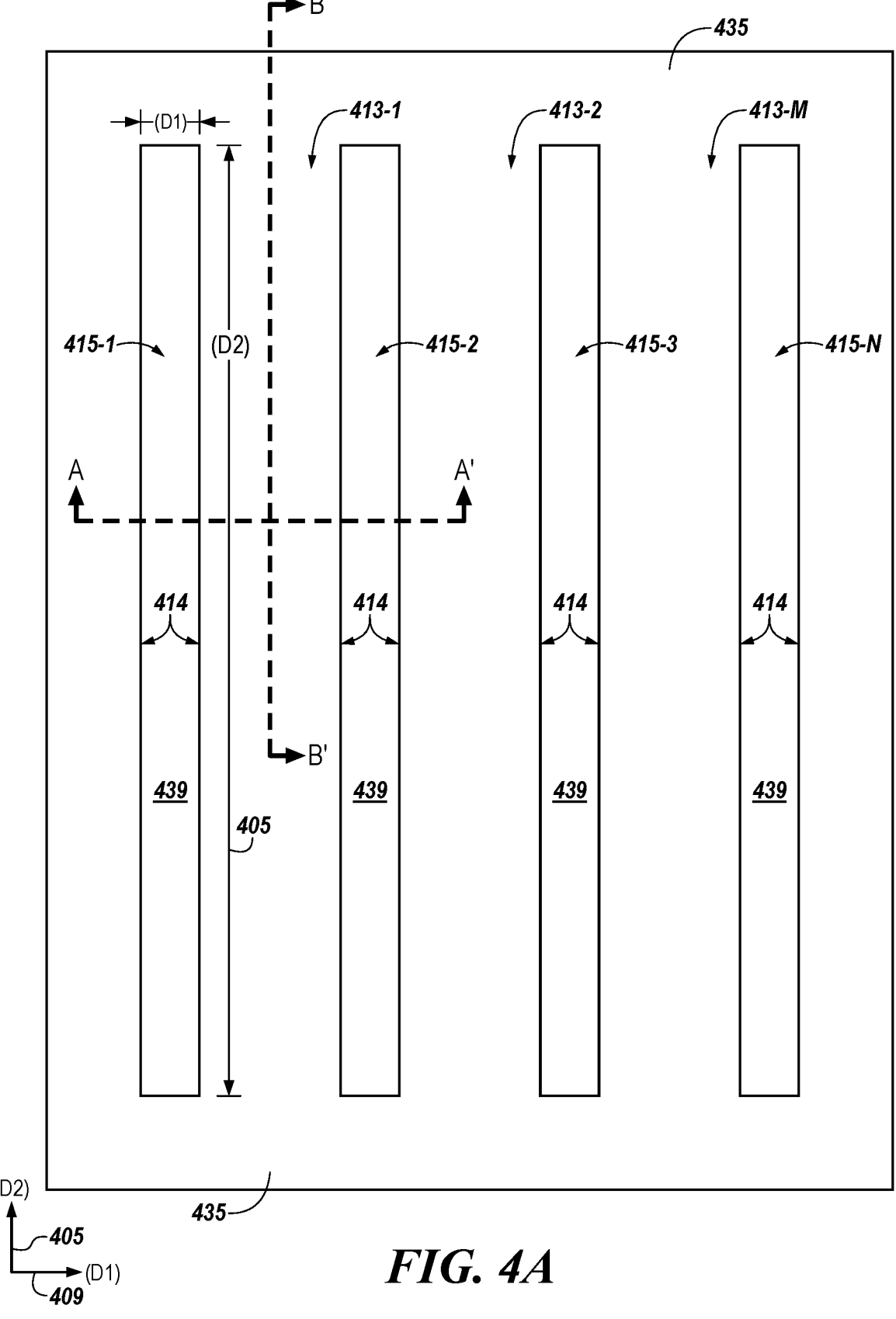
Figure 4B:
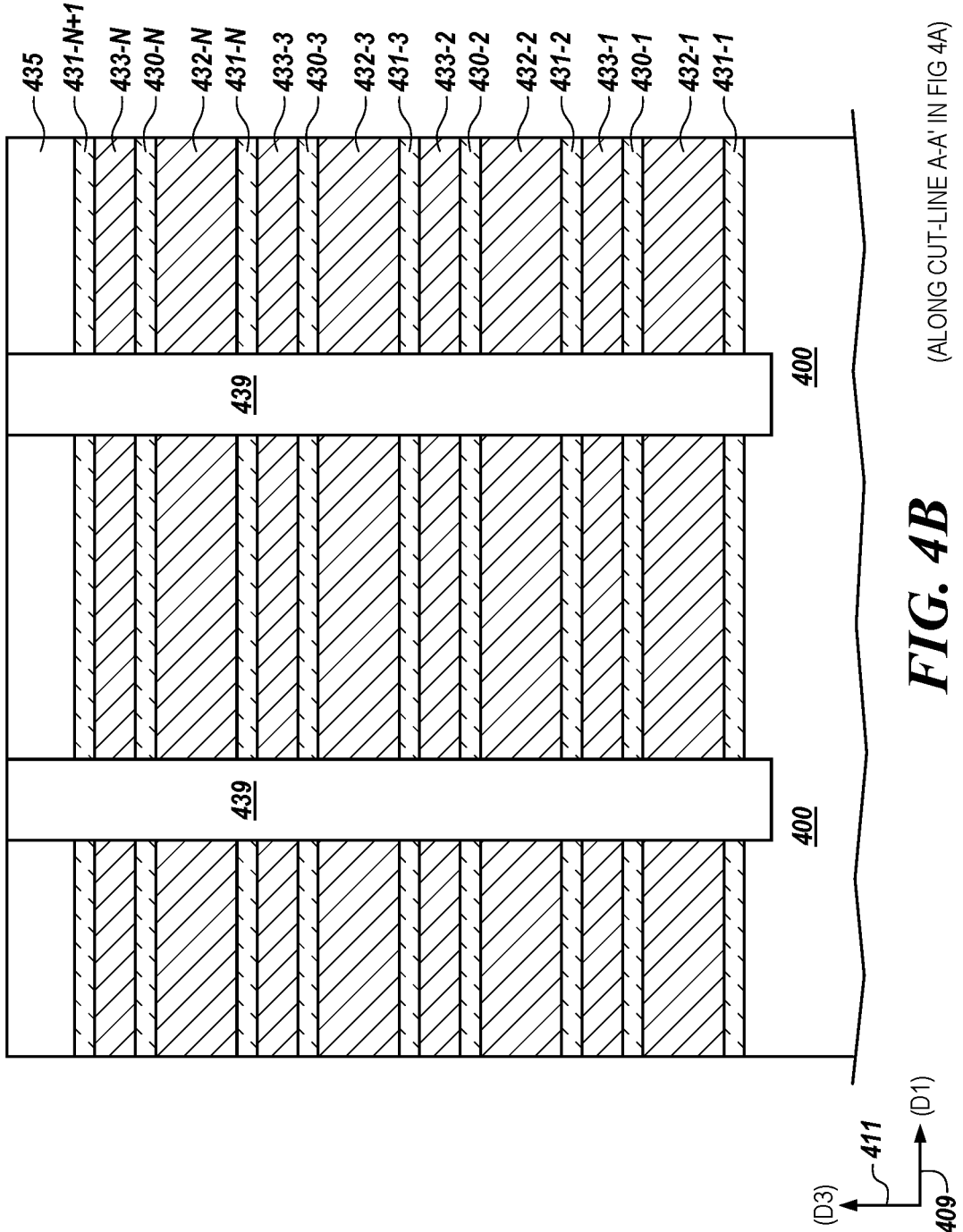

FIGS. 4A to 4B illustrate an example method, at one stage of a semiconductor fabrication process, for forming epitaxial silicon within horizontal access devices in vertical three dimensional (3D) memory, in accordance with a number of embodiments of the present disclosure.

FIGS. 5A to 5E illustrate an example method, at another stage of a semiconductor fabrication process, for forming epitaxial silicon within horizontal access devices in vertical three dimensional (3D) memory, in accordance with a number of embodiments of the present disclosure.

FIGS. 6A to 6D illustrate an example method, at another stage of a semiconductor fabrication process, for forming epitaxial silicon within horizontal access devices in vertical three dimensional (3D) memory, in accordance with a number of embodiments of the present disclosure.

Figure 7:
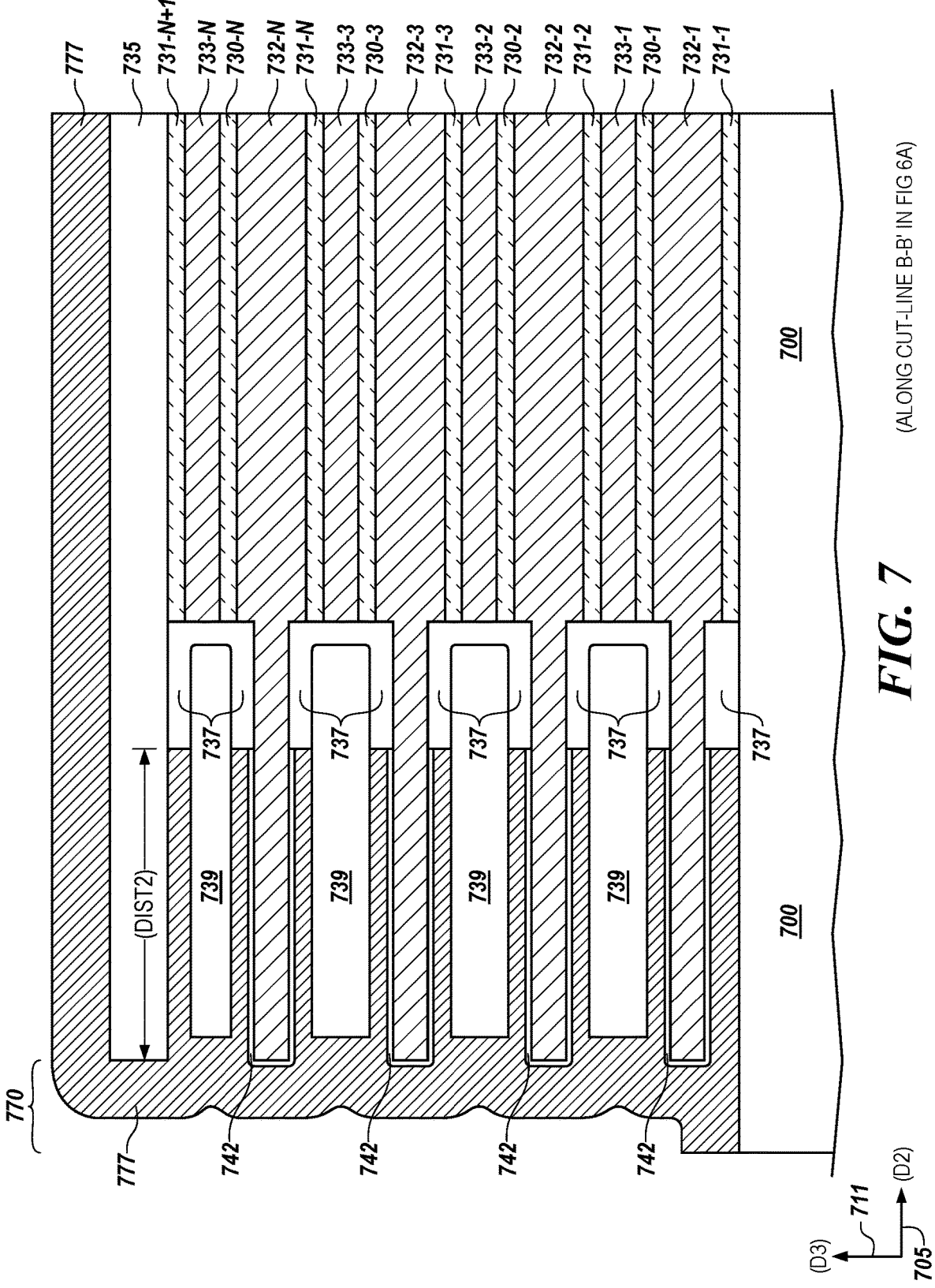

FIG. 7 illustrates an example method, at another stage of a semiconductor fabrication process, for forming epitaxial silicon within horizontal access devices in vertical three dimensional (3D) memory, in accordance with a number of embodiments of the present disclosure.

Figure 8A:
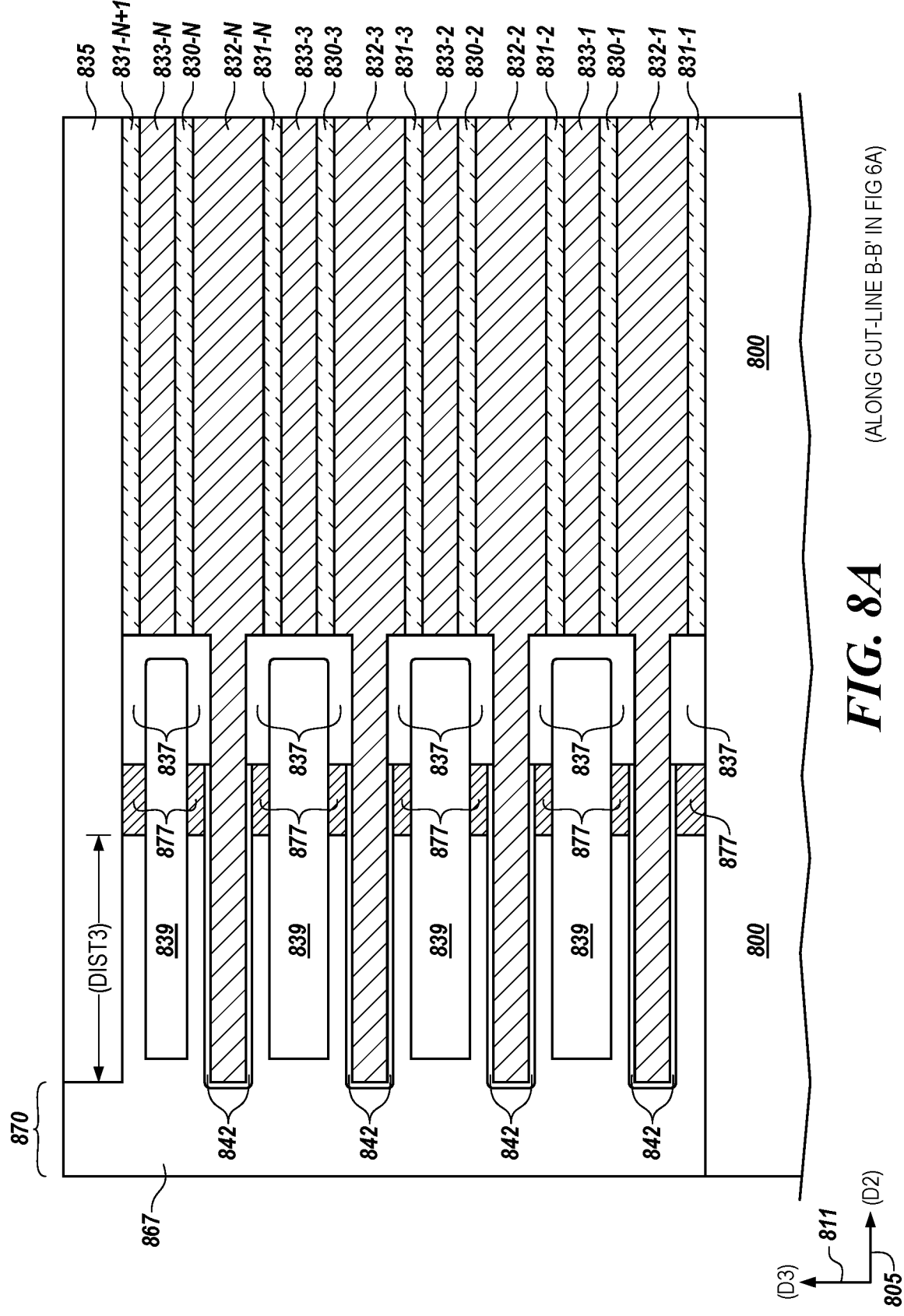
Figure 8B:
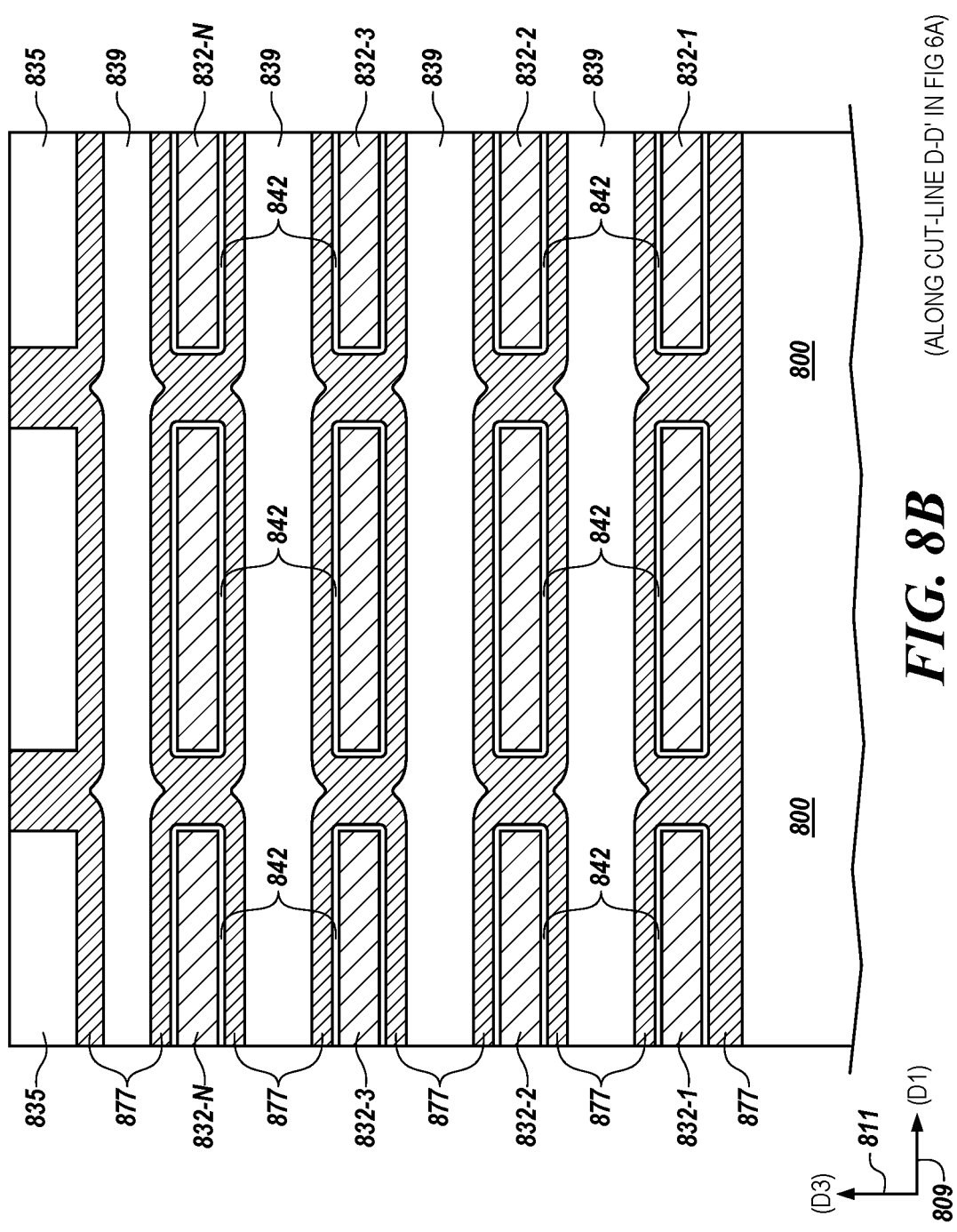

FIGS. 8A to 8B illustrate an example method, at another stage of a semiconductor fabrication process, for forming epitaxial silicon within horizontal access devices in vertical three dimensional (3D) memory, in accordance with a number of embodiments of the present disclosure.

Figure 9A:
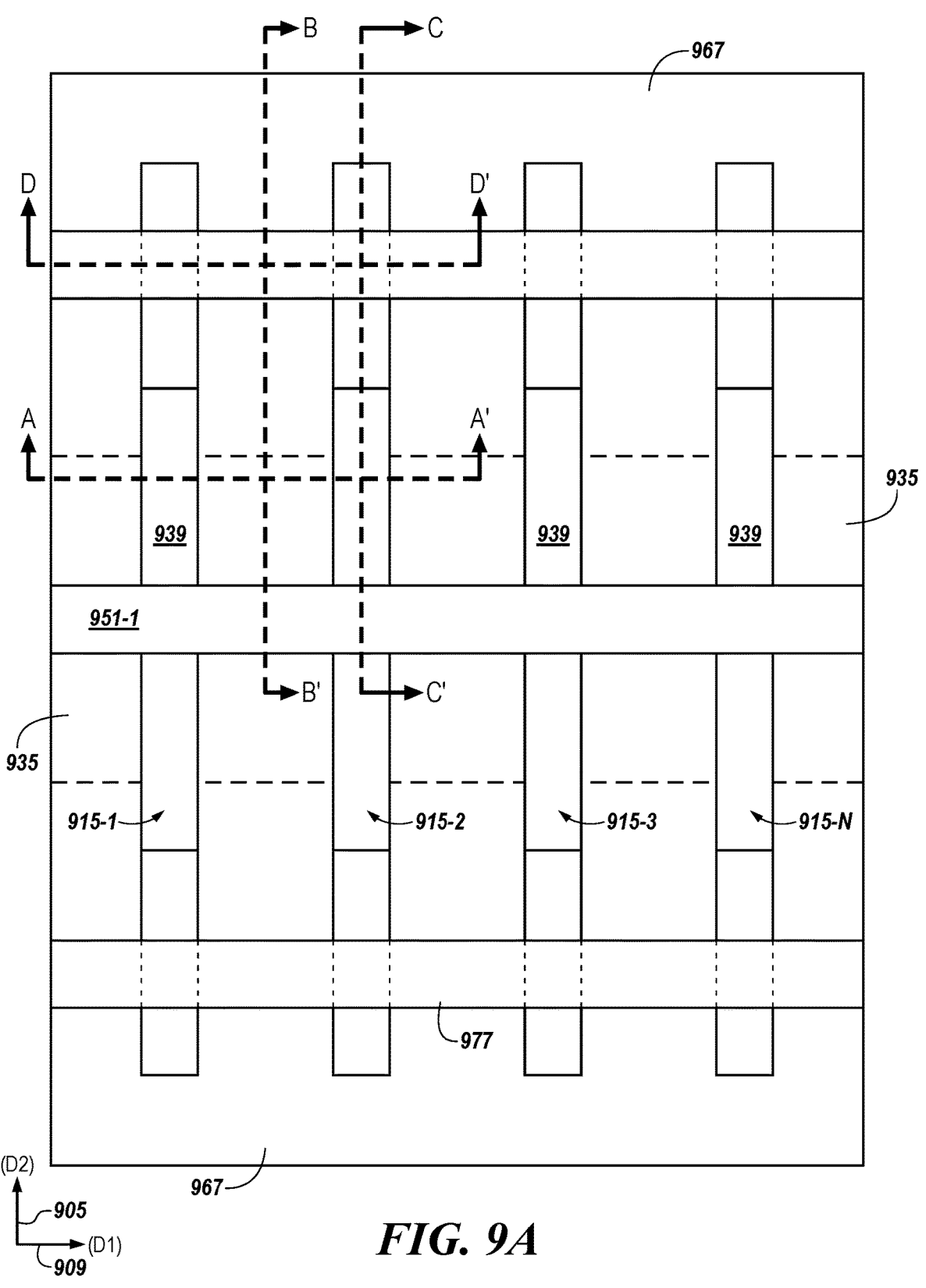
Figure 9B:
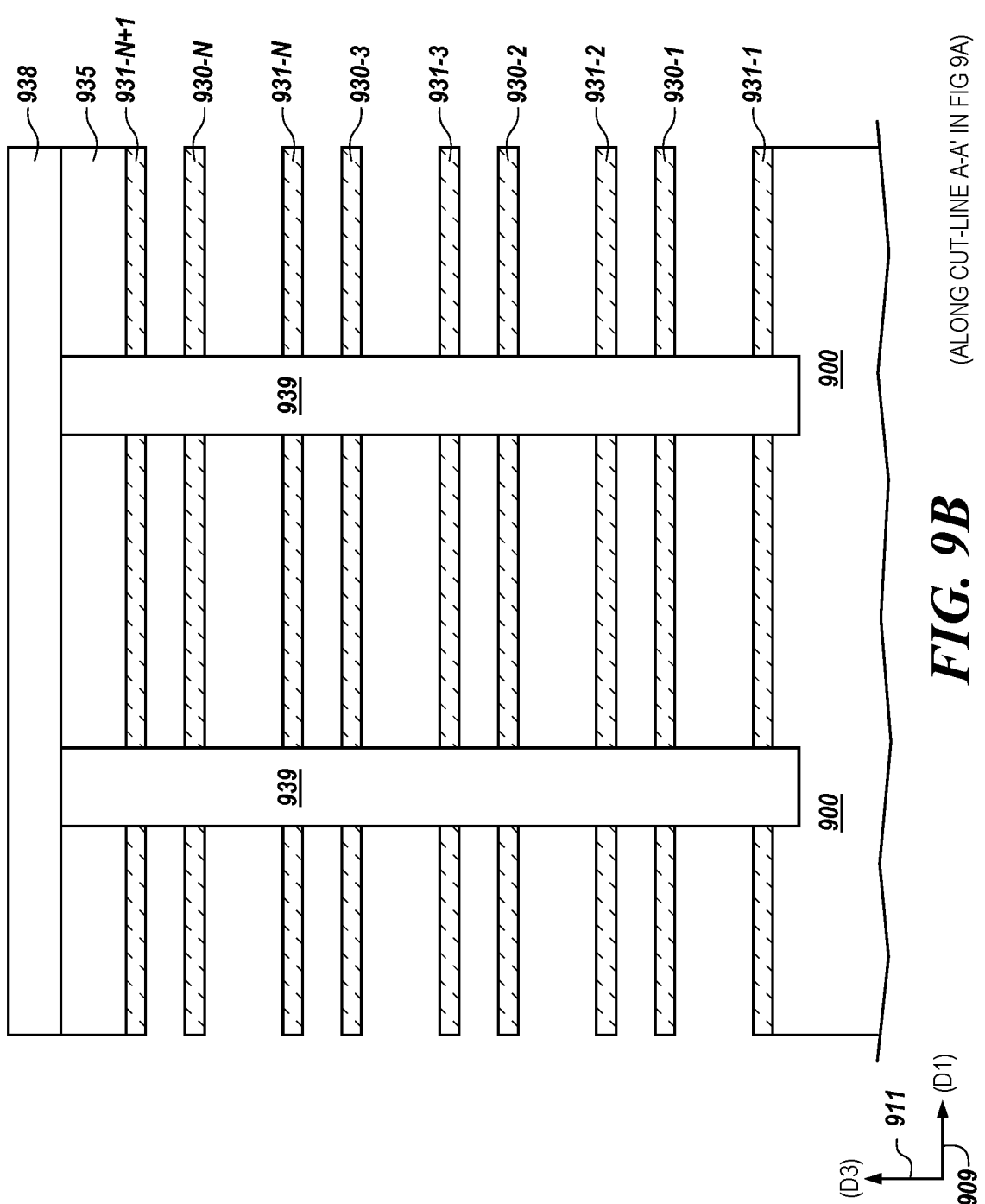
Figure 9C:
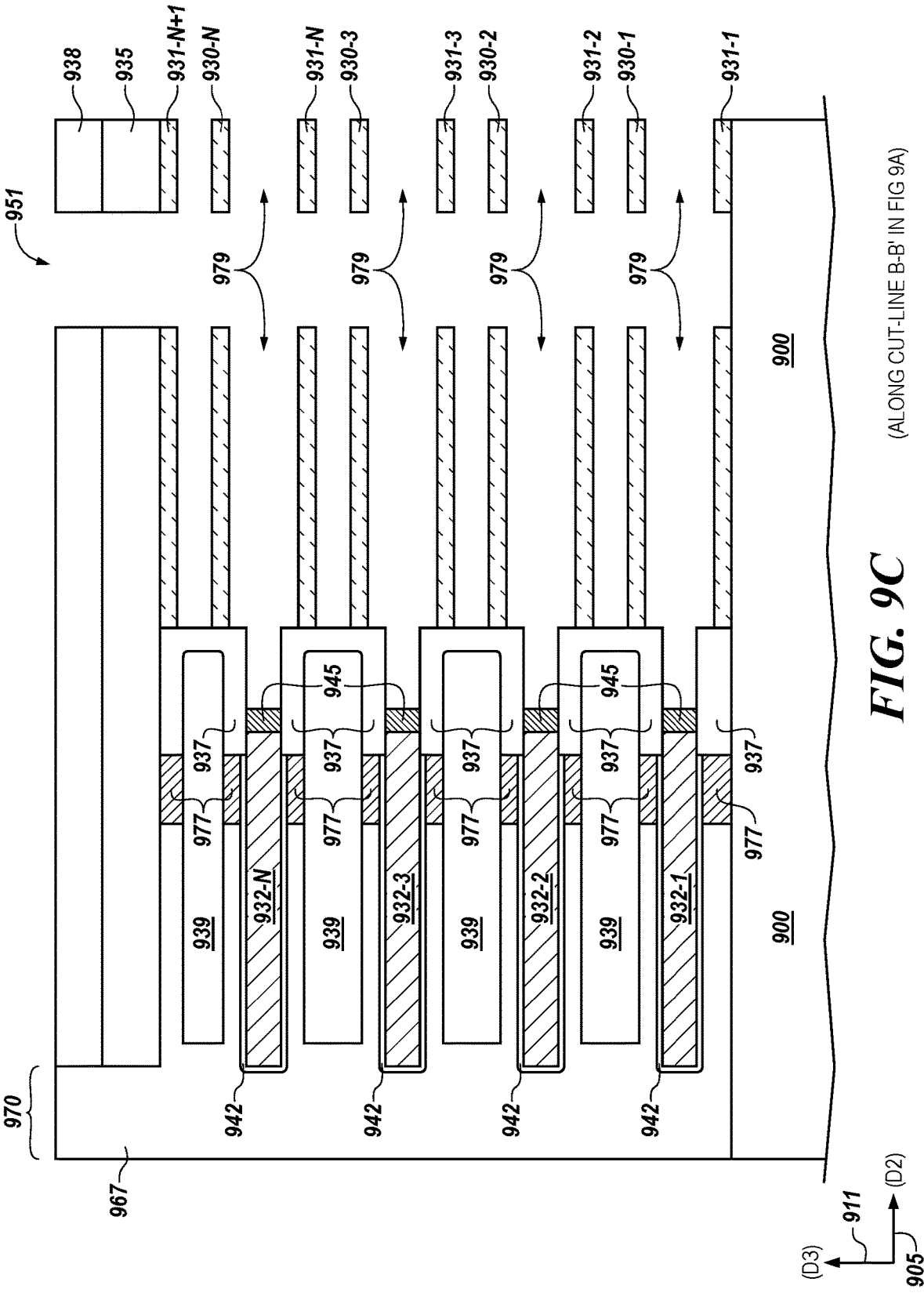

FIGS. 9A to 9C illustrate an example method, at another stage of a semiconductor fabrication process, for forming epitaxial silicon within horizontal access devices in vertical three dimensional (3D) memory, in accordance with a number of embodiments of the present disclosure.

Figure 10:
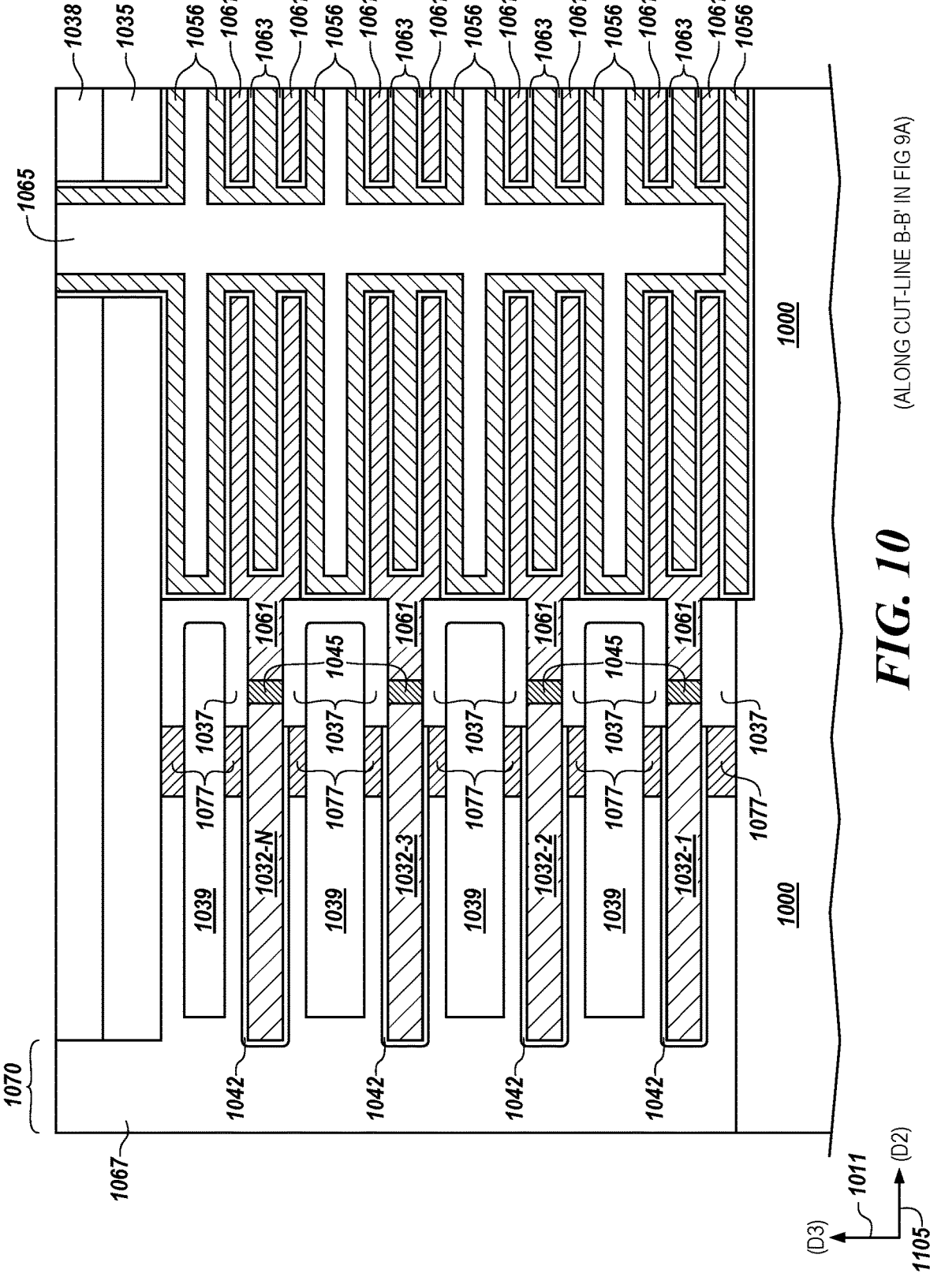

FIG. 10 illustrates an example method, at another stage of a semiconductor fabrication process, for forming epitaxial silicon within horizontal access devices in vertical three dimensional (3D) memory, in accordance with a number of embodiments of the present disclosure.

FIGS. 11A to 11D illustrate an example method, at another stage of a semiconductor fabrication process, for forming epitaxial silicon within horizontal access devices in vertical three dimensional (3D) memory, in accordance with a number of embodiments of the present disclosure.

Figure 12:
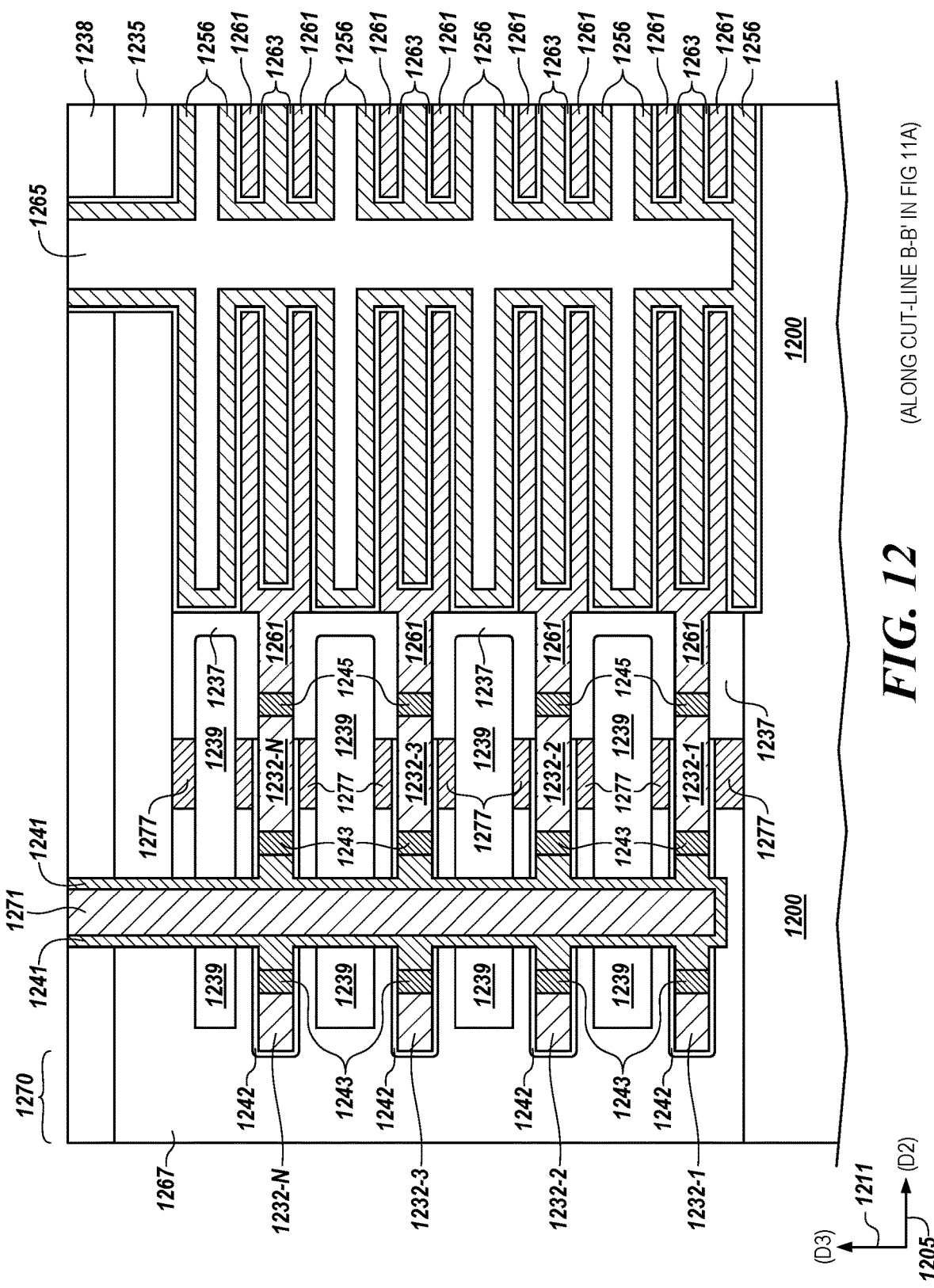
Figure 13:
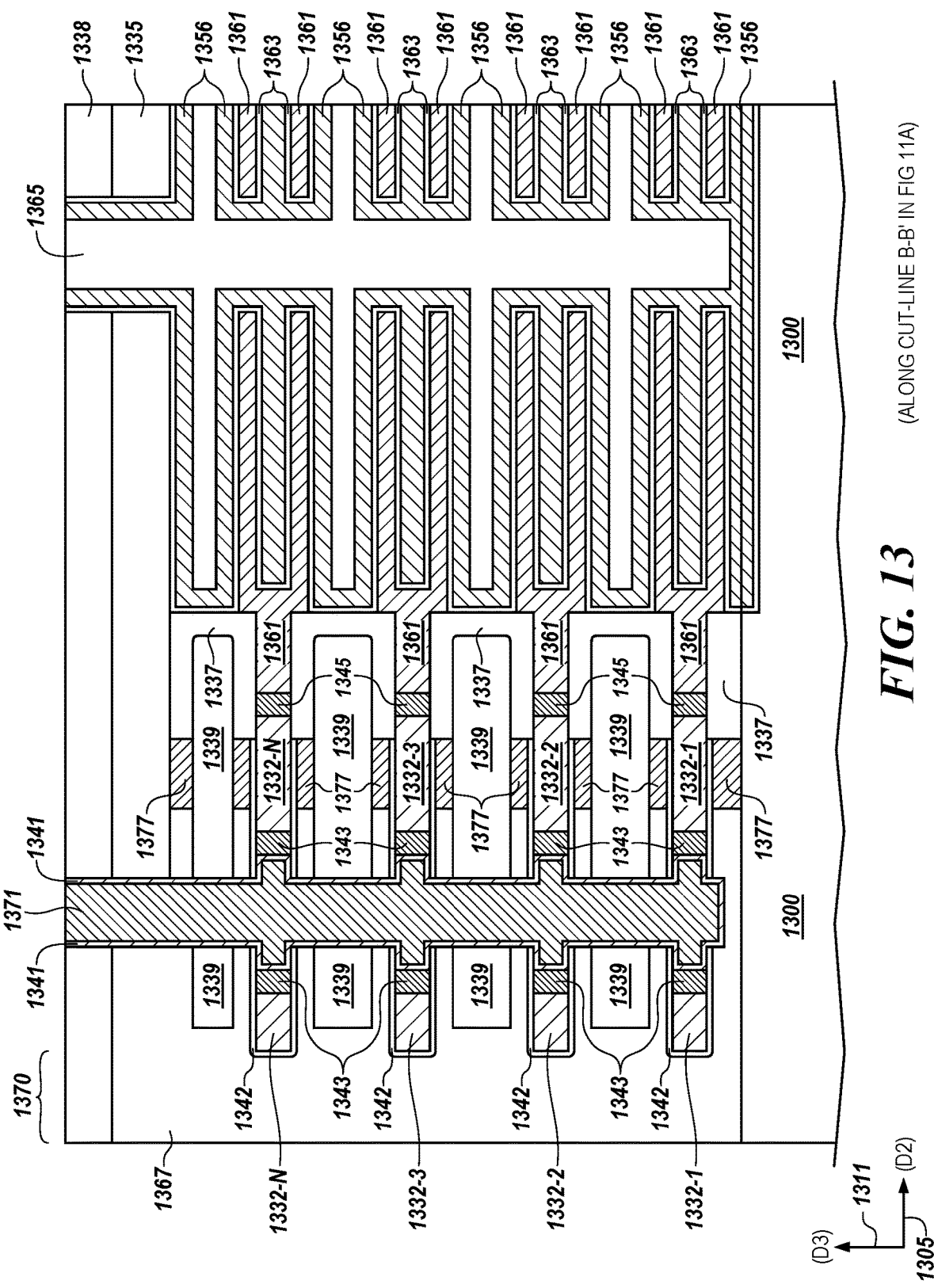

FIGS. 12 to 13 illustrate cross sectional views of an example horizontally oriented access device coupled to a horizontally oriented access lines, having vertical digit lines for semiconductor devices, in accordance with a number of alternate embodiments of the present disclosure from FIGS. 12A-12D.

Figure 14B:
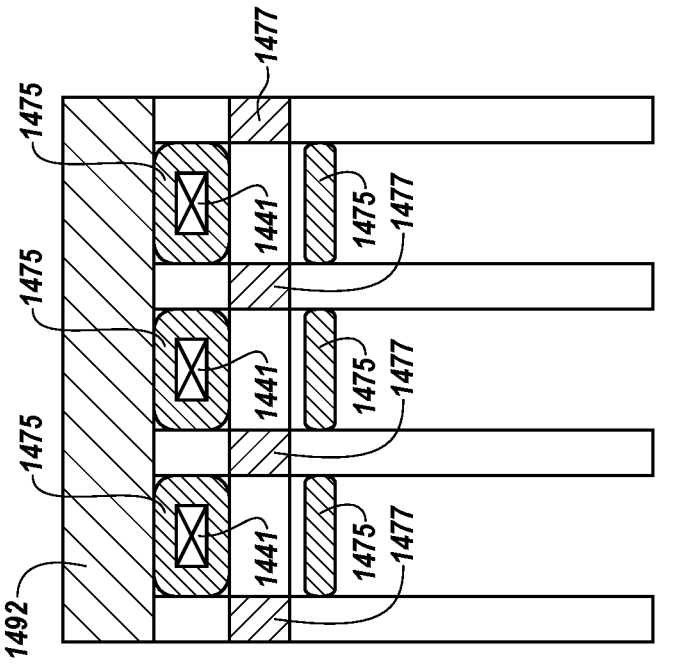
Figure 14A:
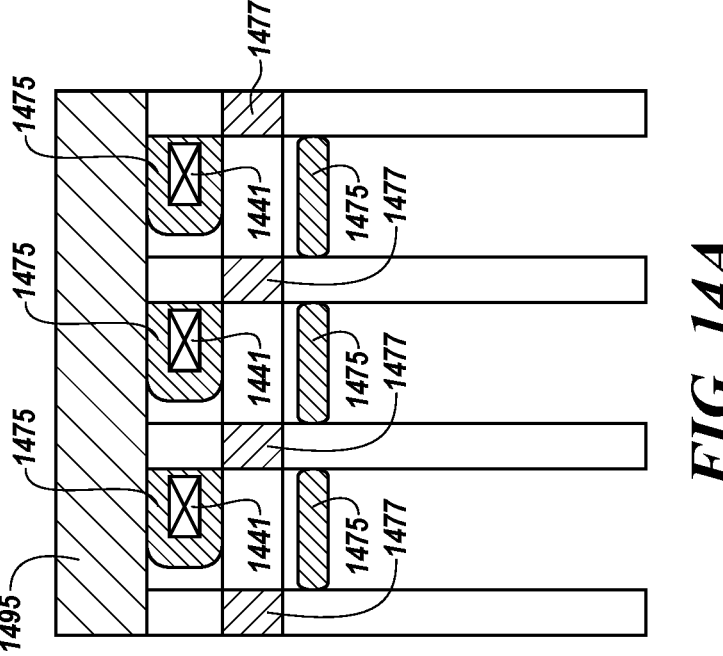

FIGS. 14A to 14B illustrate top views of example horizontally oriented access devices coupled to horizontally oriented access lines, having vertical digit lines for semiconductor devices for asymmetric and symmetric vertical digit lines, in accordance with a number of embodiments of the present disclosure.

Figure 15A:
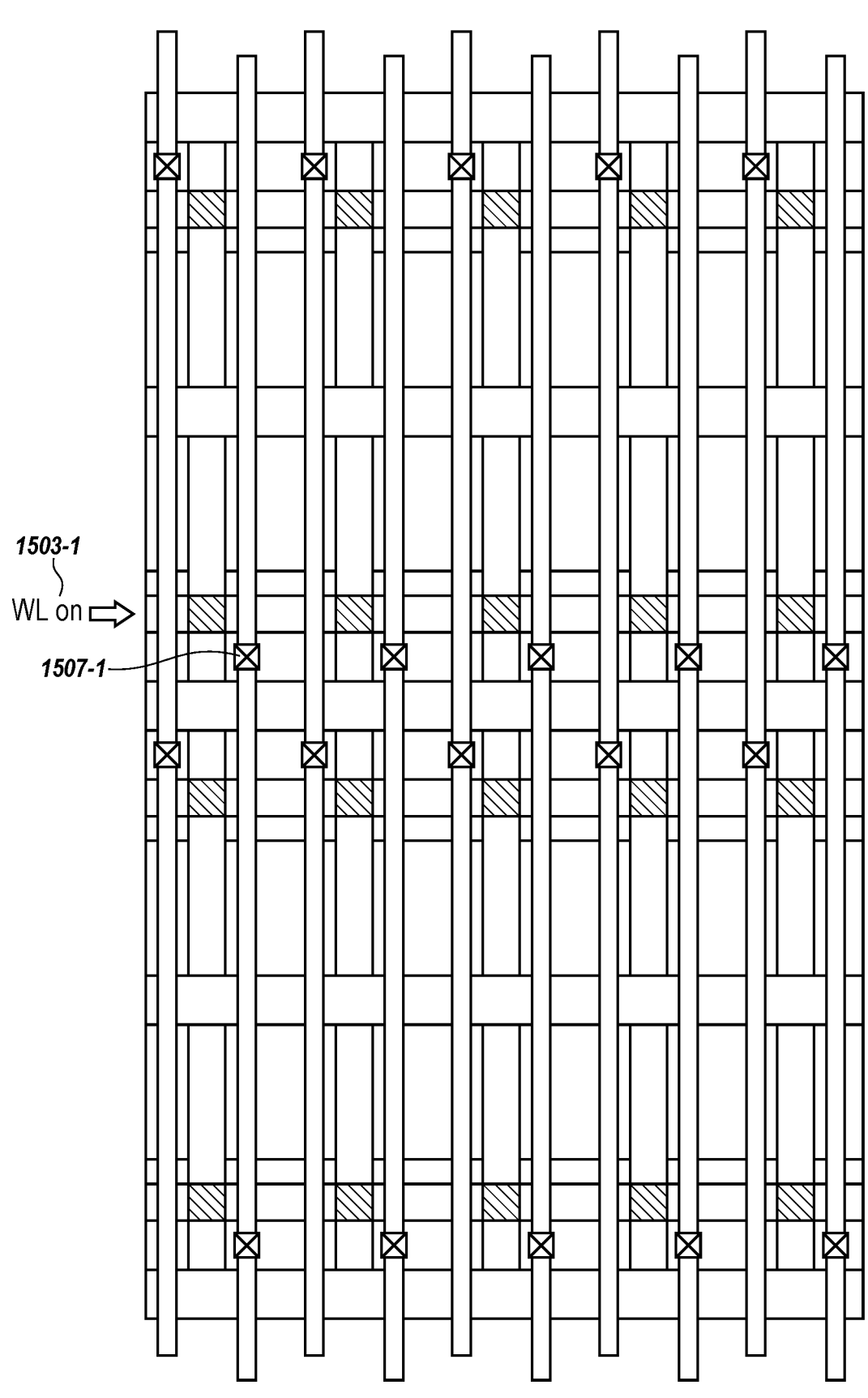
Figure 15B:
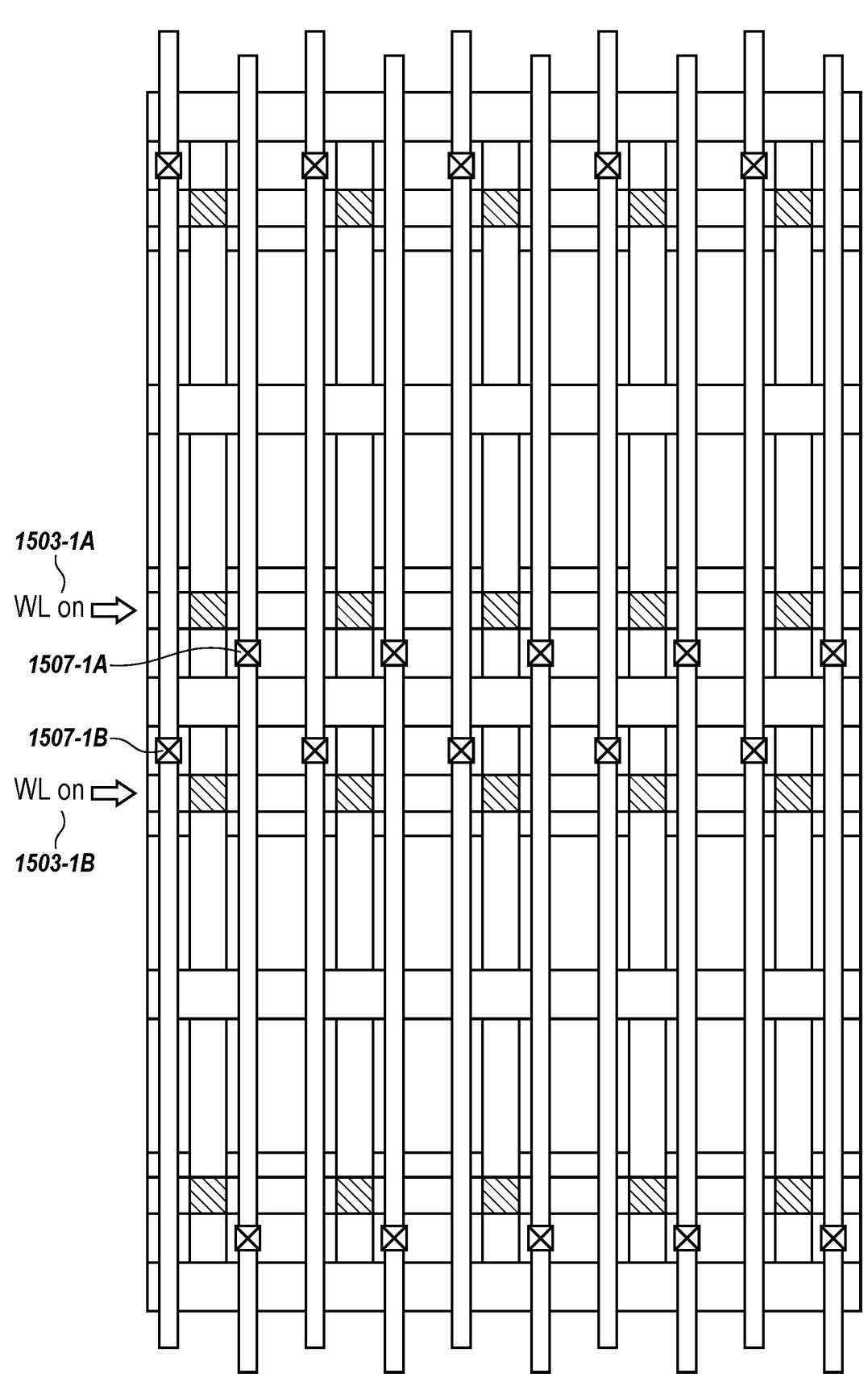

FIGS. 15A to 15B illustrate top down layout views for folded and open digit line architectures having horizontally oriented access devices coupled to horizontally oriented access lines, and having vertical digit lines for semiconductor devices, in accordance with a number of embodiments of the present disclosure.

Figure 16:
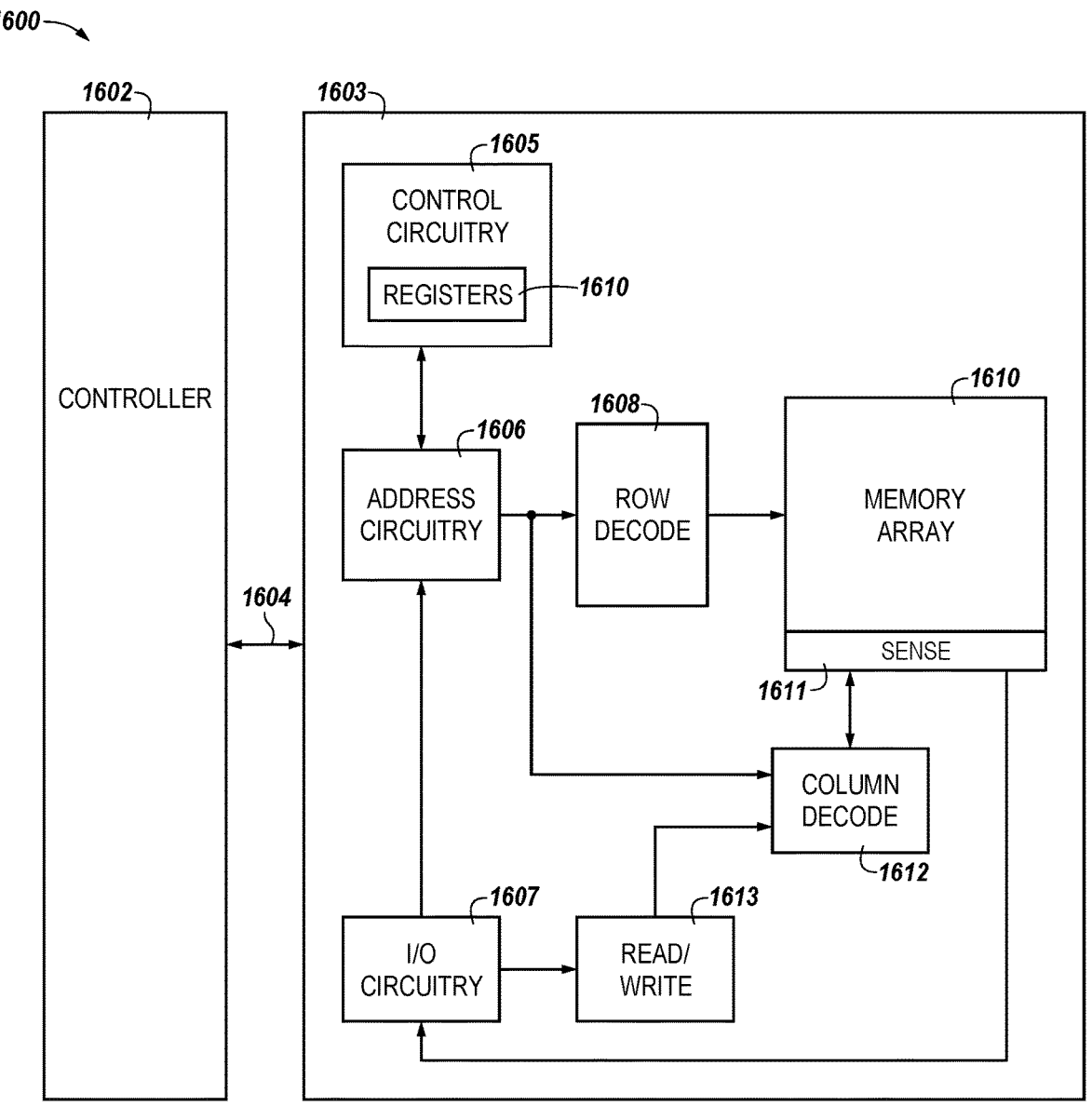

FIG. 16 is a block diagram of an apparatus in the form of a computing system including a memory device in accordance with a number of embodiments of the present disclosure.

Figure 17:
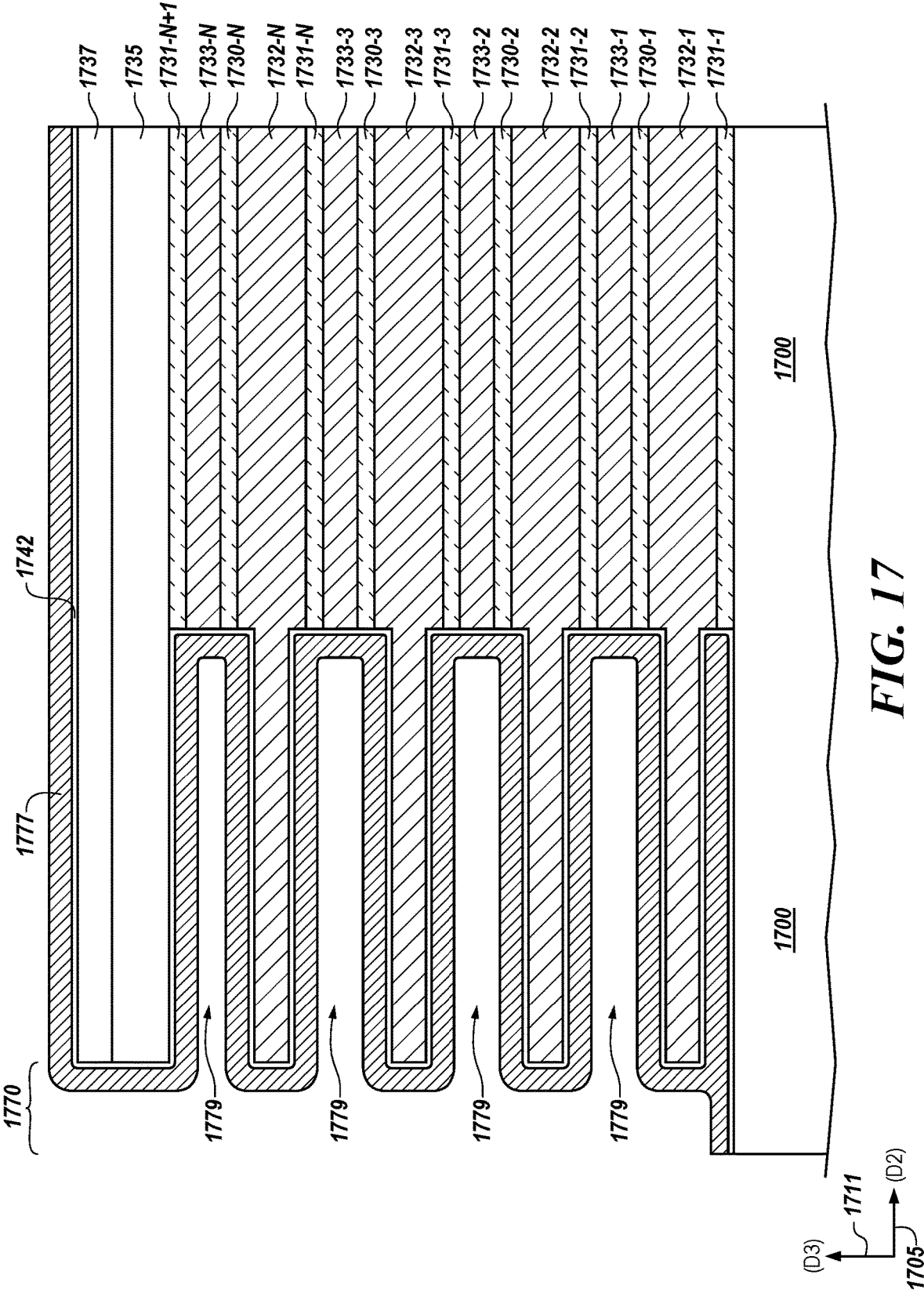

FIG. 17 illustrates another example method, in an alternate embodiment to that described in connection with FIG.

6C, of a semiconductor fabrication process, for forming epitaxial silicon within horizontal access devices in vertical three dimensional (3D) memory, in accordance with a number of embodiments of the present disclosure.

DETAILED DESCRIPTION

Embodiments of the present disclosure describe forming multiple, alternating epitaxially grown silicon germanium (SiGe) and epitaxially grown silicon (Si) to form horizontal access devices in vertical three dimensional (3D) memory. A vertically oriented digit line is formed with horizontally oriented access devices and access lines in an array of vertically stacked memory cells. The horizontal access devices are integrated with horizontally oriented access lines having a first source/drain regions and a second source drain regions separated by epitaxially grown channel regions and integrated with vertically oriented digit lines. In vertically stacked memory array structures, such as transistor structures, polycrystalline silicon (also referred to as polysilicon) can be leaky, allowing current to leak through the polycrystalline structure, making the transistor less effective. Single crystal silicon is not very leaky, however, single crystal silicon cannot grow on amorphous dielectric materials, such as oxides or nitrides, which are the common materials upon which transistors are formed.

However, as disclosed in the embodiments of the present disclosure, it is possible to use a silicon wafer for a transistor that can be utilized as a substrate during the high temperature processes required for single crystal silicon formation. In such embodiments, a layer of silicon germanium can be grown on the silicon substrate. Single crystal silicon can, then, be grown on the silicon germanium.

This may be accomplished, for example, by heating a Si substrate in a non-oxidizing environment to a suitable temperature, and exposing the substrate to sources of Si and Ge atoms, such that a crystalline layer of SiGe forms epitaxially matched to the starting Si crystal lattice. Once the desired layer thickness is formed, a silicon layer can be formed into the surface of the silicon germanium layer. As with the silicon germanium layer, this may be accomplished, by exposing the substrate to a source of Si atoms, such that a crystalline Si layer forms epitaxially matched to the starting Si crystal lattice.

Depending on the silicon germanium concentration, if silicon is x quantity and germanium is y quantity and, if y is smaller than x, then silicon/silicon germanium has a small lattice mismatch with respect to the lattice of single crystal silicon. This allows silicon to be grown on top of silicon germanium with a single crystal structure. If a thin layer of single crystal silicon is applied to the surface of the silicon germanium, then the whole silicon layer acts as a seed for the growth of the single crystal silicon layer. Such layering can be done in alternating iterations (e.g., SiGe/Si/SiGe/Si, etc.) to create a superlattice structure by selective etch for defect mitigation in the form of a vertical stack such as shown in FIG. 4.

For example, a seed layer of silicon germanium can be formed that is 100 Angstroms in thickness (height) and can be grown to, for example 1000 Angstroms. A thin silicon seed layer can be formed on the surface of the silicon germanium layer that is, for example, 50 Angstroms and can be grown to a thickness of, for example, 300 Angstroms. These thicknesses are merely provided as examples and should not be regarded as limiting unless recited explicitly in a particular claim.

The transistor devices of the present disclosure will have better performance with regard to I-on, better I-off, drivability, and/or leakage current because there is no grain boundary and therefore current cannot leak through the grain boundary which is where leakage often occurs in polysilicon. In some embodiments, devices can have, for example, three orders of magnitude lower I-off (leakage).

Advantages to the structure and process described herein can include a lower off-current (Ioff) for the access devices, as compared to silicon based (Si-based) access devices (e.g., transistors), better DRAM refresh requirement, and/or reduced gate/drain induced leakage (GIDL) for the access devices. The present disclosure describes a channel region formed from a epitaxially grown materials. Combined with a gate all around (GAA) structure at the channel region of the semiconductor material, provides better electrostatic control on the channel, better subthreshold slope and a more cost effective process.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

Figure 1A:
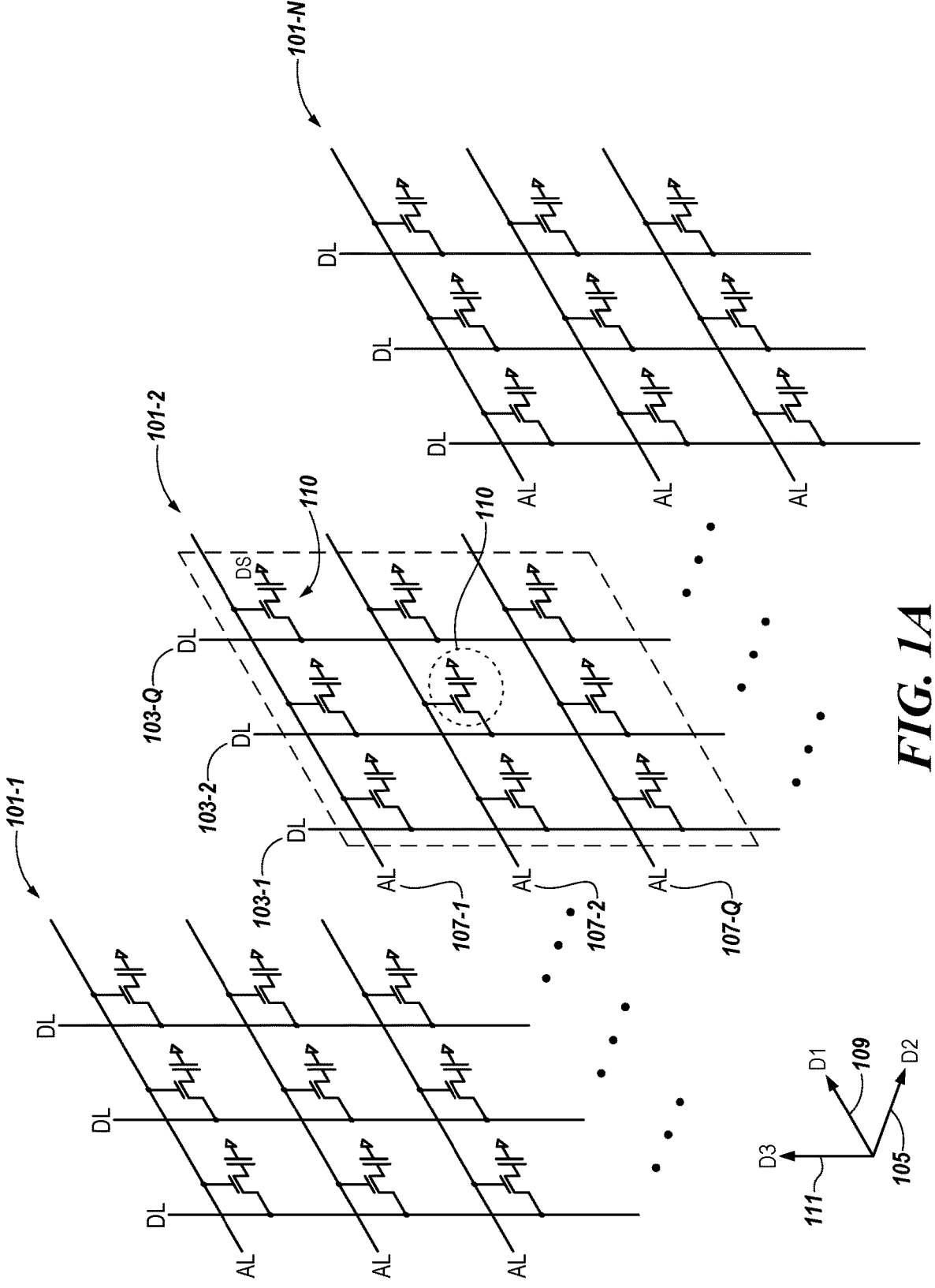
FIG. 1A is a schematic illustration of a horizontal access device in a vertical three dimensional (3D) memory in accordance a number of embodiments of the present disclosure.

FIG. 1A is a block diagram of an apparatus in accordance with a number of embodiments of the present disclosure. FIG. 1A illustrates a circuit diagram showing a cell array of a three dimensional (3D) semiconductor memory device according to embodiments of the present disclosure. FIG. 1A illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of digit lines 103-1, 103-2, . . . , 103-Q (which also may be referred to as bit lines, data lines, or sense lines). In FIG. 1A, the access lines 107-1, 107-2, . . . , 107-Q are illustrated extending in a first direction (D1) 109 and the digit lines 103-1, 103-2, . . . , 103-Q are illustrated extending in a second direction (D3) 111. According to embodiments, the first direction (D1) 109 and the second direction (D2) 105 may be considered in a horizontal ("X-Y") plane. The second direction (D3) 111 may be considered in a vertical ("Z") plane. Hence, according to embodiments described herein, the digit lines 103-1, 103-2, . . . , 103-Q are extending in a vertical direction, e.g., second direction (D3) 111.

A memory cell, e.g., 110, may include an access device, e.g., access transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . , 107-Q and a digit line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a second direction (D3) 111.

The digit lines 103-1, 103-2, . . . , 103-Q may be or include conductive patterns (e.g., metal lines) extending in a vertical direction with respect to the substrate, e.g., in a second direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
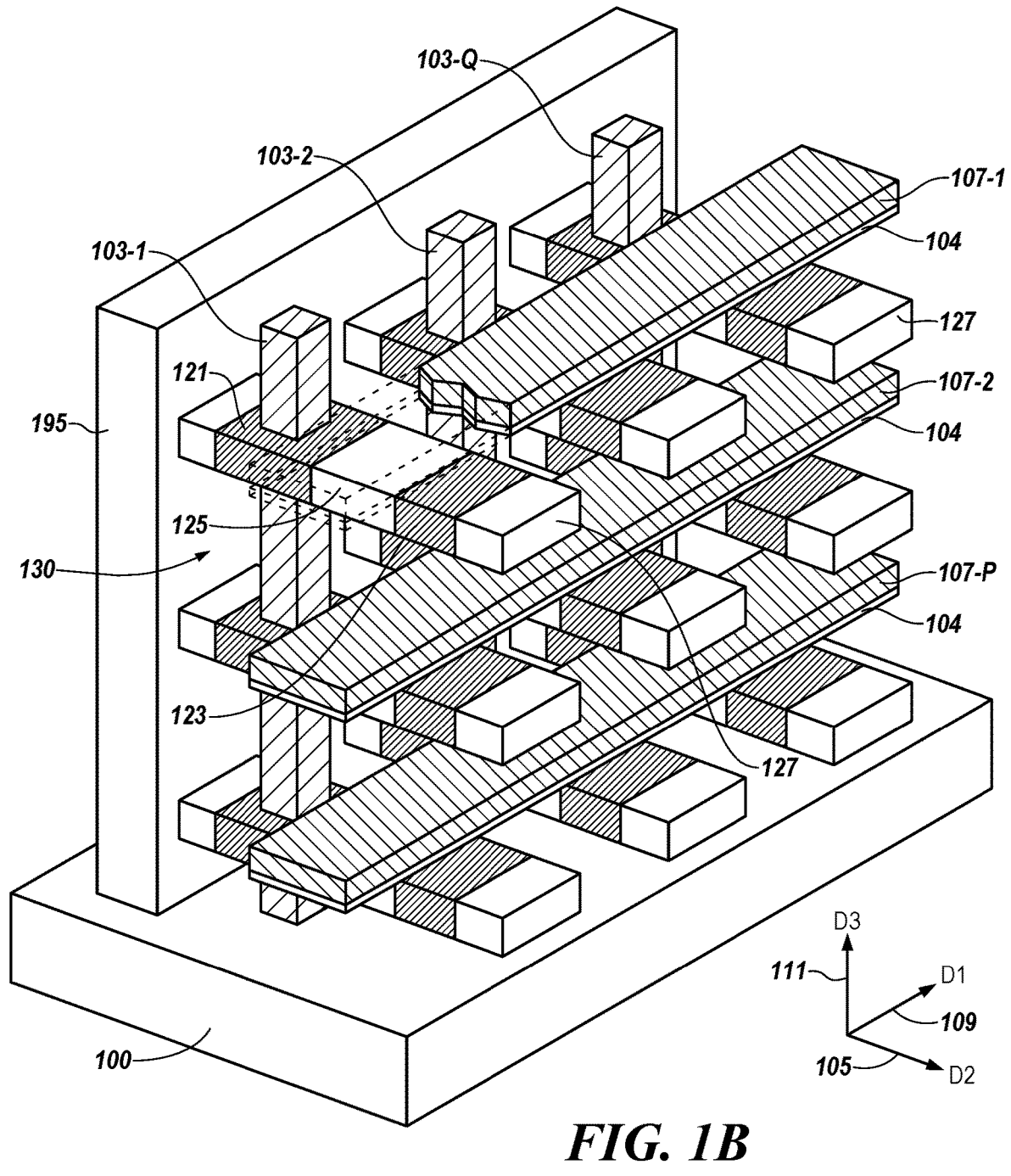
FIG. 1B is a perspective view illustrating a portion of a horizontal access devices in vertical three dimensional (3D) memory in accordance with a number of embodiments of the present disclosure.

FIG. 1B illustrates a perspective view showing a three dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon one of the plurality of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., second direction (D3) 111. According to some embodiments the vertically oriented stack of memory cells may be fabricated such that each memory cell, e.g., memory cell 110 in FIG. 1A, is formed on plurality of vertical levels, e.g., a first level (L1), a second level (L2), and a second level (L3). The repeating, vertical levels, L1, L2, and L3, may be arranged, e.g., "stacked", a vertical direction, e.g., second direction (D3) 111 shown in FIG. 1A, and may be separated from the substrate 100 by an insulator material 120. Each of the repeating, vertical levels, L1, L2, and L3 may include a plurality of discrete components, e.g., regions, to the horizontally oriented access devices 130, e.g., transistors, and storage nodes, e.g., capacitors, including access line 107-1,

107-2, . . . , 107-Q connections and digit line 103-1, 103-2, . . . , 103-Q connections. The plurality of discrete components to the horizontally oriented access devices 130, e.g., transistors, may be formed in a plurality of vertically, repeating layers within each level, as described in more detail below in connection with FIGS. 4A-4K, and may extend horizontally in the second direction (D2) 105, analogous to second direction (D2) 105 shown in FIG. 1A.

The plurality of discrete components to the laterally oriented access devices 130, e.g., transistors, may include a first source/drain region 121 and a second source/drain region 123 separated by a channel region 125, extending laterally in the second direction (D2) 105, and formed in a body of the access devices. According to embodiments described herein, and as seen further below, the channel region 125 is formed of epitaxially grown, single crystalline silicon. However, in alternate embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, e.g., capacitor, may be connected to the second source/drain region 123 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, . . . , 107-Q extend in the first direction (D1) 109, analogous to the first direction (D1) 109 in FIG. 1A. The plurality of horizontally oriented access lines 107-1, 107-2, . . . , 107-Q may be analogous to the access lines 107-1, 107-2, . . . , 107-Q shown in FIG. 1A. The plurality of horizontally oriented access lines 107-1, 107-2, . . . , 107-Q may be arranged, e.g., "stacked", along the second direction (D3) 111. The plurality of horizontally oriented access lines 107-1, 107-2, . . . , 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 130, e.g., first source/drain region 121 and second source/drain region 123 separated by a channel region 125, extending laterally in the second direction (D2) 105, and the plurality of horizontally oriented access lines 107-1, 107-2, . . . , 107-Q extending laterally in the first direction (D1) 109, may be formed within different vertical layers within each level. For example, the plurality of horizontally oriented access lines 107-1, 107-2, . . . , 107-Q, extending in the first direction (D1) 109, may be formed on a top surface opposing and electrically coupled to the channel regions 125, separated therefrom by a gate dielectric, and orthogonal to horizontally oriented access devices 130, e.g., transistors, extending in laterally in the second direction (D2) 105. In some embodiments, the plurality of horizontally oriented access lines 107-1, 107-2, . . . , 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, . . . , 103-Q, extend in a vertical direction with respect to the substrate 100, e.g., in a second direction (D3) 111. Further, as shown in FIG. 1B, the digit lines, 103-1, 103-2, . . . , 103-Q, in one sub cell array, e.g., sub cell array 101-2 in FIG. 1A, may be spaced apart from each other in the first direction (D1) 109. The digit lines, 103-1, 103-2, . . . , 103-Q, may be provided, extending vertically relative to the substrate 100 in the second direction (D3) 111 in vertical alignment with source/drain regions to serve as first source/drain regions 121 or, as shown, be vertically adjacent first source/drain regions 121 for each of the horizontally oriented access devices 130, e.g., transistors, extending laterally in the second direction (D2) 105, but adjacent to each other on a level, e.g., first level (L1), in the first direction (D1) 109. Each of the digit lines, 103-1, 103-2, . . . , 103-Q, may vertically extend, in the second direction (D3), on sidewalls, adjacent first source/drain regions 121, of respective ones of the plurality of horizontally oriented access devices 130, e.g., transistors, that are vertically stacked. In some embodiments, the plurality of vertically oriented digit lines 103-1, 103-2, . . . , 103-Q, extending in the second direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 130, e.g., transistors, in the first level (L1) 113-1, a sidewall of a first source/drain region 121 of a first one of the horizontally oriented access devices 130, e.g., transistors, in the second level (L2) 113-2, and a sidewall of a first source/drain region 121 a first one of the horizontally oriented access devices 130, e.g., transistors, in the second level (L3) 113-P, etc. Similarly, a second one of the vertically extending digit lines, e.g., 103-2, may be adjacent a sidewall to a first source/drain region 121 of a second one of the horizontally oriented access devices 130, e.g., transistors, in the first level (L1) 113-1, spaced apart from the first one of horizontally oriented access devices 130, e.g., transistors, in the first level (L1) 113-1 in the first direction (D1) 109. And the second one of the vertically extending digit lines, e.g., 103-2, may be adjacent a sidewall of a first source/drain region 121 of a second one of the laterally oriented access devices 130, e.g., transistors, in the second level (L2) 113-2, and a sidewall of a first source/drain region 121 of a second one of the horizontally oriented access devices 130, e.g., transistors, in the second level (L3) 113-P, etc. Embodiments are not limited to a particular number of levels.

The vertically extending digit lines, 103-1, 103-2, . . . , 103-Q, may include a conductive material, such as, for example, one of a doped semiconductor material, a conductive metal nitride, metal, and/or a metal-semiconductor compound. The digit lines, 103-1, 103-2, . . . , 103-Q, may correspond to digit lines (DL) described in connection with FIG. 1A.

As shown in the example embodiment of FIG. 1B, a conductive body contact may be formed extending in the first direction (D1) 109 along an end surface of the horizontally oriented access devices 130, e.g., transistors, in each level (L1) 113-1, (L2) 113-2, and (L3) 113-P above the substrate 100. The body contact may be connected to a body (as shown by 336 in FIG. 3) e.g., body region, of the horizontally oriented access devices 130, e.g., transistors, in each memory cell, e.g., memory cell 110 in FIG. 1A. The body contact may include a conductive material such as, for example, one of a doped semiconductor material, a conductive metal nitride, metal, and/or a metal-semiconductor compound.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 2A:
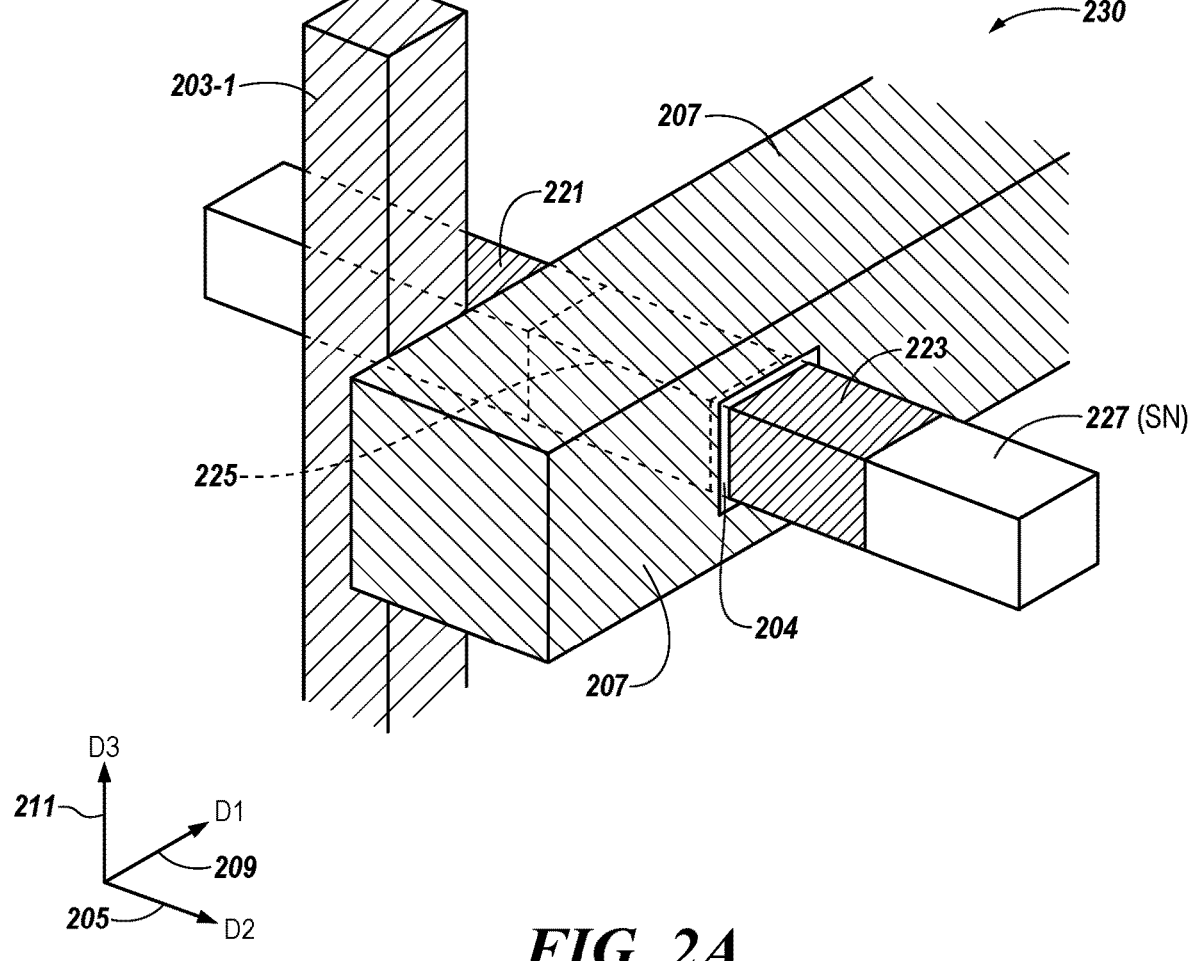
FIGS. 2A-2B illustrate a portion of a horizontal access devices in vertical three dimensional (3D) memory in accordance with a number of embodiments of the present disclosure.

FIG. 2A illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 2A, the first and the second source/drain regions, 221 and 223, may be impurity doped regions to the laterally oriented access devices 230, e.g., transistors. The first and the second source/drain regions, 221 and 223, may be analogous to the first and the second source/drain regions 221 and 223 shown in FIG. 2. The first and the second source/drain regions may be separated by a channel 225 formed in a body of semiconductor material, e.g., body region of the horizontally oriented access devices 230, e.g., transistors. The first and the second source/drain regions, 221 and 223, may be formed from an n-type or p-type dopant doped in the body region. Embodiments are not so limited.

For example, for an n-type conductivity transistor construction the body region of the laterally oriented access devices 230, e.g., transistors, may be formed of a low doped p-type (p−) semiconductor material. In one embodiment, the body region and the channel 225 separating the first and the second source/drain regions, 221 and 223, may include a low doped, p-type (e.g., low dopant concentration (p−)) polysilicon (Si) material consisting of boron (B) atoms as an impurity dopant to the polycrystalline silicon. The first and the second source/drain regions, 221 and 223, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide (In$_2$O$_3$), or indium tin oxide (In$_{2-x}$Sn$_x$O$_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 221 and 221, may include a high dopant concentration, n-type conductivity impurity (e.g., high dopant (n+)) doped in the first and the second source/drain regions, 221 and 223. In some embodiments, the high dopant, n-type conductivity first and second drain regions 221 and 223 may include a high concentration of phosphorus (P) atoms deposited therein. Embodiments, however, are not limited to this example. In other embodiments, the horizontally oriented access devices 230, e.g., transistors, may be of a p-type conductivity construction in which case the impurity, e.g., dopant, conductivity types would be reversed.

As shown in the example embodiment of FIG. 2A, the first source/drain region 221 may occupy an upper portion in the body of the laterally oriented access devices 230, e.g., transistors. For example, the first source/drain region 221 may have a bottom surface within the body of the horizontally oriented access device 230 which is located higher, vertically in the second direction (D3) 211, than a bottom surface of the body of the laterally, horizontally oriented access device 230. As such, the laterally, horizontally oriented transistor 230 may have a body portion which is below the first source/drain region 221 and is in electrical contact with the body contact. Further, as shown in the example embodiment of FIG. 2A, an access line, e.g., 207-1, analogous to the access lines 207-1, 207-2, . . . , 207-Q in FIGS. 2 and 107-1, 107-2, . . . , 107-Q shown in FIG. 1, may disposed on a top surface opposing and coupled to a channel region 225, separated therefrom by a gate dielectric 204. The gate dielectric material 204 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 204 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 2A, a digit line, e.g., 203-1, analogous to the digit lines 103-1, 103-2, . . . , 103-Q in FIG. 1, may be vertically extending in the second direction (D3) 211 adjacent a sidewall of the first source/drain region 221 in the body to the horizontally oriented access devices 230, e.g., transistors horizontally conducting between the first and the second source/drain regions 221 and 223 along the second direction (D2) 205. In this embodiment, the vertically oriented digit line 203-1 is formed asymmetrically adjacent in electrical contact with the first source/drain regions 221. The digit line 203-1 may be formed as asymmetrically to reserve room for a body contact in the channel region 225.

Figure 2B:
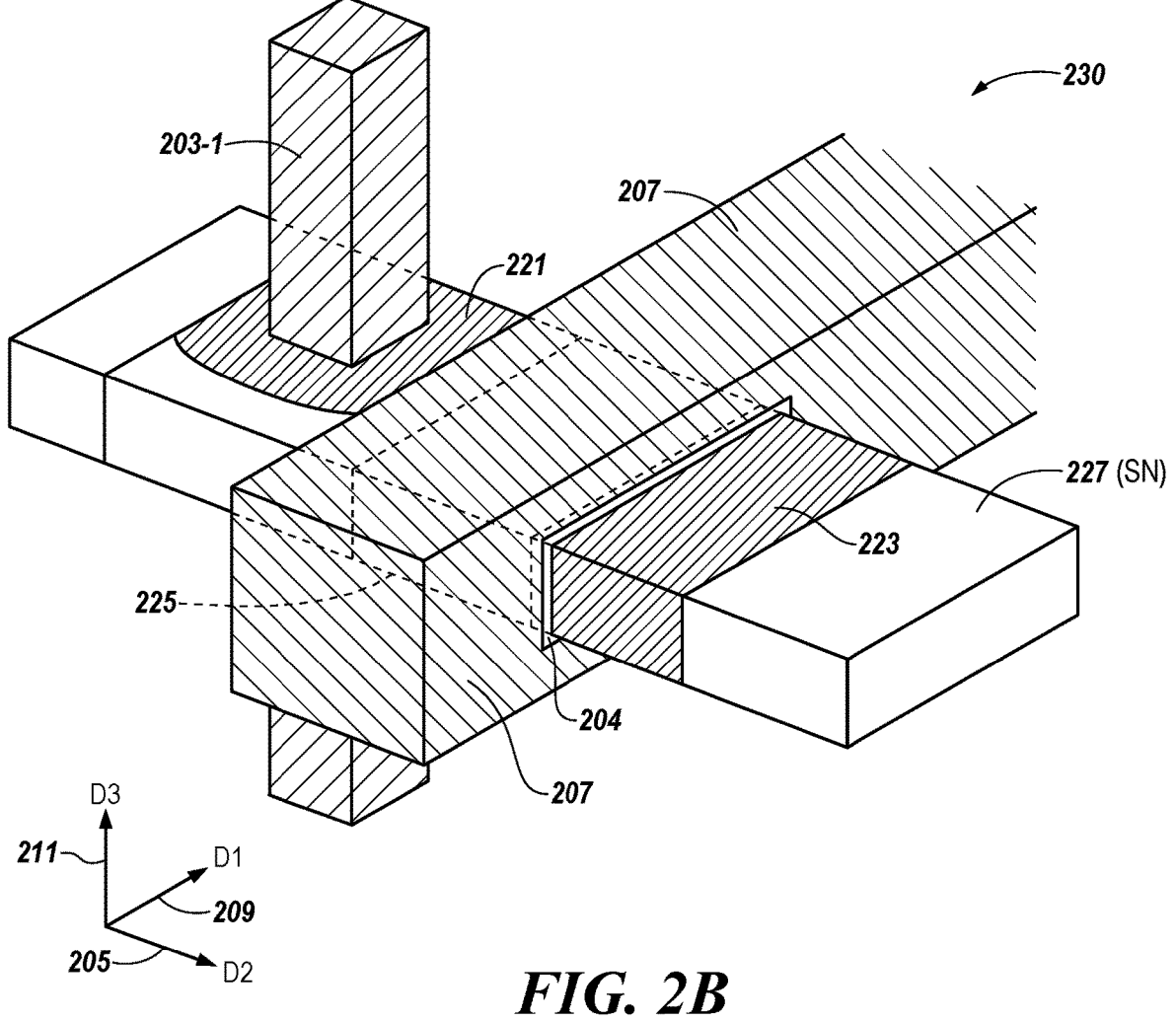

FIG. 2B illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 2B, the first and the second source/drain regions, 221 and 223, may be impurity doped regions to the laterally oriented access devices 230, e.g., transistors. The first and the second source/drain regions, 221 and 223, may be analogous to the first and the second source/drain regions 221 and 223 shown in FIG. 2 and the first and the second source/drain regions 221 and 223 shown in FIG. 2A. The first and the second source/drain regions may be separated by a channel 225 formed in a body of semiconductor material, e.g., body region, of the horizontally oriented access devices 230, e.g., transistors. The first and the second source/drain regions, 221 and 223, may be formed from an n-type or p-type dopant doped in the body region. Embodiments are not so limited.

As shown in the example embodiment of FIG. 2B, a digit line, e.g., 203-1, analogous to the digit lines 103-1, 103-2, . . . , 103-Q in FIG. 1, may be vertically extending in the second direction (D3) 211 adjacent a sidewall of the first source/drain region 221 in the body to the horizontally oriented access devices 230, e.g., transistors horizontally conducting between the first and the second source/drain regions 221 and 223 along the second direction (D2) 205. In this embodiment, the vertically oriented digit line 203-1 is formed symmetrically, in vertical alignment, in electrical contact with the first source/drain region 221. The digit line 203-1 may be formed in contact with an insulator material such that there is no body contact within channel 225.

As shown in the example embodiment of FIG. 2B, the digit line 203-1 may be formed symmetrically within the first source/drain region 221 such that the first source/drain region 221 surrounds the digit line 203-1 all around. The first source/drain region 221 may occupy an upper portion in the body of the laterally oriented access devices 230, e.g., transistors. For example, the first source/drain region 221 may have a bottom surface within the body of the horizontally oriented access device 230 which is located higher, vertically in the second direction (D3) 211, than a bottom surface of the body of the laterally, horizontally oriented access device 230. As such, the laterally, horizontally oriented transistor 230 may have a body portion which is below the first source/drain region 221 and is in contact with the body contact. An insulator material may fill the body contact such that the first source/drain region 221 may not be in electrical contact with channel 225. Further, as shown in the example embodiment of FIG. 2B, an access line, e.g., 207-1, analogous to the access lines 107-1, 107-2, . . . , 107-Q shown in FIG. 1, may disposed all around and coupled to a channel region 225, separated therefrom by a gate dielectric 204.

Figure 3:
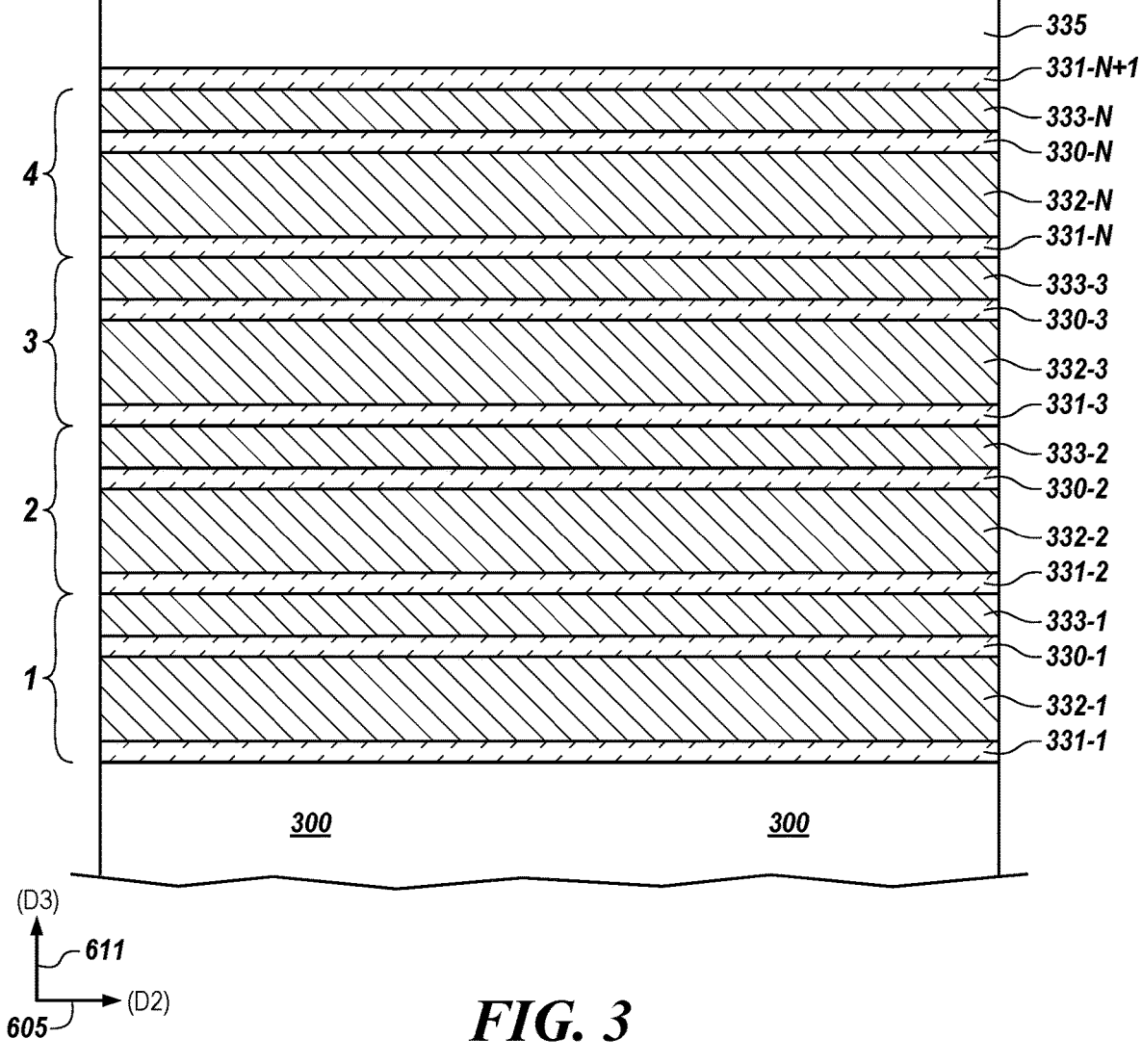
FIG. 3 is a cross-sectional view for forming multiple, alternating epitaxially grown silicon germanium (SiGe) and epitaxially grown, single crystalline silicon (Si), within horizontal access devices in vertical three dimensional (3D)

FIG. 3 is a cross-sectional view, at one stage of a semiconductor fabrication process, for forming epitaxial silicon within horizontal access devices in vertical three dimensional (3D) memory, such as illustrated in FIGS. 1-2, and in accordance with a number of embodiments of the present disclosure.

In the example embodiment shown in the example of FIG. 3, the method comprises epitaxially forming alternating layers of a silicon germanium (SiGe) material, 331-1, 331-2, . . . , 331-N+1 and 330-1, 330-2, . . . , 330-N (collectively referred to as epitaxially grown silicon germanium (SiGe) 331 and 330), and a silicon (Si) material, 332-1, 332-2, . . . , 332-N and 333-1, 333-2, . . . , 333-N (collectively referred to as epitaxially grown, single crystalline silicon (Si) material 332 and 333), in repeating iterations to form a vertical stack 301 on a working surface of a semiconductor substrate 300. In one embodiment, four layers of alternating, varying thickness (t) may be deposited to form a repeating tier to the repeating iterations. For example, the epitaxially grown silicon germanium (SiGe) 330 and 331 can be deposited to have a thickness, e.g., vertical height in the second direction (D3), in a range of five (5) nanometers (nm) to fifteen (15) nm. In one embodiment, the silicon 332 can be deposited to have a thickness (t2), e.g., vertical height, in a range of five (5) nm to sixty (60) nm. Embodiments, however, are not limited to these examples. As shown in FIG. 3, a vertical direction 311 is illustrated as a second direction (D3), e.g., z-direction in an x-y-z coordinate system, analogous to the second direction (D3), among first, second, and second directions, shown in FIGS. 1-2.

In some embodiments, the epitaxially grown silicon germanium (SiGe), 330 and 331, may be an epitaxially grown mix of silicon and germanium. By way of example, and not by way of limitation, the epitaxially grown silicon germanium (SiGe) 330 and 331 may be grown on the substrate material 300. Embodiments are not limited to these examples. The epitaxially grown, single crystalline silicon (Si) material, 332 and 333, may be a low doped, p-type (p–) epitaxially grown, single crystalline silicon (Si) material. The silicon material, 332 and 333, may also be formed by epitaxially growing on the epitaxially grown silicon germanium (SiGe) 330 and 331 material. After the epitaxially grown silicon germanium (SiGe) 330 and 331 has been formed, the silicon (Si) seed of the epitaxially grown silicon germanium (SiGe) material 330 and 331 may be used to epitaxially grown the single crystalline silicon (Si) material 332 and 333. Embodiments, however, are not limited to these examples.

The repeating iterations of alternating epitaxially grown silicon germanium (SiGe), 330 and 331, layers and epitaxially grown, single crystalline silicon (Si) material, 332 and 333, layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a epitaxially grown silicon germanium (SiGe) and a epitaxially grown, single crystalline silicon (Si) material, in repeating iterations to form the vertical stack 301.

The layers may occur in repeating iterations vertically. In the example of FIG. 3, four tiers, numbered 1, 2, 3, and 4, of the repeating iterations are shown. For example, the stack may include: a first epitaxially grown silicon germanium (SiGe) 331-1, a first epitaxially grown, single crystalline silicon (Si) material 332-1, a second epitaxially grown silicon germanium (SiGe) 330-1, a second epitaxially grown, single crystalline silicon (Si) material 333-1 (tier 1), a third SiGe material 331-2, a third epitaxially grown, single crystalline silicon (Si) material 332-2, a fourth epitaxially grown silicon germanium (SiGe) 330-2, a fourth epitaxially grown, single crystalline silicon (Si) material 333-2 (tier 2), etc., in further repeating iterations. Embodiments, however, are not limited to this example and more or fewer repeating iterations may be included.

FIG. 4A illustrates an example method, at one stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 4A illustrates a top down view of a semiconductor structure, at a particular point in time, in a semiconductor fabrication process, according to one or more embodiments. In the example embodiment shown in the example of FIG. 4A, the method comprises using an etchant process to form a plurality of first vertical openings 415, having a first horizontal direction (D1) 409 and a second horizontal direction (D2) 405, through the vertical stack to the substrate. In one example, as shown in FIG. 4A, the plurality of first vertical openings 415 are extending predominantly in the second horizontal direction (D2) 405 and may form elongated vertical, pillar columns 413-1, 413-2, . . . , 413-M (collectively and/or independently referred to as 413), with sidewalls 414 in the vertical stack. The plurality of first vertical openings 400 may be formed using photolithographic techniques to pattern a photolithographic mask 435, e.g., to form a hard mask (HM), on the vertical stack prior to etching the plurality of first vertical openings 415. Similar semiconductor process techniques may be used at other points of the semiconductor fabrication process described herein.

The openings 415 may be filled with a dielectric material 439. In one example, a spin on dielectric process may be used to fill the openings 415. In one embodiment, the dielectric material 439 may be an oxide material. However, embodiments are not so limited.

FIG. 4B is a cross sectional view, taken along cut-line A-A' in FIG. 4A, showing another view of the semiconductor structure at a particular time in the semiconductor fabrication process. The cross sectional view shown in FIG. 4B shows the repeating iterations of alternating layers of a epitaxially grown silicon germanium (SiGe) 430 and a epitaxially grown, single crystalline silicon (Si) material 432 on a semiconductor substrate 400 to form the vertical stack, e.g. 401 as shown in FIG. 4.

As shown in FIG. 4B, a plurality of first vertical openings may be formed through the layers within the vertically stacked memory cells to expose vertical sidewalls in the vertical stack and form elongated vertical pillar columns 413 and then filled with a first dielectric material 439. The first vertical openings may be formed through the repeating iterations of the epitaxially grown silicon germanium (SiGe) 430 and 431, and the epitaxially grown, single crystalline silicon (Si) material 432 and 433. As such, the first vertical openings may be formed through a first epitaxially grown silicon germanium (SiGe) 431-1, a first epitaxially grown, single crystalline silicon (Si) material 432-1, a second epitaxially grown silicon germanium (SiGe) 430-1, a second epitaxially grown, single crystalline silicon (Si) material 433-1 (tier 1), a third SiGe material 431-2, a third epitaxially grown, single crystalline silicon (Si) material 432-2 (as part of tier 2), etc. Embodiments, however, are not limited to the vertical opening(s) shown in FIG. 4B. Multiple vertical openings may be formed through the layers of materials. The first vertical openings may be formed to expose vertical sidewalls in the vertical stack. The first vertical openings may extend in a second horizontal direction (D2) 405 to form elongated vertical, pillar columns with first vertical sidewalls in the vertical stack and then filled with second dielectric 439.

As shown in FIG. 4B, a first dielectric material 439, such as an oxide or other suitable spin on dielectric (SOD), may be deposited in the first vertical openings, using a process such as CVD, to fill the first vertical openings. First dielectric material 439 may also be formed from a silicon nitride ($Si_3N_4$) material. In another example, the first dielectric material 439 may include silicon oxy-nitride ($SiO_xN_y$), and/or combinations thereof. Embodiments are not limited to these examples. The plurality of first vertical openings may be formed using photolithographic techniques to pattern a photolithographic mask 435, e.g., to form a hard mask (HM), on the vertical stack prior to etching the plurality of first vertical openings. In one embodiment, hard mask 435 may be deposited over a epitaxially grown silicon germanium (SiGe) 430. Similar semiconductor process techniques may be used at other points of the semiconductor fabrication process described herein.

Figure 5A:
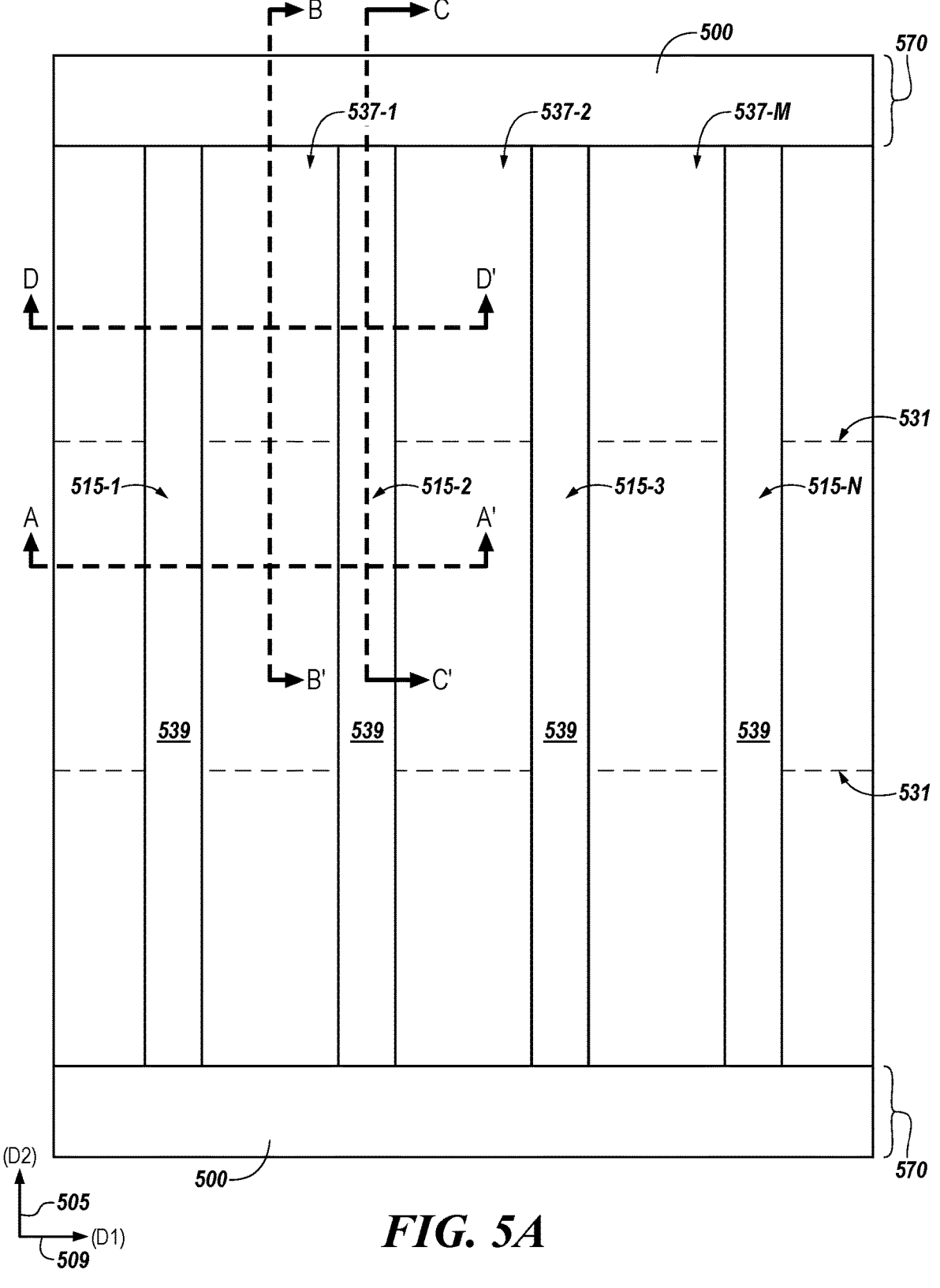

FIG. 5A illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 5A illustrates a top down view of a semiconductor structure, at a particular point in time, in a semiconductor fabrication process, according to one or more embodiments.

In the example embodiment shown in FIG. 5A, the method comprises using a photolithographic mask to pattern and form a second vertical opening 570 through the vertical stack and extending predominantly in the first horizontal direction to expose sidewalls adjacent a second region of the epitaxially grown silicon germanium (SiGe) and silicon (Si). The second vertical opening 570 may be etched through the hard mask 535 adjacent to where horizontal access devices are to be formed. And, multiple second vertical opening 570 may be formed through the layers of epitaxially grown silicon germanium (SiGe) and silicon (Si) using photolithographic techniques to pattern the hard mask 535 and expose those particular areas of the vertical stack.

Figure 5B:
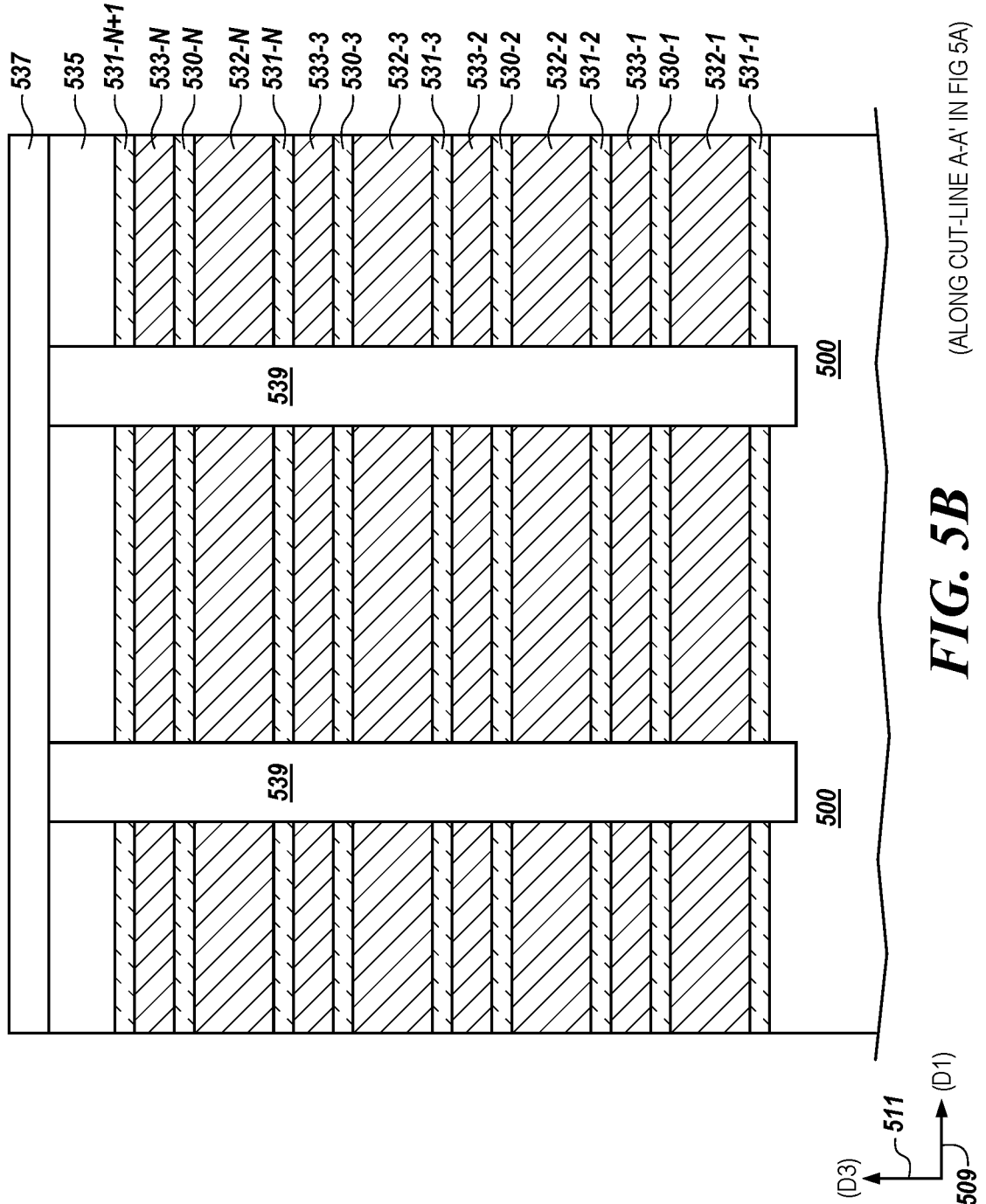

FIG. 5B is a cross sectional view, taken along cut-line A-A' in FIG. 5A, showing another view of the semiconductor structure at this particular time in the semiconductor fabrication process. The cross sectional view shown in FIG. 5B shows the repeating iterations of multiple, alternating layers of the epitaxially grown silicon germanium (SiGe) 530 and 531 and the epitaxially grown, single crystalline silicon (Si) material 532 and 533, on a semiconductor substrate 500. In the example embodiment described herein four (4) alternating layers, 531, 532, 530, and 533, are shown making up a tier, e.g., tier 1 in FIG. 3, of the vertical stack. Embodiments, however, are not limited to this example.

As shown in FIG. 5B, a plurality of first vertical openings may have already been formed through the layers within the vertically stacked memory cells to expose first vertical sidewalls in the vertical stack and filled with a first dielectric material 539. The first vertical openings were formed through the repeating iterations of the epitaxially grown silicon germanium (SiGe) 530 and 531 and the epitaxially grown, single crystalline silicon (Si) material 532 and 533.

Figure 5C:
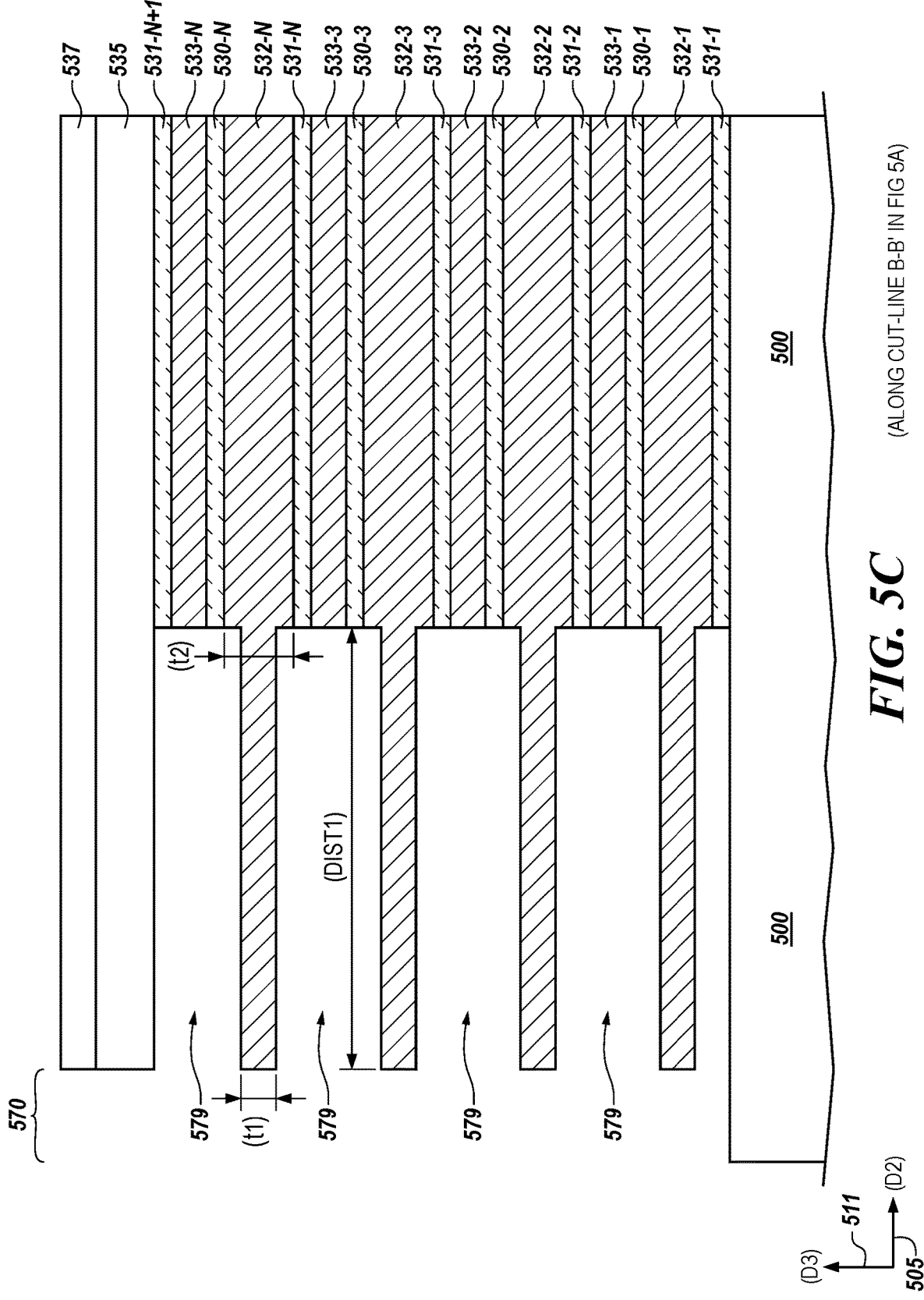

FIG. 5C is another cross-sectional view, at this particular stage of the semiconductor fabrication process, for forming epitaxial silicon within horizontal access devices in vertical three dimensional (3D) memory, such as illustrated in FIGS. 1-2, and in accordance with a number of embodiments of the present disclosure. FIG. 5C illustrates a cross sectional view, taken along cut-line B-B' in FIG. 5A.

As noted above, FIG. 5C illustrates the method comprises forming second vertical openings 570 through the vertical stack and extending predominantly in the first horizontal direction 509 to expose sidewalls adjacent a second region of the epitaxially grown silicon germanium (SiGe) 530 and 531 and the epitaxially grown, single crystalline silicon (Si) material 532 and 533. Forming the second vertical openings 570 through the vertical stack comprises forming the second vertical openings 570 in vertical alignment with a location to form the horizontal access devices.

As illustrated in FIG. 5C, The cross sectional view shown in FIG. 5C is illustrated extending in the second horizontal direction (D2) 505, left and right along the plane of the drawing sheet, along an axis of the repeating iterations of alternating layers of the epitaxially grown silicon germanium (SiGe) 530 and 531 and the epitaxially grown, single crystalline silicon (Si) material 532 and 533.

In the example embodiment of FIG. 5C the epitaxially grown silicon germanium (SiGe) 530 and 531, and at least one sacrificial layer of the epitaxially grown, single crystalline silicon (Si) material 533, is selectively etched to form a plurality of first horizontal openings 579 extending a first distance (DIST 1) from the second vertical openings 570. For example, an etchant may be flowed into the second vertical openings 570 to selectively etch the epitaxially grown silicon germanium (SiGe) material 530 and 531, and at least one sacrificial layer of the epitaxially grown, single crystalline silicon (Si) material 533, and a portion of the epitaxially grown silicon (Si) material 532. The etchant may selectively remove portions of all iterations of the epitaxially grown silicon germanium (SiGe) 530 and 531, and at least one sacrificial layer of the epitaxially grown, single crystalline silicon (Si) material 533, and a portion of the epitaxially grown silicon (Si) 532 within the stack according to a timed exhume process. As such, the etchant may primarily be selective to the epitaxially grown Si material 532 and selectively remove the epitaxially grown silicon germanium (SiGe) 530 and 531. A second etchant may subsequently be flowed into the second vertical opening 570 to perform a non-selective, isotropic, timed exhume etch of the epitaxially grown, single crystalline Si material 532 and 533 to remove all of the at least one sacrificial layer of the epitaxially grown, single crystalline silicon (Si) material 533, and a portion of the epitaxially grown silicon (Si) 532 a first distance (DIST 1) from the second vertical opening 570 within the stack.

The selective etchant process may occur in multiple steps to protect the structure and stabilize epitaxially grown, single crystalline silicon (Si) material 532. The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a plasma etch chemistry comprising fluorine radicals (F) generated from nitrogen trifluoride $(NF_3)$ or carbon tetrafluoride $(CF_4)$ may be utilized to selectively etch the epitaxially grown silicon germanium (SiGe) 530 and 531, and at least one sacrificial layer of the epitaxially grown, single crystalline silicon (Si) material 533, and a portion of the epitaxially grown silicon (Si) 532. Alternatively, or in addition, a selective etch to remove the epitaxially grown silicon germanium (SiGe) 530 and 531, and at least one sacrificial layer of the epitaxially grown, single crystalline silicon (Si) material 533, and a portion of the epitaxially grown silicon (Si) 532 may comprise a selective etch chemistry of water, hydrogen peroxide $(H_2O_2)$ and hydrogen fluoride (HF) and/or dissolving the epitaxially grown silicon germanium (SiGe) 730 using a selective solvent, among other possible etch chemistries or solvents.

Thus, the selective and non-selective etchant processes may be controlled by controlling time, composition of etchant gas, and etch rate of a reactant gas flowed into the second vertical openings 570, e.g., rate, concentration, temperature, pressure, and time parameters.

The first selective etch may be isotropic, but selective primarily to the epitaxially grown silicon (Si) material 532 and 533, removing only the epitaxially grown silicon germanium (SiGe) 530 and 531. The second non-selective, isotropic etch may be subsequent to the first to remove the at least one sacrificial layer of the epitaxially grown, single crystalline silicon (Si) material 533, and a portion of the epitaxially grown silicon (Si) 532 in the timed exhume process. In one or more embodiments the selective etch may be performed according to a two-step exhumation process to first selectively remove the epitaxially grown silicon germanium (SiGe) 530 and 531 followed by a non-selective removal of the at least one sacrificial layer of the epitaxially grown, single crystalline silicon (Si) material 533, and a portion of the epitaxially grown silicon (Si) 532 to meet device target specifications. Thus, in one example embodiment, the first selective etchant process may remove substantially all of the epitaxially grown silicon germanium (SiGe) 530 and 531 a first distance (DIST 1) from the second vertical opening 570 within the stack. And, the second non-selective etchant process may fully remove the at least one sacrificial layer of the epitaxially grown, single crystalline silicon (Si) material 533, and a portion of the epitaxially grown silicon (Si) 532, etching horizontally a first distance (DIST 1) 576 from the second vertical openings 570 according to the timed exhume process. Embodiments, however, are not limited to this example.

Figure 5D:
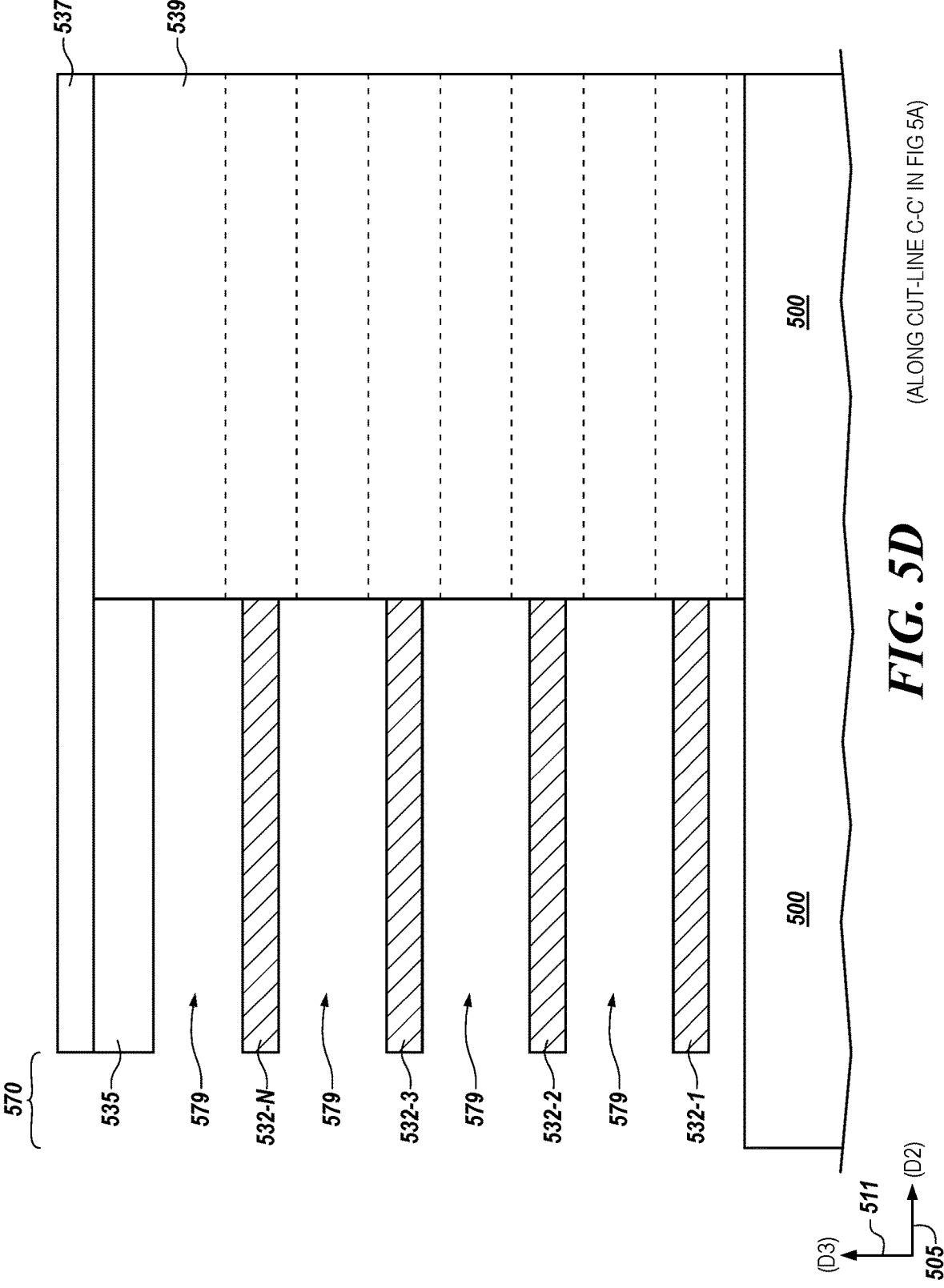
Figure 5E:
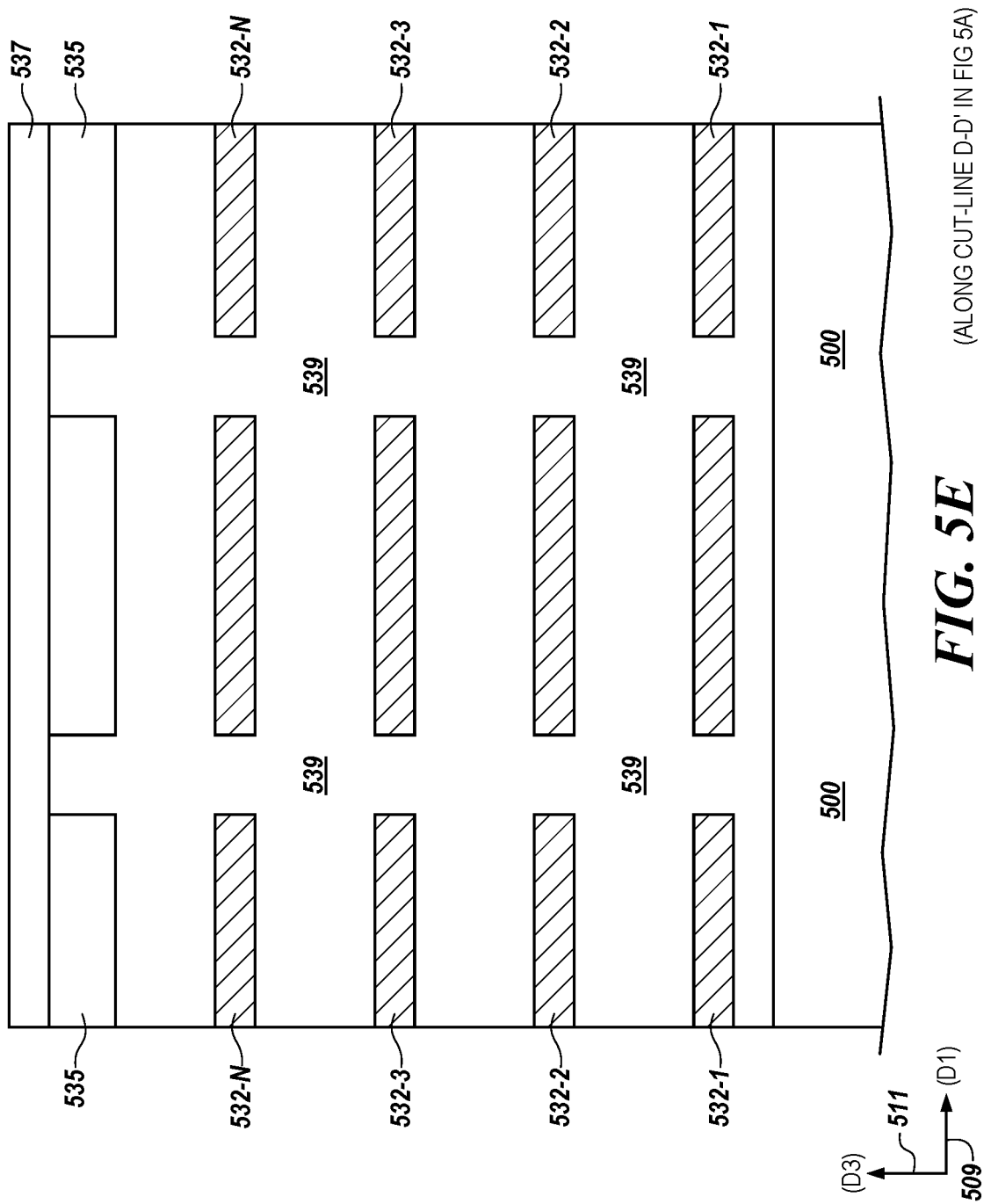

As further shown in FIG. 5C, a controlled oxide lateral punch through the plurality of first vertical openings (415 in FIG. 4A), between the access device regions and the first horizontal openings 579, to form continuous horizontal openings, seen left to right along the plane of the drawing sheet and extending in the first horizontal direction (D1) 509 in FIG. 5E, using a timed exhume process, e.g., selectively etching the first dielectric material 539. In some embodiments, the lateral punch may be a controlled etch process selective to the remaining, thinned epitaxially grown single crystalline silicon (Si) material 532 between separated epitaxially grown, remaining single crystalline silicon (Si) material 532 in the access device regions. In one embodiment, the remaining, thinned epitaxially grown single crystalline Si material 532 has a thickness (t1), from an original thickness (t2), in a range of approximately 50 to 250 angstroms (Å). In one embodiment, the original thickness (t2) is in a range of approximately 300 to 600 angstroms (Å).

FIG. 5D illustrates a cross sectional view, taken along cut-line C-C' in FIG. 5A, showing another view of the semiconductor structure at this particular point in one example semiconductor fabrication process of an embodiment of the present disclosure. The cross sectional view shown in FIG. 5D is illustrated extending in the second horizontal direction (D2) 505, left and right in the plane of the drawing sheet, along an axis of the repeating iterations of multiple, alternating layers of the etched and removed epitaxially grown silicon germanium (SiGe) 530 and 531, and at least one sacrificial layer of the epitaxially grown, single crystalline silicon (Si) material 533, and a portion of the epitaxially grown silicon (Si) 532 forming second horizontal openings 579, and remaining epitaxially grown, single crystalline silicon (Si) material 532 having a thickness (t1) reduced from an original thickness, shown as (t2) in FIG. 5C.

At the left end of the drawing sheet is shown the repeating iterations of alternating layers of the etched epitaxially grown silicon germanium (SiGe) 530 and 531, and at least one sacrificial layer of the epitaxially grown, single crystalline silicon (Si) material 533, and a portion of the epitaxially grown silicon (Si) 532 forming second horizontal openings 579, and the remaining, thinned epitaxially grown, single crystalline silicon (Si) material 532. At the left end of the drawing sheet is shown the repeating iterations of alternating layers of the etched epitaxially grown silicon (SiGe), and etched areas where the first dielectric material has been removed to form continuous horizontal openings 543 in a first direction (D1) 509, separating the layers of remaining, thinned epitaxially grown, single crystalline silicon (Si) material 532. Second vertical opening 570 is shown adjacent a region of the now continuous horizontal openings 543. At the right hand of the drawing sheet, the first dielectric material 539 may be seen, separating access device and storage node regions in the first direction (D1) 509. Dashed lines indicate the presence of the remaining un-etched, un-removed epitaxially grown silicon germanium (SiGe) 530 and 531, and full original deposition thicknesses (t2) of the epitaxially grown, single crystalline silicon (Si) material 532 and 532 and the first dielectric material 539, set into the plane of the drawing sheet, in the cross sectional view, taken along cut-line C-C' in FIG. 5A.

FIG. 5E illustrates a cross sectional view, taken along cut-line D-D' in FIG. 5A, showing another view of the semiconductor structure at this particular point in one example semiconductor fabrication process of an embodiment of the present disclosure. The cross sectional view shown in FIG. 5E is illustrated, right to left in the plane of the drawing sheet, extending in the first direction (D1) 509 along a cross section of the repeating iterations of alternating layers of remaining, thinned epitaxially grown, single crystalline silicon (Si) material 532, extending out of the plane of the drawing sheet from the first dielectric material 539. Arrow 543 illustrates the continuous horizontal openings with the first dielectric material 539 in the background into the plane of the drawing sheet. A hard mask 535 may be covered by second hard mask 537.

Figure 6A:
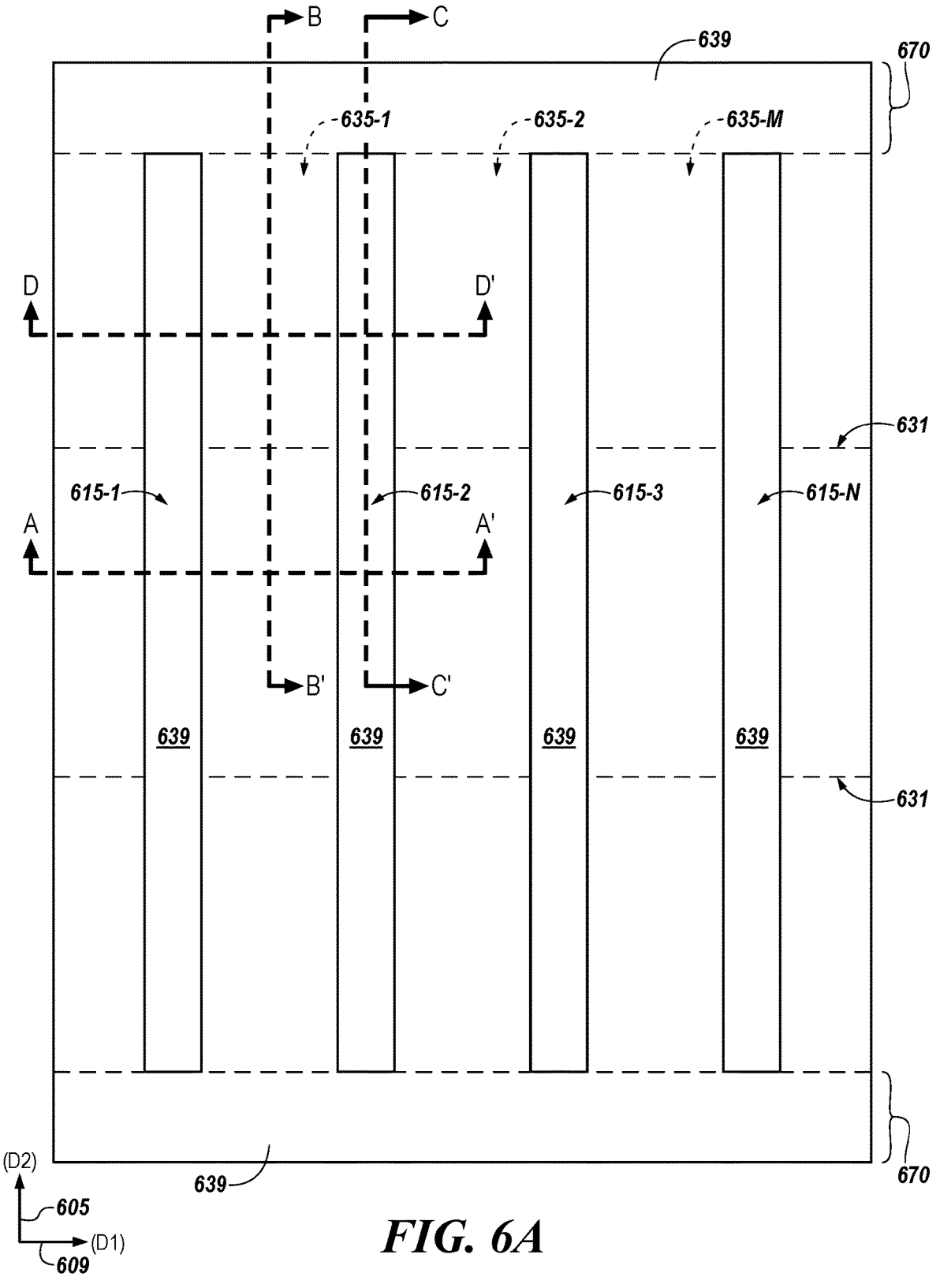

FIG. 6A illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 6A illustrates a top down view of a semiconductor structure, at a particular point in time, in a semiconductor fabrication process, according to one or more embodiments.

Figure 6B:
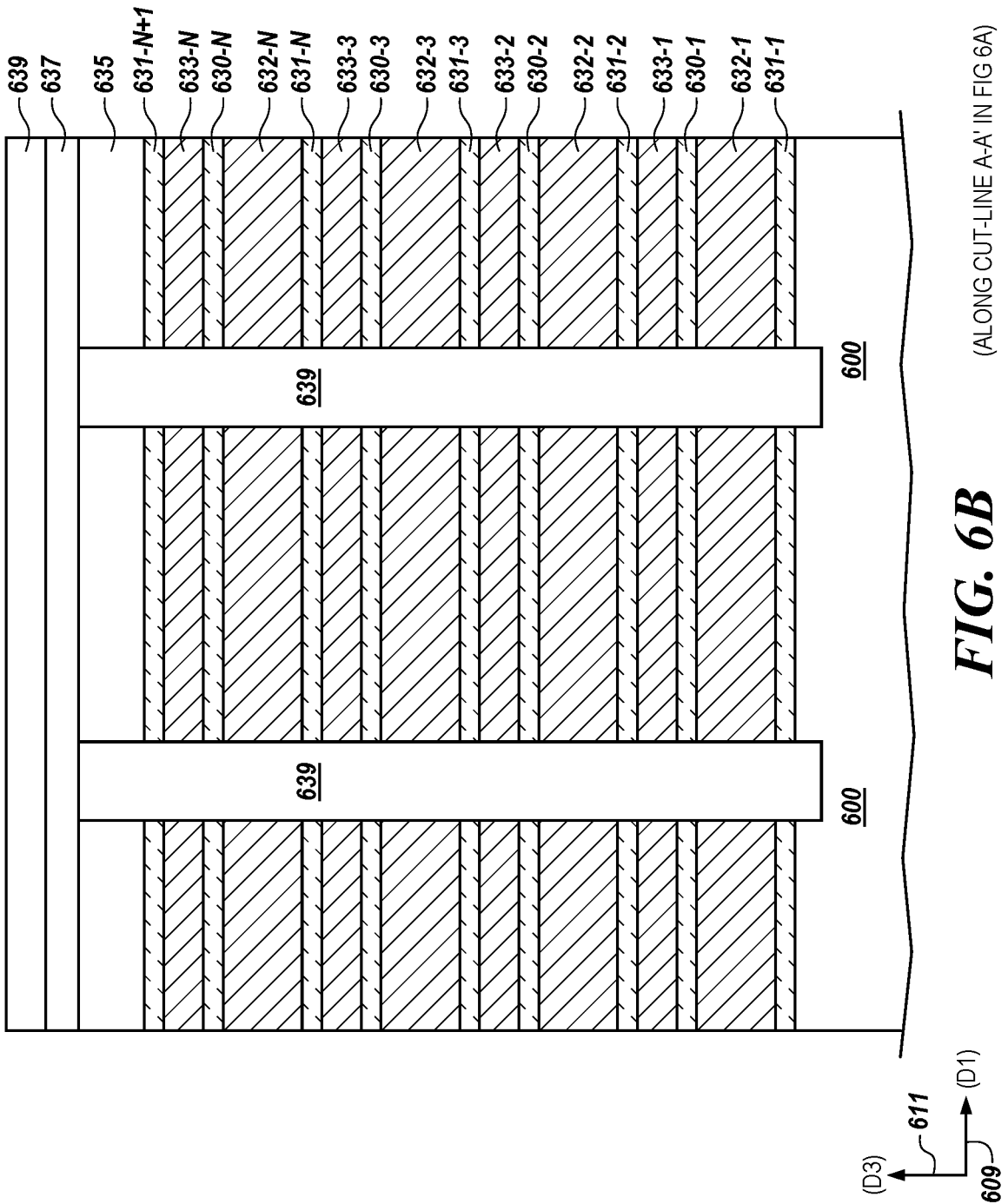

In the example embodiment of FIG. 6A, the method comprises a newly deposited second dielectric material 633 deposited through the second vertical openings (570 in FIG. 5C) on exposed surfaces of the remaining, thinned epitaxially grown, single crystalline silicon (Si) material 632 within the first horizontal openings (579 in FIG. 5C). A portion of the unetched first dielectric material 639 may be seen in FIG. 6B FIG. 6B is a cross sectional view, taken along cut-line A-A' in FIG. 6A, showing another view of the semiconductor structure at a particular time in the semiconductor fabrication process. The cross sectional view shown in FIG. 6B shows the repeating iterations of multiple, alternating layers of epitaxially grown silicon germanium (SiGe) 630 and 631 and the epitaxially grown, single crystalline silicon (Si) material 632 and 633, on a semiconductor substrate 600.

As shown in FIG. 6B, a plurality of first vertical openings have already been formed through the layers within the vertically stacked memory cells to expose first vertical sidewalls (514 in FIG. 5A) in the vertical stack and filled with the first dielectric material 639. In FIGS. 4A-4B, the first vertical openings were formed through the repeating iterations of the epitaxially grown silicon germanium (SiGe) 630 and 631 and the epitaxially grown, single crystalline silicon (Si) material 632 and 633.

As shown in FIG. 6B, a first dielectric material 639, such as an oxide or other suitable spin on dielectric (SOD), is shown in the first vertical openings (515 in FIG. 5A), filling the first vertical openings. A hard mask 635 is shown over the vertical stack having a second dielectric material 637 and third dielectric material 639 deposited thereon. In some embodiments, as shown in the cross-sectional view of FIG. 6B, the third dielectric material 639 may be the a same type dielectric material as used for the first dielectric material 639. Embodiments, however, are not so limited.

Figure 6C:
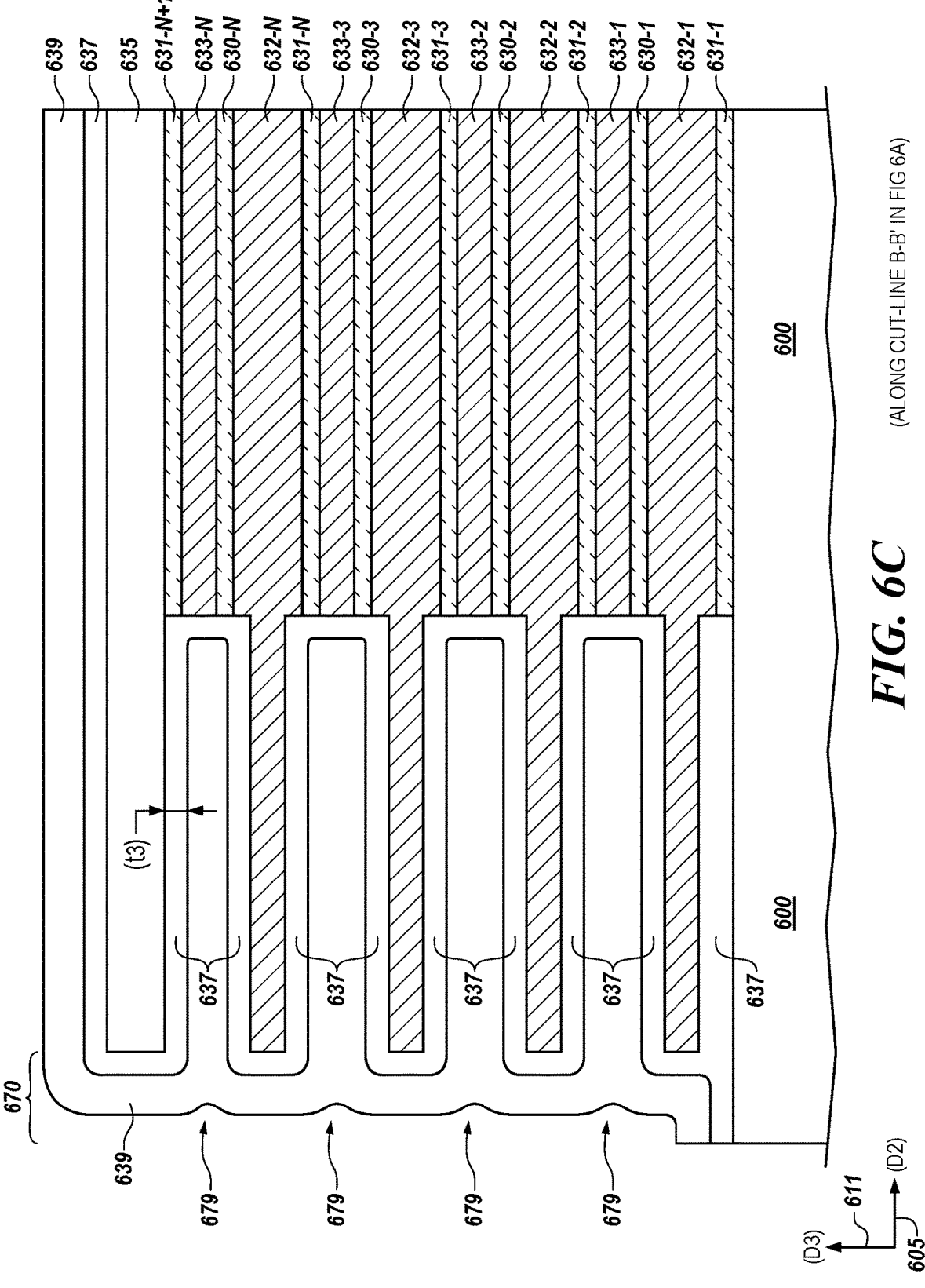

FIG. 6C is a cross-sectional view, taken along cut-line B-B' in FIG. 6A, showing another view of the semiconductor structure at this particular point in one example semiconductor fabrication process for forming single crystalline epitaxial silicon within horizontal access devices in vertical three dimensional (3D) memory, such as illustrated in FIGS. 1-2, and in accordance with a number of embodiments of the present disclosure.

The epitaxially grown silicon germanium (SiGe) 630 and 631 and sacrificial layer of epitaxially grown silicon (Si) 633 has already been selectively etched isotropically in the second direction (D2) 605, a distance in a timed exhume (DIST 1 in FIG. 6C), to form a plurality of first horizontal openings 679 in the first region separating layers of the remaining, thinned, epitaxially grown single crystalline (Si) material 632. A second dielectric material 637 is conformally deposited on exposed surfaces of the remaining, thinned, epitaxially grown single crystalline (Si) material 632 in the first horizontal openings 679. The second dielectric material 637 may be deposited fully upon exposed surfaces in the plurality of first horizontal openings 679 to provide a first support, bridge-like structure to the remaining, thinned, epitaxially grown single crystalline (Si) material 632. In one embodiment, the second dielectric material is deposited using an atomic layer deposition (ALD) process. The second dielectric material 637 may serve as a liner around the plurality of first horizontal openings 679. The second dielectric material 637 may be flowed into the second vertical opening 670 and first horizontal openings 679, from where sacrificial epitaxially grown silicon germanium (SiGe) material layers 630 and 631 (in FIG. 6C) and at least one, thinner sacrificial epitaxially grown single crystalline (Si) material layer (633 in FIG. 6C) was removed, to cover exposed surfaces of the remaining, thinned, epitaxially grown, single crystalline silicon (Si) material 632 in order to provide support structure to the remaining, thinned, epitaxially grown single crystalline (Si) material 632.

In one embodiment, the second dielectric material 637 may comprise a nitride material. In another embodiment, second dielectric material 637 may comprise a silicon nitride ($Si_3N_4$) material (also referred to herein as "SiN"). In another embodiment the second dielectric material 637 may include silicon dioxide ($SiO_2$) material. In another embodiment the second dielectric material 637 may comprise a silicon oxy-carbide (SiOxCy) material, and/or combinations thereof. Embodiments are not limited to these examples.

In one embodiment, the second dielectric material 637 may be conformally deposited all around exposed surfaces in the plurality of first horizontal openings to have a thickness (t3) of approximately 20 to 80 angstroms (Å).

As further shown in FIG. 6C, a third dielectric material 639, e.g., oxide material, may be conformally deposited on exposed surfaces of the second dielectric material 637. The third dielectric material 639 may be deposited fully upon exposed surfaces of the second dielectric material to fill the plurality of first horizontal openings 679, and at least partially the second vertical opening 670, to further provide a second support, bridge-like structure to the remaining, thinned, epitaxially grown single crystalline (Si) material 632. In some embodiments, as shown in FIG. 6C, the third dielectric material 639 may be a same dielectric material as the first dielectric material 639, shown in FIG. 6B and may further serve as a liner around the plurality of first horizontal openings 679. The third dielectric material 639 may be flowed into the second vertical opening 670 to cover exposed surfaces of the second dielectric material 637 thus supporting the remaining, thinned, epitaxially grown, single crystalline silicon (Si) material 632 from where sacrificial epitaxially grown silicon germanium (SiGe) material layers 630 and 631 and at least one, thinner sacrificial epitaxially grown single crystalline (Si) material layer 633 was removed to form the plurality of first horizontal openings 679 within the stack.

Figure 6D:
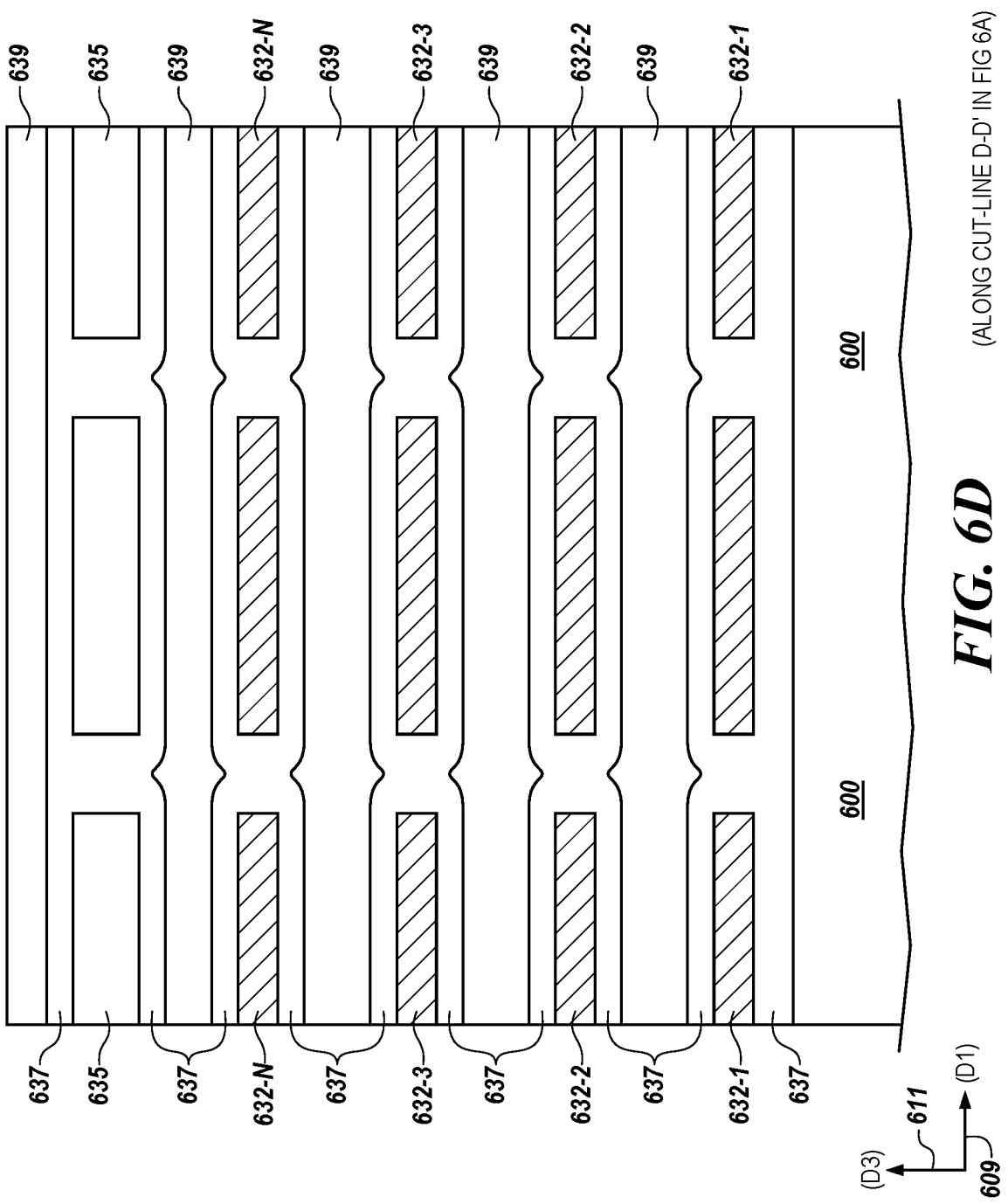

FIG. 6D illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6D is illustrated, right to left in the plane of the drawing sheet, extending in the second direction (D2) 605 along a cross section of the repeating iterations of alternating layers of alternating layers of remaining, thinned, epitaxially grown, single crystalline silicon (Si) material 632, surrounded by second dielectric material 637 and spaced between layers of the vertical stack by the third dielectric material 639. A hard mask 635 may be covered by second dielectric material 637 and the third dielectric material 639. Thus, the third dielectric material 639 may also fill the spaces between the second dielectric materials 637 and the cross section of repeating iterations of alternating layers of remaining, thinned epitaxially grown, single crystalline silicon (Si) material 632.

FIG. 7 illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. As will be seen in FIG. 7, a timed selective etch process is performed, selectively etching the second dielectric material 737 a second distance (DIST 2) from the second vertical openings 770.

FIG. 7 illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7 shows the repeating iterations of alternating layers of the epitaxially grown silicon germanium (SiGe) 730 and 731 and the remaining, thinned epitaxially grown, single crystalline silicon (Si) material 732 (and un-etched, un-thinned epitaxially grown, single crystalline silicon (Si) material 732 that was not removed in the timed exhume described in FIG. 5C) on a semiconductor substrate 700.

The cross sectional view shown in FIG. 7 is illustrated extending in the second horizontal direction (D2) 705, left and right along the plane of the drawing sheet, along an axis of the repeating iterations of alternating layers of the epitaxially grown silicon germanium (SiGe) 730 and 731 and the epitaxially grown, single crystalline silicon (Si) material 732 and 733. In the example embodiment of FIG. 7, the second dielectric material 737 is selectively etched a second distance (DIST 2) 783 from the second vertical openings 770. In some examples, the second dielectric material 737 may be etched back a second distance (DIST 2) 783 in a timed selective etch, exhume process. Second distance 783 is the distance from the second vertical openings 770 to a remaining, unetched portion of the second dielectric material 737. In some embodiments, the second dielectric material 737 is etched back from the second vertical openings 770 a second distance (DIST 2) in a range of approximately twenty-five (25) to seventy-five (75) nanometers (nm). The second dielectric material 737 may be selectively etched, being selective to the remaining, thinned epitaxially grown, single crystalline silicon (Si) material 732 and only partially thinning the third dielectric material 739, thus leaving the epitaxially grown, single crystalline silicon (Si) material 732 and portions of the third dielectric material 739 intact. As shown further in FIG. 7, a portion of the third dielectric material 739 has been removed with an additional selective etch of the second dielectric material 737 in the first horizontal openings (679 in FIG. 6C)

Further, as shown in FIG. 7 a gate dielectric material 742 may be formed on exposed surfaces of the remaining, thinned, epitaxially grown, single crystalline silicon (Si) material 732 to form horizontal access devices. In some embodiments the gate dielectric material may be an oxide material 742. The gate dielectric material 742 may be conformally deposited fully around every surface of the remaining, thinned, epitaxially grown, single crystalline silicon (Si) material 732 to form gate all around (GAA) gate structures, at the channel regions of the access devices. The gate dielectric material 742 may be deposited on exposed surfaces of the remaining, thinned, epitaxially grown, single crystalline silicon (Si) material 732 using an atomic layer deposition. In some examples, an oxide material 742 may be deposited over the exposed surfaces of the epitaxially grown, single crystalline silicon (Si) material 732. In some embodiments, the gate dielectric material 742 may be a thermally grown oxide material 742 on exposed surfaces of the remaining, thinned, exposed epitaxially grown, single crystalline silicon (Si) material 732. And, a thermal oxidation process may be used to densify the ALD the oxide material 742. The thermal oxidation process may involve forming oxide material 742 from a hybrid oxide material. The hybrid oxide material may combine a low temperature oxide material and a high temperature oxide material.

As shown in FIG. 7, a first conductive material 777 may be deposited on a gate dielectric material 742 to form gates. The first conductive material 777 may be deposited around the remaining, thinned, exposed epitaxially grown, single crystalline silicon (Si) material 732 such that the first conductive material 777 may have a top portion above the epitaxially grown, single crystalline silicon (Si) material 732 and a bottom portion below the epitaxially grown, single crystalline silicon (Si) material to form gate all around (GAA) gate structures, at the channel regions of the access devices. The gates opposing the channel regions provide a subthreshold voltage (sub-Vt) slope in a range of approximately 45 to 100 millivolts per decade (mV/dec). The first conductive material 777 may be conformally deposited into second vertical openings 770 and fill the continuous horizontal openings 743 up to the unetched portions of the third dielectric material 739 and the second dielectric material 737. The first conductive material 777 may be conformally deposited using a chemical vapor deposition (CVD) process, plasma enhanced CVD (PECVD), atomic layer deposition (ALD), or other suitable deposition process.

In some embodiments, the first conductive material, 777, may comprise one or more of a doped semiconductor material, e.g., doped silicon, doped germanium, etc. In some embodiments, the first conductive material 777 may comprise a conductive metal nitride material, e.g., titanium nitride, tantalum nitride, etc. In some embodiments, the first conductive material may comprise a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The first conductive material 777 together with the gate dielectric material 742 may form horizontally oriented access lines (which also may be referred to a wordlines) opposing channel regions of the epitaxially grown, single crystalline silicon (Si) material.

FIG. 8A illustrates a cross sectional view, taken along cut-line B-B' in FIG. 6A, showing another view of the semiconductor structure at another particular point in one example semiconductor fabrication process of an embodiment of the present disclosure. The cross sectional view shown in FIG. 8A is illustrated extending in the second horizontal direction (D2) 805, left and right along the plane of the drawing sheet, along an axis of the repeating iterations of alternating layers of the epitaxially grown silicon germanium (SiGe) 830 and 831 and the epitaxially grown, single crystalline silicon (Si) material 832 and 833.

A first conductive material 877 was deposited on the gate dielectric material 842 and formed around the remaining, thinned, epitaxially grown, single crystalline silicon (Si) material 832, and is here recessed back to form gate all around (GAA) structures opposing only channel regions of the epitaxially grown, single crystalline silicon (Si) material 832. The first conductive material 877, formed on the gate dielectric material 842, may be recessed and etched away from the second vertical opening 870. In some embodiments, the first conductive material 877 may be etched using an atomic layer etching (ALE) process. In some embodiments, the first conductive material 877 may be etched using an isotropic etch process. The first conductive material 877 may be selectively etched leaving the gate dielectric material 842 covering the remaining, thinned epitaxially grown, single crystalline silicon (Si) material 832 and the third dielectric material 839 intact. The first conductive material 877 may be selectively etched in the second direction, in the continuous second horizontal openings (described above), a second distance (DIST 3) in a range of twenty (20) to fifty (50) nanometers (nm) back from the second vertical opening 870. The first conductive material 877 may be selectively etched around the remaining, thinned epitaxially grown, single crystalline silicon (Si) material 832 and back into the continuous horizontal openings (described above) extending in the first horizontal direction 809. An ILD fill material 867 may be deposited into first vertical openings 870 and filling the continuous second horizontal openings up to the unetched portions of the gate dielectric material 842, the un-etched third dielectric material 839, and the first conductive material 877. The ILD fill material 867 may be conformally deposited using a chemical vapor deposition (CVD) process, plasma enhanced CVD (PECVD), atomic layer deposition (ALD), or other suitable deposition process.

FIG. 8B illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 8B is illustrated extending in the first horizontal direction (D1) 809, left and right in the plane of the drawing sheet, along an axis perpendicular to the repeating iterations of multiple, alternating layers of the etched first conductive material 877, gate dielectric 842, and epitaxially grown, single crystalline silicon (Si) material 832.

In FIG. 8B, first dielectric material 839 is shown spacing the arrays of vertically stacked memory cells, extending left and right along a first horizontal direction (D1) 809 in the plane of the drawings sheet, for a three dimensional array of vertically oriented memory cells. Extending into and out from the plane of the drawing sheet is shown the repeating iterations of alternating layers of the remaining, thinned epitaxially grown, single crystalline silicon (Si) material 832 at the channel regions covered by the gate dielectric material 842, and covered in the continuous second horizontal openings (described above) in the first direction (D1) 809 by the first conductive material 877. The first conductive material 877, formed on the gate dielectric material 842, was etched away from the second vertical opening 870. The first conductive material 877, formed on the gate dielectric material 842, was recessed back in the continuous horizontal openings extending in the second horizontal direction 805.

The first conductive material 877 is deposited on the gate dielectric material 842 and formed around the epitaxially grown, single crystalline silicon (Si) material 832 to form gate all around (GAA) structure opposing channel regions of the epitaxially grown, single crystalline silicon (Si) material 32 in the access device regions. In FIG. 8B, the first conductive material, 877 is shown filling in the space in the second horizontal openings (described above) left by the etched first dielectric material 839.

FIG. 9A illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the method comprises using a photolithographic process to pattern the photolithographic mask 938 to form third vertical opening 951 adjacent a second region of the repeating iterations of alternating layers of the epitaxially grown silicon germanium (SiGe) 930 and 931 and the epitaxially grown, single crystalline silicon (Si) material 932 and 933 to expose second vertical sidewalls in the stack (e.g., stack shown in FIG. 4). In FIGS. 9A-9C the epitaxially grown, single crystalline silicon (Si) material 932 and 933 is selectively etched in the second horizontal direction to form a plurality of second horizontal openings 979 (shown in FIG. 9C), in which to form storage nodes, in the second region, e.g., storage node regions in the 3D vertical array of memory cells. Once the epitaxially grown, single crystalline silicon (Si) material 932 and 933 has been removed by selectively etching, second source/drain regions 945, adjacent channel regions for the horizontal access devices, may be formed in a side surface of the epitaxially grown, single crystalline silicon (Si) material 932 through gas phase doping from the second horizontal openings 979.

FIG. 9B illustrates a cross sectional view, taken along cut-line A-A' in FIG. 9A in the storage node regions, showing another view of the semiconductor structure at this particular point in one example semiconductor fabrication process of an embodiment of the present disclosure. The cross sectional view shown in FIG. 9B is away from the plurality of separate, horizontal access lines, 977 and shows bridged, repeating iterations of multiple, alternating layers of epitaxially grown silicon germanium (SiGe) 930 and 931 on a semiconductor substrate 900 bridging openings of the second horizontal openings 979 to form the vertical stack where the epitaxial silicon material 932 and 933 has been removed to form storage nodes. As shown in FIG. 9B, a vertical direction 911 is illustrated as a third direction (D3), e.g., z-direction in an x-y-z coordinate system, analogous to the third direction (D3) 911, among first, second, and second directions, shown in FIGS. 1-2. The plane of the drawing sheet, extending right and left, is in a first direction (D1) 909. In the example embodiment of FIG. 9B, the materials within the vertical stack, e.g., multiple, alternating layers of epitaxially grown silicon germanium (SiGe) 930 and 931 are extending into and out of the plane of the drawing sheet in second direction (D2) and along an axis of orientation of the horizontal access devices and horizontal storage nodes of the arrays of vertically stacked memory cells of the three dimensional (3D) memory.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second horizontal direction (D2) 905, left and right along the plane of the drawing sheet, along an axis of the repeating iterations of alternating layers of epitaxially grown silicon germanium (SiGe) 930, along and in which the horizontally oriented access devices and horizontally oriented storage nodes, e.g., capacitor cells, can be formed within the layers of epitaxially grown, single crystalline silicon (Si) material 932. As shown in FIG. 9C, a third vertical opening 951 has been formed through the repeating iterations of multiple, alternating layers of the epitaxially grown silicon germanium (SiGe) 930 and 931 and the epitaxially grown, single crystalline silicon (Si) material 932 and 933. The epitaxially grown, single crystalline silicon (Si) material 932 in the second region, e.g., storage node region, is selectively etched to form the second horizontal openings 979 in which to form storage nodes, e.g., horizontally oriented capacitor cells (shown next in FIG. 11). In one example, an atomic layer etching (ALE) process is used to selectively etch the epitaxially grown, single crystalline silicon (Si) material 932. In one embodiment selectively etching the epitaxially grown, single crystalline silicon (Si) material 932 in the second region, e.g., storage node region, to form the second horizontal openings 979 may be performed according to a timed exhume process. In one or more embodiments the second dielectric material 937 serves as an etch stop for the timed exhume, selective etch process.

As is shown in FIG. 9C, a source/drain region 945 may be formed by gas phase doping a dopant into a side surface portion of the epitaxially grown, single crystalline silicon (Si) material 932. In some embodiments, the source/drain region 945 may be a second source/drain region 945 adjacent storage node regions and on one side of channel regions on an opposite side of channel regions from a first source/drain region (1243 in FIG. 12C) connecting to a digit line connection (described in FIGS. 12-14) to the horizontal access devices. In one example, gas phase doping may be used to achieve a highly isotropic e.g., non-directional doping, to form the second source/drain regions 945 for the horizontally oriented access devices. In another example, thermal annealing with doping gas, such as phosphorous (P) may be used with a high energy plasma assist to break the bonding. Embodiments, however, are not so limited and other suitable semiconductor fabrication techniques may be utilized.

FIG. 10 illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 1010 is illustrated extending in the second horizontal direction (D2) 1005, left and right along the plane of the drawing sheet, along an axis of the repeating iterations of alternating layers of support structure oxide material 1039 and epitaxially grown, single crystalline silicon (Si) material 1032 along and in which the horizontally oriented access devices are formed. And, as shown in FIG. 10, horizontally oriented storage nodes, e.g., capacitor cells, have been formed where the layers of epitaxially grown, single crystalline silicon (Si) material 1032 have been selectively etched and removed.

In the example embodiment of FIG. 10, the horizontally oriented storage nodes, e.g., capacitor cells, are illustrated as having been formed in this semiconductor fabrication process and first electrodes 1061, e.g., bottom electrodes to be coupled to second source/drain regions 1045 of horizontal access devices, and second electrodes 1056, e.g., top electrodes to be coupled to a common electrode plane such as a ground plane, separated by cell dielectrics 1063, are shown. However, embodiments are not limited to this example. In other embodiments, the first electrodes 1061, e.g., bottom electrodes, coupled to second source/drain regions 1045 of horizontal access devices, and second electrodes 1056, e.g., top electrodes, coupled to a common electrode plane such as a ground plane, separated by cell dielectrics 1063, may be formed subsequent to forming a first source/drain regions (1143 in FIG. 11C), a channel region, and a second source/drain region 1045 in a region of the epitaxially grown, single crystalline silicon (Si) material 1032, intended for location, e.g., placement formation, of the horizontally oriented access devices, described next.

In the example embodiment of FIG. 10, the horizontally oriented storage nodes having the first electrodes 1061, e.g., bottom electrodes to be coupled to source/drain regions of horizontal access devices, and second electrodes 1056, e.g., top electrodes to be coupled to a common electrode plane such as a ground plane, are shown formed in a second horizontal opening, extending in second direction (D2) 1005, left and right in the plane of the drawing sheet, a second distance from the third vertical opening, e.g., 1051 in FIG. 10B, formed in the vertical stack, and along an axis of orientation of the horizontal access devices and horizontal storage nodes of the arrays of vertically stacked memory cells of the three dimensional (3D) memory.

Figure 11A:
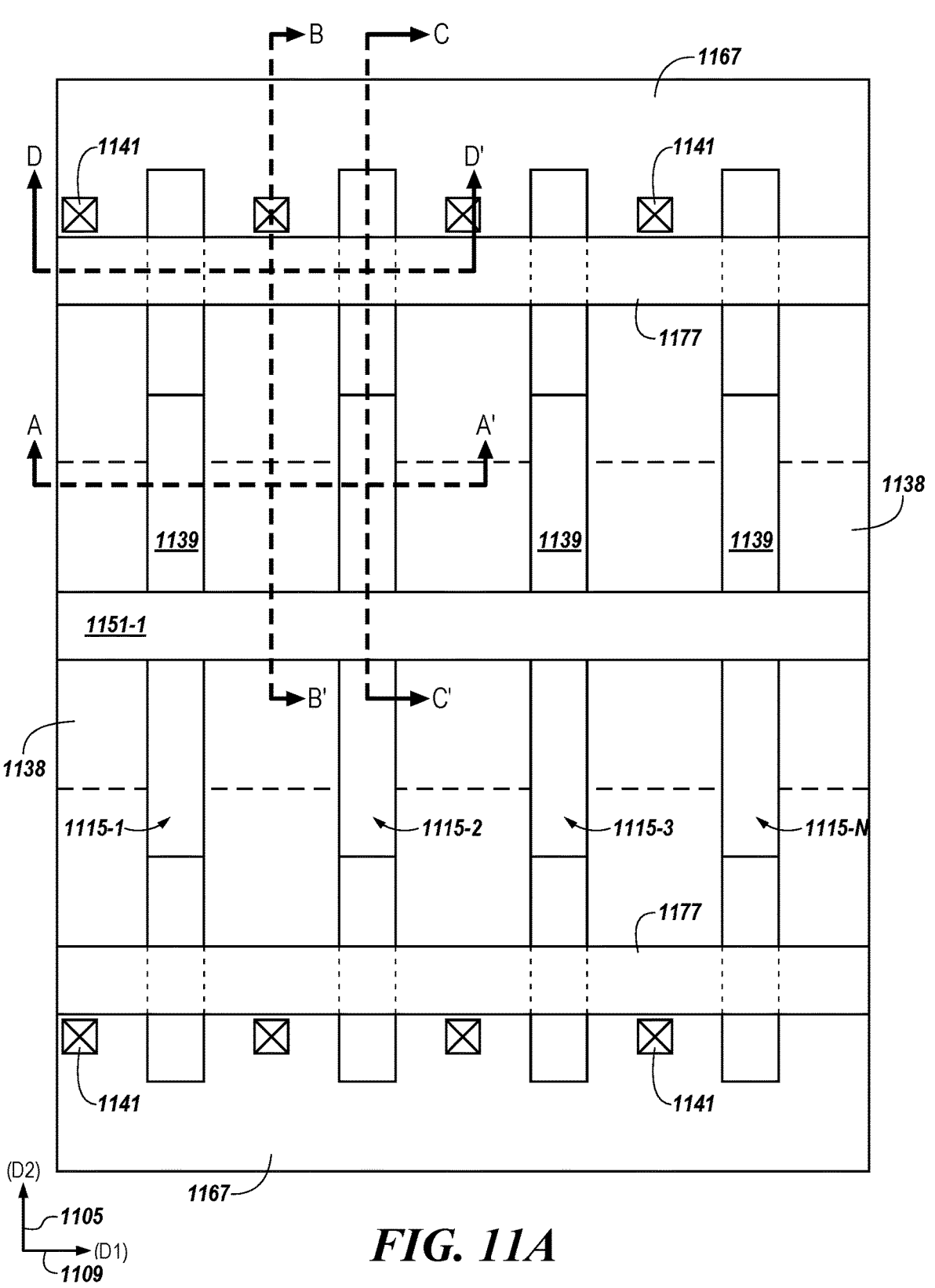

FIG. 11A illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 11A illustrates a top down view of a semiconductor structure, at a particular point in time, in a semiconductor fabrication process, according to one or more embodiments.

The method in FIG. 11A further illustrates using one or more etchant processes to form a plurality of patterned fourth vertical openings 1155 in a vertical digit line region through the vertical stack, using a masked photolithographic process, and extending predominantly in the first horizontal direction (D1) 1109. The one or more etchant processes form the plurality of patterned fourth vertical openings 1151, discussed below in connection with FIG. 11C, to expose second sidewalls in the repeating iterations of multiple, alternating layers of remaining, thinned epitaxially grown, single crystalline silicon (Si) material 1132 and the third dielectric material 1139 in FIG. 11C.

Figure 11B:
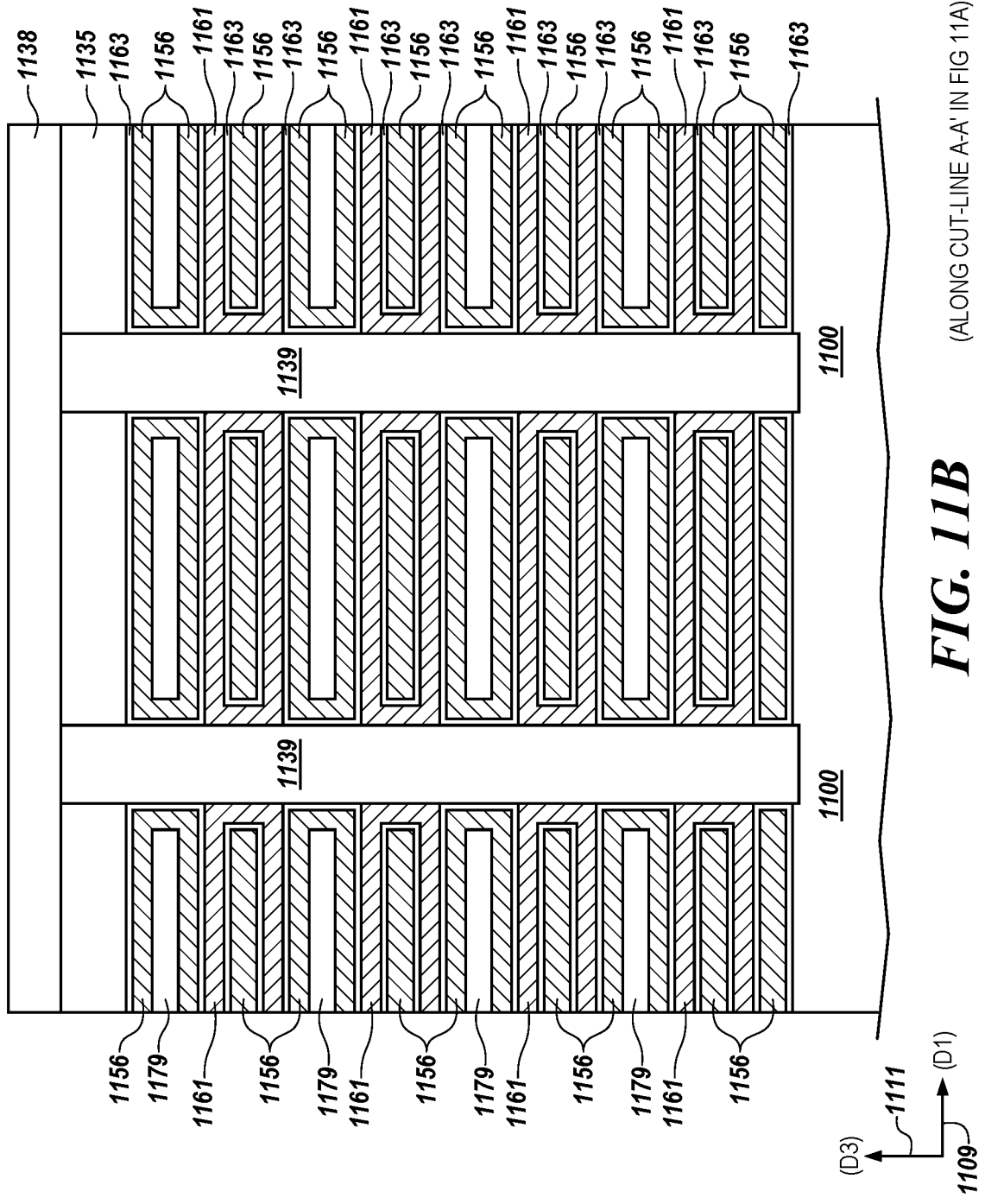

FIG. 11B illustrates a cross sectional view, taken along cut-line A-A' in FIG. 11A, showing another view of the semiconductor structure at this particular point in one example semiconductor fabrication process of an embodiment of the present disclosure. The cross sectional view shown in FIG. 11B is away from the plurality of separate, horizontal access lines 1177, and shows repeating iterations of first electrodes 1161, e.g., bottom cell contact electrodes, cell dielectrics 1163, and top, common node electrodes 1156, on a semiconductor substrate 1100 to form the vertical stack. As shown in FIG. 11B, a vertical direction 1111 is illustrated as a second direction (D3), e.g., z-direction in an x-y-z coordinate system, analogous to the second direction (D3) 1111, among first, second, and second directions, shown in FIGS. 1-2. The plane of the drawing sheet, extending right and left, is in a first direction (D1) 1109. In the example embodiment of FIG. 11B, the first electrodes 1161, e.g., bottom electrodes, coupled to source/drain regions (1145 in FIG. 11C) of horizontal access devices, and second electrodes 1156 are illustrated separated by a cell dielectric material 1163 extending into and out of the plane of the drawing sheet in second direction (D2) and along an axis of orientation of the horizontal access devices and horizontal storage nodes of the arrays of vertically stacked memory cells of the three dimensional (3D) memory.

Figure 11C:
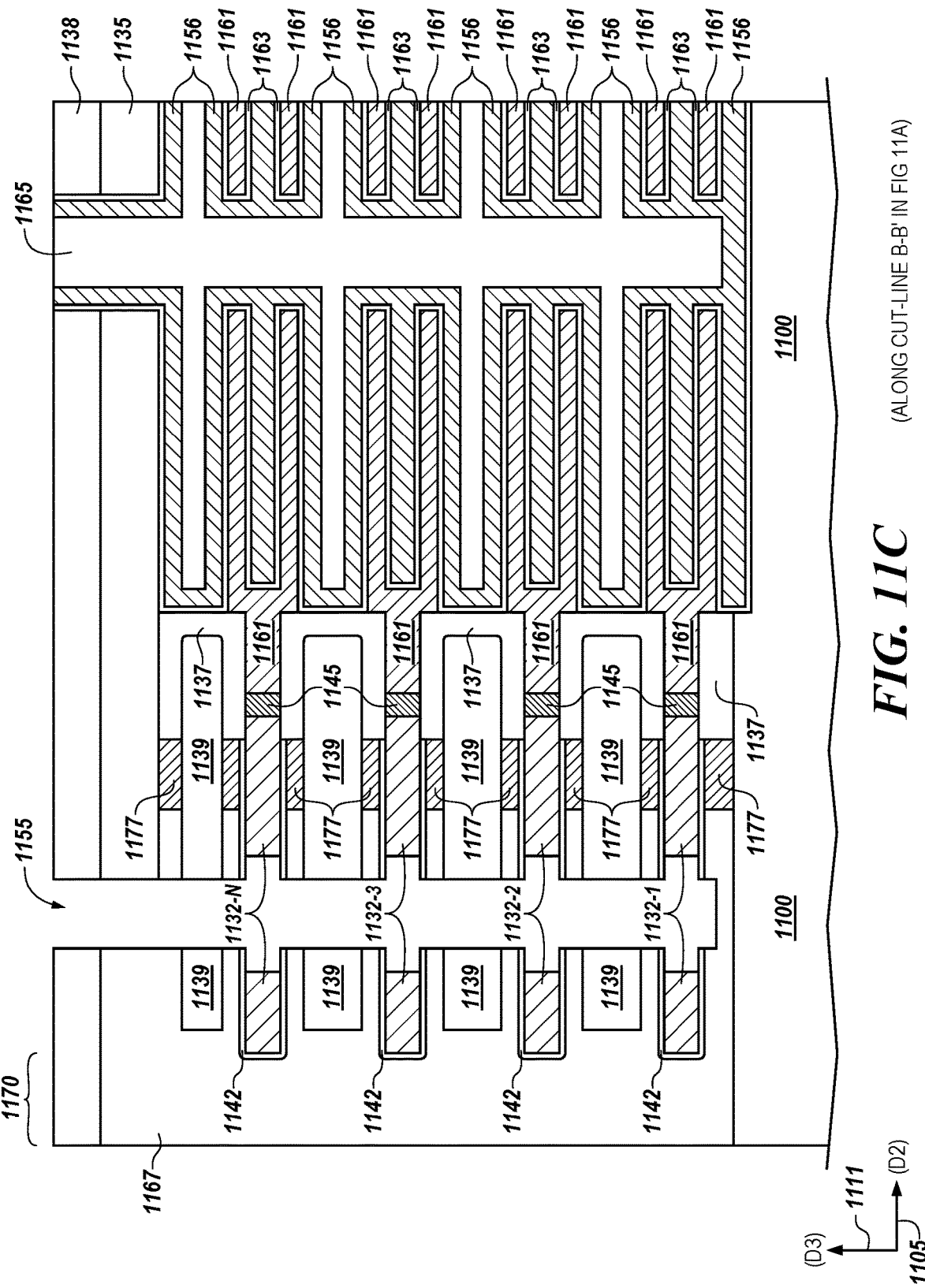

FIG. 11C illustrates a cross sectional view, taken along cut-line B-B' in FIG. 11A, showing another view of the semiconductor structure at this particular point in one example semiconductor fabrication process of an embodiment of the present disclosure. The cross sectional view shown in FIG. 11C is illustrated extending in the second horizontal direction (D2) 1105, left and right along the plane of the drawing sheet, along an axis of the repeating iterations of alternating layers of second electrodes 1156 along and in which the horizontally oriented access devices and horizontally oriented storage nodes, e.g., capacitor cells, can be formed within the layers of epitaxially grown, single crystalline silicon (Si) material 1132.

In the example embodiment of FIG. 11C, the horizontally oriented storage nodes, e.g., capacitor cells, are illustrated as having been formed been in this semiconductor fabrication process and first electrodes 1161, e.g., bottom electrodes, coupled to source/drain regions of horizontal access devices, and second electrodes 1156, e.g., top electrodes, coupled to a common electrode plane such as a ground plane 1165, separated by cell dielectrics 1163, are shown. In this embodiment, a dual-sided capacitor is illustrated as an alternative to the single-sided capacitor. However, embodiments are not limited to this example. In other embodiments, the first electrodes 1161, e.g., bottom electrodes, coupled to source/drain regions of horizontal access devices, and second electrodes 1156, e.g., top electrodes, coupled to a common electrode plane such as a ground plane 1165, separated by cell dielectrics 1163. The storage nodes may be formed subsequent to forming a first source/drain region, a channel region, and a second source/drain region in a region of the epitaxially grown, single crystalline silicon (Si) material 1132, intended for location, e.g., placement formation, of the horizontally oriented access devices.

In the example embodiment of FIG. 11C, the horizontally oriented storage nodes having the first electrodes 1161, e.g., bottom electrodes, coupled to source/drain regions of horizontal access devices, and second electrodes 1156, e.g., top electrodes, coupled to a common electrode plane such as a ground plane 1165, are shown formed in a second horizontal opening, extending in second direction (D2) 1105, left and right in the plane of the drawing sheet, along an axis of orientation of the horizontal access devices and horizontal storage nodes of the arrays of vertically stacked memory cells of the three dimensional (3D) memory. In FIG. 11C, a neighboring, horizontal access lines 1177 is illustrated adjacent the second dielectric material 1137, extending in to and out from the plane of the drawing sheet, with a portion of the first conductive material 1177-1 located above the epitaxially grown, single crystalline silicon (Si) material 1132, and a portion of the first conductive material 1177-2 located below the epitaxially grown, single crystalline silicon (Si) material 1132.

Figure 11D:
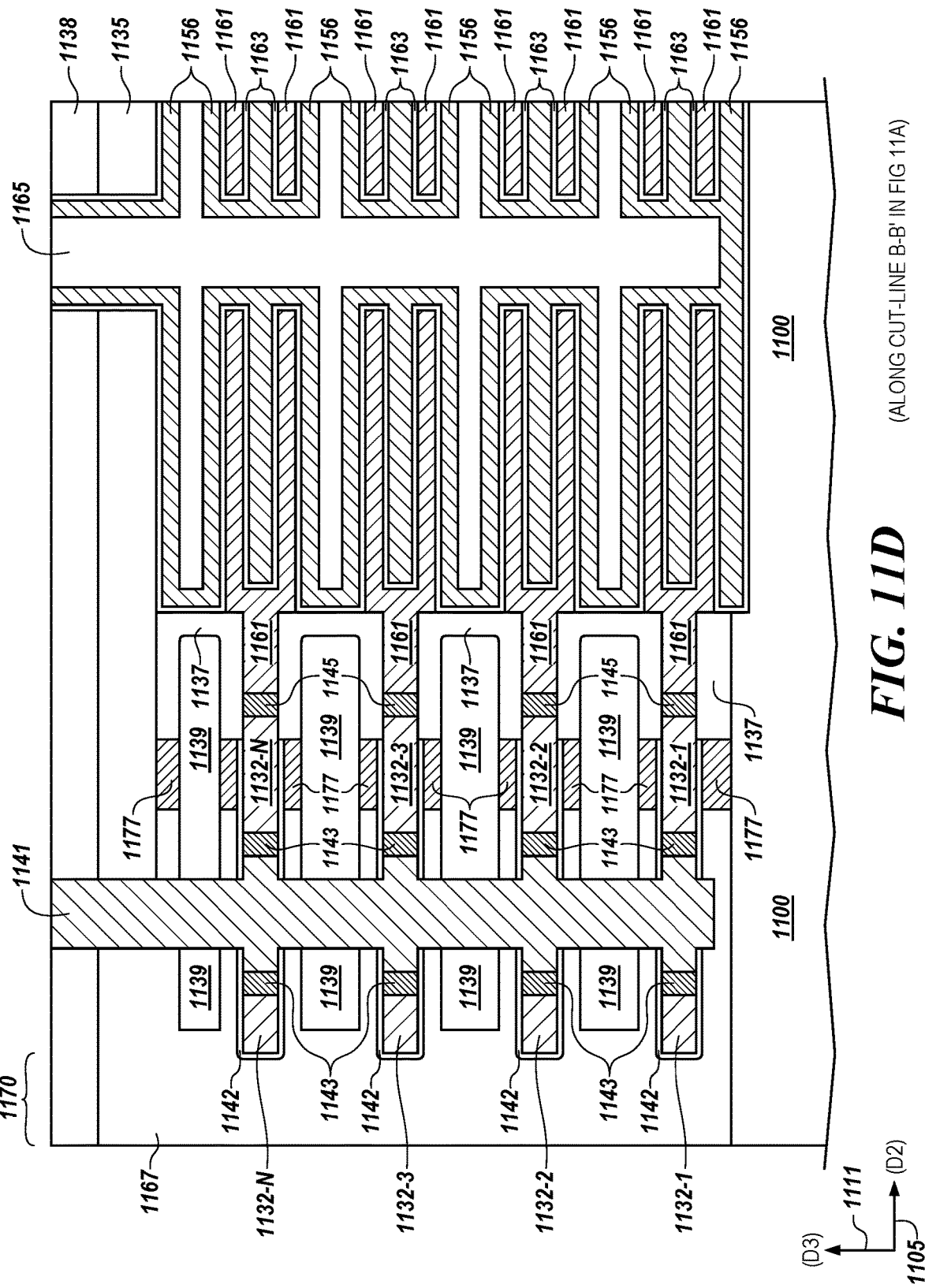

FIG. 11D also illustrates a cross sectional view, taken along cut-line B-B' in FIG. 11A, showing another view of the semiconductor structure at another particular point in one example semiconductor fabrication process of an embodiment of the present disclosure. As shown in FIG. 11D, an etchant process has been used to form the plurality of patterned fourth vertical openings 1151, discussed above in connection with FIG. 11C, vertically through, and to expose second sidewalls in the repeating iterations of multiple, alternating layers of remaining, thinned epitaxially grown, single crystalline silicon (Si) material 1132, ILD material 1167, and the third dielectric material 1139.

As shown in FIG. 11D, a second conductive material 1141 may be deposited to form vertical digit lines. The second conductive material 1141 may be formed as a vertical digit line adjacent multiple, alternating layers of remaining, thinned epitaxially grown, single crystalline silicon (Si) material 1132. In particular, the second conductive material 1141 may form vertically oriented digit lines adjacent a location to form first source/drain regions. In the embodiment shown in FIG. 11D, the second conductive material 1141 may comprise a highly doped n-type poly silicon (Si) material. The first source/drain regions 1143 may be formed by diffusing n-type dopants from the n-type poly silicon (Si) material of the second conductive material 1141 into the multiple, alternating layers of remaining, thinned epitaxially grown, single crystalline silicon (Si) material 1132 through an annealing process.

In one embodiment, the second conductive material 1141 may be formed by gas phase doping a high energy gas phase dopant, such as phosphorus (P) atoms, as impurity dopants, at a high plasma energy such as PECVD to form a high concentration, n-type doped (n+) region within the fourth vertical opening 1155. For example, a highly phosphorus (P) doped (n+) poly-silicon germanium (SiGe) material may be deposited into the fourth vertical openings 1181 to form the second conductive material 1141.

Thus, the first source/drain regions 1143 may be formed by out-diffusing n-type (n+) dopants into the multiple, alternating layers of remaining, thinned epitaxially grown, single crystalline silicon (Si) material 1132 to form the first source/drain regions 1143.

FIG. 12 illustrates a cross sectional view, taken along cut-line B-B' in FIG. 11A, showing another view of the semiconductor structure at this particular point in one example semiconductor fabrication process of an alternate embodiment of the present disclosure from that of FIG. 11D. The cross sectional view shown in FIG. 12 is illustrated extending multiple, alternating layers of remaining, thinned epitaxially grown, single crystalline silicon (Si) material 1232 in second direction (D2), left and right in the plane of the drawing sheet, formed in the vertical stack, e.g., 401 in FIG. 4, and along an axis of orientation of the horizontal access devices and horizontal storage nodes of the arrays of vertically stacked memory cells of the three dimensional (3D) memory.

In the embodiment of FIG. 12, the second conductive material 1241 may be formed within second vertical openings (1155 in FIG. 11C). The second conductive material 1241 may be formed from a high concentration, n-type dopant. The high concentration, n-type dopant may be formed by depositing a polysilicon material onto the multiple, alternating layers of remaining, thinned epitaxially grown, single crystalline silicon (Si) material 1232 and annealed to out-diffuse the n-type dopants to form the first source/drain regions 1243.

As shown in the embodiment of FIG. 12, a metal material 1271 may be deposited into the second vertical opening (1155 in FIG. 11C), within second conductive material 1241. In some embodiments, the metal material 1271 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The metal material 1271 coupled to the second conductive material 1241 may be formed vertically adjacent first conductive material 1277.

FIG. 13 illustrates a cross sectional view, taken along cut-line B-B' in FIG. 11A, showing another view of the semiconductor structure at this particular point in one example semiconductor fabrication process of another alternate embodiment of the present disclosure. The cross sectional view shown in FIG. 13 is illustrated extending in the second horizontal direction (D2) 1305, left and right along the plane of the drawing sheet In the example embodiment of FIG. 13, the second conductive material 1341 may be formed within second vertical openings 1381. The second conductive material 1341 may once again be formed from a high concentration, n-type dopant. However, in this example embodiment, the high concentration, n-type dopant may be formed by depositing a highly phosphorus (P) doped (n+) poly-silicon germanium (SiGe) material onto the multiple, alternating layers of remaining, thinned epitaxially grown, single crystalline silicon (Si) material 1332.

As in the embodiment of FIG. 12, a metal material 1371 may be deposited into the second vertical opening (1155 in FIG. 11C), within second conductive material 1341. In some embodiments, the metal material 1371 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The metal material 1371 coupled to the second conductive material 1341 may be formed vertically adjacent first conductive material 1377.

FIG. 14A illustrates an example method, at another stage of a semiconductor fabrication process, forming epitaxial silicon within horizontal access devices in vertical three dimensional (3D) memory, in accordance with a number of embodiments of the present disclosure. FIG. 14A illustrates a top down view of a semiconductor structure, at a particular point in time, in a semiconductor fabrication process, according to one or more embodiments. In the example embodiment of FIG. 14A, the method comprises using a photolithographic process to pattern the photolithographic mask 1437 where a second conductive material 1441 is asymmetric to reserve room for a body contact 1495. A second conductive material 1441 may be formed vertically through a plurality of patterned second vertical openings through the vertical stack. The vertically oriented digit lines are formed asymmetrically adjacent in electrical contact with the first source/drain regions 1443. Horizontal access lines and GAA structures are also shown opposing channel regions, separating first source/drain regions from second source/drain regions 1145.

FIG. 14B illustrates an example method, at another stage of a semiconductor fabrication process, forming epitaxial silicon within horizontal access devices in vertical three dimensional (3D) memory, in accordance with a number of embodiments of the present disclosure. FIG. 14B illustrates a top down view of a semiconductor structure, at a particular point in time, in a semiconductor fabrication process, according to one or more embodiments. In the example embodiment of FIG. 14B, the method comprises using a photolithographic process to pattern the photolithographic mask 1437 where a second conductive material 1441 is deposited symmetrically.

The second conductive material 1441 may be formed symmetrically as a vertical digit line contact. The vertically oriented digit lines are formed symmetrically, in vertical alignment, in electrical contact with the first source/drain regions 1443. The second conductive material 1441 may be formed in contact with an insulator material 1492 such that there is no body contact within a second vertical opening (1155 in FIG. 11C). Second conductive material 1441 may form vertical digit lines adjacent a first source/drain region 1443. Horizontal access lines and GAA structures are also shown opposing channel regions, separating first source/drain regions from second source/drain regions 1245.

FIG. 15A illustrates a top down layout view for a folded digit line architecture having horizontally oriented access devices coupled to horizontally oriented access lines, and having vertical digit lines for semiconductor devices, in accordance with a number of embodiments of the present disclosure. FIG. 15A illustrates a top down view of a semiconductor structure with dual vertical digit lines. As illustrated in FIG. 15A, embodiments of the present disclosure may be employed in a structure wherein the array of vertically stacked memory cells is electrically coupled in a folded digit line architecture. In a folded digit line structure, the dual structures may share a single word line 1503. A folded digit line structure may be possible when the digit lines 1507 has an odd amount of word lines 1503. A folded digit line structure may be possible when only one word line is turned on in the sub array block.

FIG. 15B illustrates an alternate top view, showing an open digit line architecture having horizontally oriented access devices coupled to horizontally oriented access lines, and having vertical digit lines for semiconductor devices, in accordance with a number of embodiments of the present disclosure. FIG. 15B illustrates a top down view of a semiconductor structure with dual vertical digit lines 1507-1A and 1507-1B. As illustrated in FIG. 15B, embodiments of the present disclosure may be employed in a structure wherein the array of vertically stacked memory cells is electrically coupled in an open digit line architecture. In an open digit line structure, each digit line structure may have its own word line 1503-1A and 1503-1B, such that a dual vertical digit line structure may have two wordlines. An open digit line structure may be possible when the digit lines 1507 has an even amount of word lines 1503. If two neighboring wordlines are turned on, only an open digit line structure may be possible; a folded digit line structure would not be possible.

FIG. 16 is a block diagram of an apparatus in the form of a computing system 1600 including a memory device 1603 in accordance with a number of embodiments of the present disclosure. As used herein, a memory device 1603, a memory array 1610, and/or a host 1602, for example, might also be separately considered an "apparatus." According to embodiments, the memory device 1602 may comprise at least one memory array 1610 with a memory cell formed having a digit line and body contact, according to the embodiments described herein.

In this example, system 1600 includes a host 1602 coupled to memory device 1603 via an interface 1604. The computing system 1600 can be a personal laptop computer, a desktop computer, a digital camera, a mobile telephone, a memory card reader, or an Internet-of-Things (IoT) enabled device, among various other types of systems. Host 1602 can include a number of processing resources (e.g., one or more processors, microprocessors, or some other type of controlling circuitry) capable of accessing memory 1603. The system 1600 can include separate integrated circuits, or both the host 1602 and the memory device 1603 can be on the same integrated circuit. For example, the host 1602 may be a system controller of a memory system comprising multiple memory devices 1603, with the system controller 1605 providing access to the respective memory devices 1603 by another processing resource such as a central processing unit (CPU).

In the example shown in FIG. 16, the host 1602 is responsible for executing an operating system (OS) and/or various applications (e.g., processes) that can be loaded thereto (e.g., from memory device 1603 via controller 1605). The OS and/or various applications can be loaded from the memory device 1603 by providing access commands from the host 1602 to the memory device 1603 to access the data comprising the OS and/or the various applications. The host 1602 can also access data utilized by the OS and/or various applications by providing access commands to the memory device 1603 to retrieve said data utilized in the execution of the OS and/or the various applications.

For clarity, the system 1600 has been simplified to focus on features with particular relevance to the present disclosure. The memory array 1610 can be a DRAM array comprising at least one memory cell having a digit line and body contact formed according to the techniques described herein. For example, the memory array 1610 can be an unshielded DL 4F2 array such as a 3D-DRAM memory array. The array 1610 can comprise memory cells arranged in rows coupled by word lines (which may be referred to herein as access lines or select lines) and columns coupled by digit lines (which may be referred to herein as sense lines or data lines). Although a single array 1610 is shown in FIG. 16, embodiments are not so limited. For instance, memory device 1603 may include a number of arrays 1610 (e.g., a number of banks of DRAM cells).

The memory device 1603 includes address circuitry 1606 to latch address signals provided over an interface 1604. The interface can include, for example, a physical interface employing a suitable protocol (e.g., a data bus, an address bus, and a command bus, or a combined data/address/command bus). Such protocol may be custom or proprietary, or the interface 1604 may employ a standardized protocol, such as Peripheral Component Interconnect Express (PCIe), Gen-Z, CCIX, or the like. Address signals are received and decoded by a row decoder 1608 and a column decoder 1612 to access the memory array 1610. Data can be read from memory array 1610 by sensing voltage and/or current changes on the sense lines using sensing circuitry 1611. The sensing circuitry 1611 can comprise, for example, sense amplifiers that can read and latch a page (e.g., row) of data from the memory array 1610. The I/O circuitry 1607 can be used for bi-directional data communication with the host 1602 over the interface 1604. The read/write circuitry 1613 is used to write data to the memory array 1610 or read data from the memory array 1610. As an example, the circuitry 1613 can comprise various drivers, latch circuitry, etc.

Control circuitry 1605 decodes signals provided by the host 1602. The signals can be commands provided by the host 1602. These signals can include chip enable signals, write enable signals, and address latch signals that are used to control operations performed on the memory array 1610, including data read operations, data write operations, and data erase operations. In various embodiments, the control circuitry 1605 is responsible for executing instructions from the host 1602. The control circuitry 1605 can comprise a state machine, a sequencer, and/or some other type of control circuitry, which may be implemented in the form of hardware, firmware, or software, or any combination of the three. In some examples, the host 1602 can be a controller external to the memory device 1603. For example, the host 1602 can be a memory controller which is coupled to a processing resource of a computing device.

FIG. 17 illustrates another example method, in an alternate embodiment to that shown in FIG. 6C, of a semiconductor fabrication process, for forming epitaxial silicon within horizontal access devices in vertical three dimensional (3D) memory, in accordance with a number of embodiments of the present disclosure.

As shown in the embodiment of FIG. 17, in the alternative to conformally depositing a second dielectric layer 637 as described in FIG. 6, the semiconductor fabrication process may proceed to a sequence described in connection with FIG. 7. As described in FIG. 7, and shown in FIG. 17, the method may proceed with a gate dielectric material being formed on exposed surfaces of the remaining, thinned, epitaxially grown, single crystalline silicon (Si) material 1732 to form horizontal access devices. The gate dielectric material 1742 may be conformally deposited fully around every surface of the remaining, thinned, epitaxially grown, single crystalline silicon (Si) material 1732 to form gate all around (GAA) gate structures, at the channel regions of the access devices. The gate dielectric material 1742 may be deposited on the exposed surfaces of the remaining, thinned, epitaxially grown, single crystalline silicon (Si) material 1732 using atomic layer deposition (ALD). In some examples, an oxide material 1742 may be deposited over the exposed surfaces of the epitaxially grown, single crystalline silicon (Si) material 1732. In some embodiments, the gate dielectric material 1742 may be a thermally grown oxide material 1742 on exposed surfaces of the remaining, thinned, exposed epitaxially grown, single crystalline silicon (Si) material 1732. And, a thermal oxidation process may be used to densify the ALD the oxide material 1742. The thermal oxidation process may involve forming oxide material 1742 from a hybrid oxide material. The hybrid oxide material may combine a low temperature oxide material and a high temperature oxide material.

As shown in FIG. 17, a first conductive material 1777 may be deposited on a gate dielectric material 1742 to form gates. The first conductive material 1777 may be deposited around the remaining, thinned, exposed epitaxially grown, single crystalline silicon (Si) material 1732 such that the first conductive material 1777 may have a top portion above the epitaxially grown, single crystalline silicon (Si) material 1732 and a bottom portion below the epitaxially grown, single crystalline silicon (Si) material to form gate all around (GAA) gate structures, at the channel regions of the access devices. The gates opposing the channel regions provide a subthreshold voltage (sub-Vt) slope in a range of approximately 45 to 100 millivolts per decade (mV/dec). The first conductive material 1777 may be conformally deposited into second vertical openings 1770 and a third dielectric, e.g., 739 in FIG. 7, used to fill the continuous horizontal openings 1779. The first conductive material 1777 may be conformally deposited using a chemical vapor deposition (CVD) process, plasma enhanced CVD (PECVD), atomic layer deposition (ALD), or other suitable deposition process.

In some embodiments, the first conductive material, 1777, may comprise one or more of a doped semiconductor material, e.g., doped silicon, doped germanium, etc. In some embodiments, the first conductive material 1777 may comprise a conductive metal nitride material, e.g., titanium nitride, tantalum nitride, etc. In some embodiments, the first conductive material may comprise a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The first conductive material 1777 together with the gate dielectric material 1742 may form horizontally oriented access lines (which also may be referred to a wordlines) opposing channel regions of the epitaxially grown, single crystalline silicon (Si) material.

From the alternate method embodiment of the semiconductor fabrication sequence shown in FIG. 17, the process may continue from the description given in FIG. 8 where the first conductive material is recessed appropriately and the second vertical opening filled with another dielectric material, e.g., 867 in FIG. 8A. In this embodiment, when the plurality of second horizontal openings, 979, are formed in FIG. 9C the gate dielectric 1742 and first conductive material 1777 can define a selective etch stop point. In this embodiment, another selective etch process will be used to remove the gate dielectric 1742 and the first conductive material 1777, segmenting the first conductive material 1777 between tiers. This selective etch may also define a storage node cell plate spacing to an edge of gates for the access devices. A resulting opening may then be filled with a suitable dielectric material, e.g., second dielectric material 1037 shown in FIG. 10. From that point forward the storage node formation process may continue, in example, as has been described herein further in connection with FIG. 10. Embodiments, however, are not limited to the example of storage node formation described in connection with FIG. 10.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and storage nodes, comprising:

epitaxially forming multiple, alternating layers of silicon germanium (SiGe) material and single crystalline silicon (Si) material from a substrate to form a vertical stack;

forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;

filling the plurality of first vertical openings with a first dielectric material;

forming a second vertical opening through the vertical stack and extending predominantly in the first horizontal direction to expose second vertical sidewalls adjacent a first region of the epitaxially grown SiGe material and Si material;

selectively etching the epitaxially grown SiGe material and one or more of the epitaxially grown Si layers in the second horizontal direction to form a plurality of first horizontal openings extending a first distance (D1) from the second vertical opening;

selectively etching the first dielectric in the first horizontal direction to form continuous horizontal openings for access lines;

conformally depositing a second dielectric material on exposed surfaces in the first horizontal openings to provide a support structure to remaining epitaxially grown Si layers;

depositing a third dielectric material to fill the continuous horizontal openings;

selectively etching the second dielectric material a second distance (D2) from the second vertical opening; and depositing a first conductive material on a gate dielectric material on exposed surfaces of the epitaxially formed Si material to form horizontally oriented access lines opposing channel regions of the Si material, wherein the gate dielectric material is formed by:

using atomic layer deposition to first deposit a layer of an oxide material on exposed surfaces of the epitaxially formed Si material; and using thermal oxidation to densify the ALD deposited oxide material.

2. The method of claim 1, wherein selectively etching the epitaxially grown silicon germanium (SiGe) to form the plurality of first horizontal openings extending a first distance (D1) from the second vertical opening comprises using a timed exhume process.

3. The method of claim 1, wherein selectively etching the epitaxially grown SiGe material and one or more of the epitaxially grown Si layers in the second horizontal direction to form a plurality of first horizontal openings extending a first distance (D1) from the second vertical opening comprises thinning remaining epitaxially grown Si layers to provide a vertical height (h1) separating the thinned remaining epitaxially grown Si layers in a range of approximately 500 to 900 angstroms (Å).

4. The method of claim 1, wherein selectively etching the epitaxially grown SiGe material and one or more of the epitaxially grown Si layers in the second horizontal direction to form a plurality of first horizontal openings extending a first distance (D1) from the second vertical opening comprises thinning remaining epitaxially grown Si layers to provide a remaining, thinned thickness (t1) from an original thickness (t2) in a range of approximately 50 to 250 angstroms (Å).

5. The method of claim 1, further comprising conformally depositing the second dielectric material using a silicon nitride material to have a conformal thickness (t3) in a range of approximately 20 to 80 angstroms (Å).

6. The method of claim 1, further comprising epitaxially growing the Si material to have an original thickness (t2) in a range of approximately 50 to 600 angstroms (Å).

7. The method of claim 1, wherein depositing a first conductive material comprises depositing the first conductive material fully around every surface of the Si material, to form gate all around (GAA) gate structures, opposing channel regions to form horizontally oriented access devices.

8. The method of claim 1, wherein selectively etching the second dielectric material comprises removing the second dielectric material using a timed exhume process a second distance (DIST 2) in a range of approximately twenty-five (25) to seventy-five (75) nanometers (nm) from the second vertical opening.

9. The method of claim 1, further comprising selectively recessing a first conductive material and a gate dielectric material in the second direction, and in the continuous second horizontal openings, a second distance (DIST 3) in a range of twenty (20) to fifty (50) nanometers (nm) back from the second vertical opening.

10. The method of claim 1, further comprising selectively recessing the first conductive material and the gate dielectric material a second distance (DIST 3) around the Si material back into the first horizontal openings extending in the first horizontal direction using an atomic layer etching (ALE) process.

11. The method of claim 1, further comprising:

forming a third vertical opening adjacent a second region of the epitaxially grown silicon germanium (SiGe) material and single crystalline silicon (Si) material to expose third vertical sidewalls in the vertical stack;

selectively etching the epitaxially grown, single crystalline silicon (Si) material in the second horizontal direction, using remaining, un-etched second dielectric material as an etch stop, to form a plurality of second horizontal openings in the second region;

gas phase doping a dopant in a side surface of the epitaxially grown, single crystalline silicon (Si) material from the second horizontal openings to form second source/drain regions horizontally adjacent channel regions; and depositing horizontally oriented capacitor cells having a bottom electrode formed in electrical contact with the second source/drain regions.

12. The method of claim 1, the method further comprising forming a plurality of patterned fourth vertical openings through the vertical stack adjacent first source/drain regions in which to deposit a second conductive material to form vertically oriented digit lines.

13. The method of claim 12, further comprising:

depositing a doped, n-type poly silicon (Si) material in the plurality of patterned fourth vertical openings through the vertical stack adjacent first source/drain regions to form the vertically oriented digit lines; and annealing to diffuse n-type dopants from the n-type poly silicon (Si) material into the epitaxially grown Si material to form first source/drain regions in the horizontally oriented access devices adjacent channel regions.

14. A method for forming arrays of vertically stacked memory cells, having horizontally oriented access devices and storage nodes, comprising:

epitaxially forming multiple, alternating layers of silicon germanium (SiGe) and single crystalline silicon (Si) from a substrate to form a vertical stack;

forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;

filling the plurality of first vertical openings with a first dielectric material;

forming a second vertical opening through the vertical stack and extending predominantly in the first horizontal direction to expose second vertical sidewalls adjacent a first region of the epitaxially grown SiGe and Si;

selectively etching the epitaxially grown SiGe and one or more of the epitaxially grown Si in the second horizontal direction to form a plurality of first horizontal openings extending a first distance (D1) from the second vertical opening;

conformally depositing a second dielectric material on exposed surfaces of the epitaxially grown Si to provide a support structure;

depositing a third dielectric material to fill the first horizontal openings;

selectively etching the second dielectric material a second distance (D2) from the second vertical opening to form a first conductive material on a gate dielectric material opposing channel regions of the epitaxially formed Si;

forming a third vertical opening adjacent a second region of the epitaxially grown SiGe and single crystalline Si to expose third vertical sidewalls in the vertical stack;

selectively etching the epitaxially grown, single crystalline Si in the second horizontal direction to form a plurality of second horizontal openings in the second region in which to form storage nodes; and forming a plurality of patterned fourth vertical openings through the vertical stack adjacent first source/drain regions in which to deposit a second conductive material to form vertically oriented digit lines, wherein the second conductive material is a ruthenium (Ru) composition.

15. The method of claim 14, further comprising:

gas phase doping a dopant in a side surface of the epitaxially grown, single crystalline Si material from the second horizontal openings to form second source/drain regions; and depositing horizontally oriented capacitor cells having a bottom electrode formed in electrical contact with the second source/drain regions.

16. The method of claim 14, further comprising:

removing a portion of the first dielectric material filled in the plurality of first vertical openings, between the first horizontal openings, to form continuous horizontal openings extending in the first horizontal direction;

depositing the first conductive material in the continuous second horizontal openings to form horizontally oriented access lines opposing channel regions of the epitaxially grown Si.

17. The method of claim 14, further comprising:

depositing a poly silicon (poly-Si) material having a high concentration of an n-type (n+) dopant in the patterned fourth vertical openings as the second conductive material; and annealing to out-diffuse the n-type (n+) dopant into the epitaxially grown, single crystalline Si to form the first source/drain regions.

18. The method of claim 17, further comprising depositing a tungsten (W) material on the poly-Si material in the patterned fourth vertical openings.

19. The method of claim 17, further comprising depositing a titanium/titanium nitride (TiN) conductive material on the poly-Si material, via the patterned fourth vertical openings, to form a titanium silicide as part of the vertically oriented digit lines.

20. The method of claim 17, further comprising depositing a highly phosphorus (P) doped (n+) poly-silicon germanium (SiGe) material as the poly-Si material having a high concentration of an n-type (n+) dopant in the patterned fourth vertical openings.

21. A method for forming arrays of vertically stacked memory cells, having horizontally oriented access devices and storage nodes, comprising:

epitaxially forming multiple, alternating layers of silicon germanium (SiGe) material and single crystalline silicon (Si) material from a substrate to form a vertical stack;

forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;

filling the plurality of first vertical openings with a first dielectric material;

forming a second vertical opening through the vertical stack and extending predominantly in the first horizontal direction to expose second vertical sidewalls adjacent a first region of the epitaxially grown SiGe material and Si material;

selectively etching, using a timed exhume process, the epitaxially grown SiGe material and one or more of the epitaxially grown Si layers in the second horizontal direction to form a plurality of first horizontal openings extending a first distance (D1) from the second vertical opening;

selectively etching the first dielectric in the first horizontal direction to form continuous horizontal openings for access lines;

conformally depositing a second dielectric material on exposed surfaces in the first horizontal openings to provide a support structure to remaining epitaxially grown Si layers;

depositing a third dielectric material to fill the continuous horizontal openings;

selectively etching the second dielectric material a second distance (D2) from the second vertical opening; and depositing a first conductive material on a gate dielectric material on exposed surfaces of the epitaxially formed Si material to form horizontally oriented access lines opposing channel regions of the Si material.

\* \* \* \* \*